(12) United States Patent
Mori

(10) Patent No.: US 7,379,370 B2
(45) Date of Patent: May 27, 2008

(54) SEMICONDUCTOR MEMORY

(75) Inventor: Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/641,767

(22) Filed: Dec. 20, 2006

(65) Prior Publication Data
US 2007/0121410 A1    May 31, 2007

Related U.S. Application Data

(63) Continuation of application No. PCT/JP2004/011267, filed on Aug. 5, 2004.

(51) Int. Cl.
*G11C 7/00* (2006.01)
(52) U.S. Cl. ............... 365/222; 365/203; 365/228; 365/229; 365/230.06; 711/106
(58) Field of Classification Search ............... 365/222, 365/203, 228, 229, 230.06; 711/106
See application file for complete search history.

(56) References Cited

U.S. PATENT DOCUMENTS

| | | | |
|---|---|---|---|
| 5,337,271 A | * | 8/1994 | Kawahara et al. ............ 365/149 |
| 6,285,578 B1 | * | 9/2001 | Huang .......................... 365/154 |
| 6,515,929 B1 | * | 2/2003 | Ting et al. ..................... 365/222 |
| 7,000,846 B2 | * | 2/2006 | Hakushi et al. ............... 235/492 |
| 2002/0041536 A1 | | 4/2002 | Tomita |
| 2002/0051389 A1 | | 5/2002 | Mizugaki et al. |

FOREIGN PATENT DOCUMENTS

| | | |
|---|---|---|
| JP | 8-315569 A | 11/1996 |
| JP | 8-315598 A | 11/1996 |
| JP | 9-161477 A | 6/1997 |
| JP | 2002-133865 A | 5/2002 |
| JP | 2002-184182 A | 6/2002 |
| JP | 2003-68071 A | 3/2003 |

* cited by examiner

*Primary Examiner*—Tuan T. Nguyen
*Assistant Examiner*—Eric Wendler
(74) *Attorney, Agent, or Firm*—Arent Fox LLP

(57) ABSTRACT

After a refresh operation, a word control circuit holds the selection state of a word line selection signal line selected in each memory block corresponding to a refresh address. Further, in response to an access request, the word control circuit unselects only a word line selection signal line of a memory block selected by an external address corresponding to this access request. In each memory block, the word line selection signal line once selected is not unselected until the access request is received, so that the frequency of unselection and selection of the word line selection signal lines can be lowered. Consequently, a charge/discharge current of the word line selection signal lines can be reduced, which can reduce current consumption of a semiconductor memory.

20 Claims, 42 Drawing Sheets

SEMICONDUCTOR MEMORY

CROSS REFERENCE TO RELATED APPLICATION

This application is a continuation application of International Application PCT/JP 2004/11267, filed Aug. 5, 2004, and designating the U.S.

BACKGROUND OF THE INVENTION

1. Field of the Invention

The present invention relates to a semiconductor memory which automatically refreshes memory cells.

2. Description of the Related Art

There is a technique for reducing power consumption in a DRAM having a self-refresh mode, by assigning a memory block and a word line to low-order bits and high-order bits of a refresh address generated in the DRAM and lowering the reset frequency of address predecode signals during the self-refresh mode (for example, disclosed in Japanese Unexamined Patent Application Publication No. Hei 9-161477).

Also, in recent years, a semiconductor memory called a pseudo SRAM has been developed. The pseudo SRAM includes DRAM memory cells (dynamic memory cells) and operates as an SRAM by internally, automatically performing a refresh operation to the memory cells. The dynamic memory cell used in the pseudo SRAM is small in area. Therefore, the pseudo SRAM of a large capacity can be developed with a low cost per bit.

In the DRAM, the reception of an access request is disabled during the self-refresh mode. Accordingly, the only access to the memory cells during the self-refresh mode is the refresh operation. Since the refresh address is sequentially incremented or decremented, the address of the memory cell to be accessed (refreshed) next is known. In contrast, in the pseudo SRAM, the access request is received also during a standby period. Hence, the address of the memory cell to be accessed next cannot be known until an external address is received. Accordingly, the technique described in the above document is not applicable to the pseudo SRAM since it is for the semiconductor memories to operate on condition that no access request is generated.

SUMMARY OF THE INVENTION

An object of the present invention is to reduce power consumption of a semiconductor memory which performs refresh automatically, and particularly to reduce power consumption with minimum increase in the number of circuits.

In one aspect of a semiconductor memory of the present invention, each of memory blocks includes a plurality of memory cells and a plurality of word lines connected to the memory cells. In each memory block, a plurality of word line groups are each constituted of a predetermined number of word lines. A refresh request generation circuit generates a refresh request to refresh memory cells in a predetermined cycle. In response to the refresh request, a refresh address generation circuit sequentially generates refresh addresses indicating word lines connected to the memory cells to be refreshed. Namely, the semiconductor memory automatically performs a refresh operation.

First word decoders are formed corresponding to the word line groups, respectively. The first word decoder selects a word line selection signal line to select any of the word lines in the word line group according to the refresh address or an external address. Second word decoders are formed corresponding to the word lines, respectively. In response to the selection of the word line selection signal line, the second word decoder selects any of the word lines in the word line group according to the refresh address or the external address. After the refresh operation a word control circuit holds a selection state of the word line selection signal line selected in each of the memory blocks corresponding to the refresh address. In response to an access request, the word control circuit unselects only the word line selection signal line of the memory block indicated by the external address corresponding to this access request.

At least one bit of a lowest order of the refresh address generated by the refresh address generation circuit is assigned to select the memory block. Therefore, upon each refresh request, a different memory block is refreshed, and the refresh operation is performed for the word line selected according to the refresh address. In each memory block, the word line selection signal line once selected is not unselected until the next refresh address or the access request is received. Hence, the frequency of unselection and selection of the word line selection signal lines can be lowered. Consequently, a charge/discharge current of the word line selection signal lines can be reduced, which can reduce current consumption of the semiconductor memory. Moreover, the word line selection signal line is selected/unselected in each memory block, so that peak currents due to charge/discharge of the word line selection signal lines can be dispersed.

In a preferred example of the one aspect of the semiconductor memory of the present invention, the word control circuit includes a reset disable control circuit and a block reset control circuit. The reset disable control circuit activates a reset disable signal in response to the refresh request (reset disable state) and inactivates the reset disable signal in response to the access request (reset enable state). The block reset control circuit is formed for each memory block. In response to the inactivation of the reset disable signal, it outputs, to the first word decoder, a block reset signal to unselect the selected word line selection signal line in the memory block selected by the external address corresponding to the access request. Namely, the reset disable control circuit generates the reset disable signal common to the memory blocks, and the block reset circuit generates the block reset signal for each memory block selected according to the address. This makes it easier to inactivate, by a simple circuit, the word line selection signal line selected in the memory block accessed in response to the access request.

In a preferred example of the one aspect of the semiconductor memory of the present invention, in the memory block being in an access operation in response to the access request, first, the first word decoder continuously selecting the word line selection signal line for refresh unselects this word line selection signal line. Thereafter, a first word decoder selected according to the external address selects a word line selection signal line in response to the block reset signal. The word line selection signal lines for refresh and for access are not selected simultaneously, preventing multiple selection of word lines. This can consequently prevent malfunction of the semiconductor memory. Further, when a selected word line group for the refresh operation is unselected according to the access request, it is not necessary to designate the selected word line group, so that a circuit to unselect the word line selection signal line can be simplified in configuration.

In a preferred example of the one aspect of the semiconductor memory of the present invention, the semiconductor memory includes a burst access function of performing read operations or write operations successively in response to one access request. An activation mask circuit formed in the reset disable control circuit masks the activation of the reset disable signal during the burst access. It is known in advance that during the burst access, the access operation is performed successively to the refresh operation. Disabling the activation of the reset disable signal during the burst access can prevent the word control circuit from unnecessarily operating. Accordingly, it is possible to reduce power consumption of the word control circuit.

In a preferred example of the one aspect of the semiconductor memory of the present invention, according to the refresh addresses the refresh operation is performed on all of the memory blocks in sequence, changing the word line for refresh such that all of the word lines in one word line group are used in sequence first, and then all of the word lines in a next word line group are used in sequence. The reset disable control circuit inactivates the reset disable signal while the refresh operation is performed on all of the memory blocks in sequence once and while the refresh operation is performed with a last word line of each word line group.

When the refresh operation is repeatedly performed, a different word line selection signal line is selected in each memory block sequentially upon each refresh. Inactivating the reset disable signal while the last word line in each word line group is used for refresh makes it possible to unselect the word line selection signal line upon each refresh operation during the period. When the selected word line selection signal line is switched to the next word line selection signal line due to the repeated refresh operations, making the selected word line selection signal line unselected in advance can realize simple switching control as compared with a case where two word line selection signal lines are unselected and selected simultaneously.

In a preferred example of the one aspect of the semiconductor memory of the present invention, the reset disable control circuit includes an entry generation circuit and a flip-flop. While the access request is not received, the entry generation circuit generates an entry signal in synchronization with a timing signal indicating a start of the refresh operation. The flip-flop activates the reset disable signal in synchronization with the entry signal and inactivates the reset disable signal in synchronization with the access request. The access request and the refresh request are generated asynchronously. Therefore, when the entry signal is generated in synchronization with the refresh request, there is a possibility that the entry signal and the access request are inputted almost simultaneously to an input of the flip-flop. Generating the entry signal in synchronization with the start of the refresh operation can prevent malfunction of the flip-flop, which makes it possible to surely activate or inactivate the reset disable signal.

In a preferred example of the one aspect of the semiconductor memory of the present invention, when the semiconductor memory is powered on, the reset disable control signal inactivates the reset disable signal to unselect the word line selection signal line. This can prevent the multiple selection of the word lines immediately after the power-on as well as the malfunction of the semiconductor memory.

In a preferred example of the one aspect of the semiconductor memory of the present invention, the reset disable control circuit includes an entry generation circuit and a flip-flop. The entry generation circuit generates the entry signal which responds to the refresh request, using a plurality of timing signals. Since at least any of the timing signals is generated asynchronously with the other timing signals, timing deviation may cause a in the pulse width (valid period) of the entry signal to narrow. The flip-flop is constituted of transistors having predetermined threshold voltages. The flip-flop activates the reset disable signal in synchronization with the entry signal, and inactivates the reset disable signal in synchronization with the access request. In the flip-flop, the transistors activate the reset disable signal from the entry signal and are in a signal path fed back to the input, and a threshold voltage (absolute value) of at least any of the transistors is set lower than threshold voltages (absolute values) of the other transistors. Therefore, even with the narrow pulse width of the entry signal, the flip-flop can determine its own state at high speed. Accordingly, the flip-flop can be prevented from going into an unstable state, which can prevent the malfunction of the semiconductor memory.

In a preferred example of the one aspect of the semiconductor memory of the present invention, the semiconductor memory includes a plurality of memory banks selected according to bank addresses and operating independently of each other. Each memory bank includes a plurality of memory blocks, a plurality of word line groups, a plurality of first word decoders, and a plurality of second word decoders. The reset disable control circuit transmits, only to the memory bank selected according to the bank address, the inactivation of the reset disable signal responding to the access request. Therefore, the word line selection signal line can be unselected independently in each memory bank. In the memory bank uninvolved in the access request, unnecessary unselection of the word line selection signal line can be prevented, which can reduce power consumption.

In a preferred example of the one aspect of the semiconductor memory of the present invention, address latch control circuits are formed in the memory block and each generate an address latch signal in response to the selection of the memory block according to the refresh address or the external address. Address latch circuits are formed corresponding to address signal lines to select the first word decoders, each latch the refresh address or the external address in synchronization with a corresponding address latch signal, and output the latched address to one of the first word decoders. Whether the first word decoder selects or unselects the word line selection signal line is determined depending on the address latched by the address latch circuit. In other words, the selection/unselection of the word line selection signal line is held unless the latch state of the address latch circuit changes. The latch state changes according to the external address supplied corresponding to the access request, thereby making the word line selection signal line selected for refresh unselected, and the word line selection signal line for access selected simultaneously. As a result, a simple circuit can hold the selection of the word line selection signal line after the refresh operation, and switch the word line selection signal line to be selected in response to the access request in each memory block. Owing to the simplified circuit configuration, the operation verification time taken during circuit design can be reduced. The unselection/selection of two main word line selection signal lines can be switched simultaneously, which can reduce the time from the access request to the start of the access operation. Namely, the access time can be reduced.

In a preferred example of the one aspect of the present invention, a first test control circuit outputs a first test signal common to the address latch control circuits during a test mode. Each address latch control circuit generates the address latch signal in synchronization with the output of the first test signal. Hence, during the test mode, the respective address latch circuits of the memory blocks can be operated simultaneously, and for example, a multiple selection test of the word lines can be performed.

In a preferred example of the one aspect of the semiconductor memory of the present invention, a second test control circuit outputs a second test signal common to the first word decoders during the test mode. Each first word decoder selects the word line selection signal line in synchronization with the output of the second test signal. Therefore, during the test mode, all the word line selection signal lines can be selected simultaneously, and for example, the time for a burn-in test can be reduced.

In a preferred example of the one aspect of the semiconductor memory of the present invention, each address latch circuit includes a level shifter converting a high-level voltage of the latched address to a boost voltage. The first word decoder receives the boost voltage as a high-level power supply and sets a high-level voltage of the word line selection signal line to the boost voltage. The circuit configuration of the first word decoder can be simplified by setting all the voltages (high-level voltages) of the addresses supplied to the first word decoder to the same value.

In a preferred example of the one aspect of the semiconductor memory of the present invention, the semiconductor memory includes a plurality of memory banks selected according to a bank address and operating independently of each other. Each memory bank includes a plurality of memory blocks, a plurality of word line groups, a plurality of first word decorders, and a plurality of second word decoders. Only the address latch circuit of a memory bank selected according to the bank address latches the external address corresponding to the access request, which makes it possible to select/unselect the word line selection signal line independently in each memory bank. In the memory bank uninvolved in the access request, unnecessary unselection of the word line selection signal line can be prevented, which can reduce power consumption.

In a preferred example of the one aspect of the present invention, program circuits are formed corresponding to the memory blocks, respectively, and each have a defective address programmed therein in advance. Further, the program circuits output a redundancy hit signal when the refresh address or the external address matches the defective address. Redundancy word lines are formed in the memory blocks, respectively, and selected according to the redundancy hit signal. In each memory block, the first word decoder unselects the selected word line selection signal line in synchronization with the output of the redundancy hit signal. Therefore, also in the semiconductor memory including the redundancy word line, it is possible to hold the selection of the word line selection signal line selected according to the refresh operation, and unselect the corresponding word line selection signal line when the redundancy word line is accessed.

In a preferred example of the one aspect of the semiconductor memory of the present invention, the word line selection signal line and the word line are a main word line and a sub-word line, respectively. The first word decoder is a main word decoder. The second word decoder is each of sub-word decoders which are arranged dispersedly in each memory block. The wiring length of the main word line is long since it needs to be connected to the sub-word decoders arranged dispersedly. Therefore, the selection/unselection of the main word line causes a large charge/discharge current. Lowering the frequency of selection and unselection of the main word lines by the present invention can reduce the charge/discharge current of the main word lines, thereby reducing the current consumption of the semiconductor memory.

In a preferred example of the one aspect of the semiconductor memory of the present invention, at least one bit of a highest bit of the refresh address generated by the refresh address generation circuit is assigned to select the word line group. In the refresh address, bits other than the bits assigned to select the memory block and the word line group are assigned to select the word line. When the refresh operation is repeated, assigning the word line group to the highest order of the refresh address makes it possible to reduce the frequency of switching between the word line selection signal lines to minimum, which can reduce the current consumption of the semiconductor memory.

In a preferred example of the one aspect of the semiconductor memory of the present invention, the word line selection signal line and the word line are a sub-word selection signal line and a sub-word line, respectively. The first word decoder is a sub-word selection decoder. The second word decoder is each of sub-word decoders which are arranged dispersedly in each memory block. The wiring length of the sub-word selection signal line is long since it needs to be connected to the sub-word decoders arranged dispersedly. Therefore, the selection/unselection of the sub-word selection signal line causes a large charge/discharge current. Lowering the frequency of selection and unselection of the sub-word selection signal lines by the present invention can reduce the charge/discharge current of the sub-word selection signal lines, which can reduce the current consumption of the semiconductor memory.

In a preferred example of the one aspect of the semiconductor memory of the present invention, at least one bit of a highest order of the refresh address generated by the refresh address generation circuit is assigned to select the word line. In the refresh address, bits other than the bits assigned to select the memory block and the word line are assigned to select the word line group. When the refresh operation is repeated, assigning the word line to the highest order of the refresh address makes it possible to reduce the frequency of switching between the word line selection signal lines to minimum, which can reduce the current consumption of the semiconductor memory.

In a preferred example of the one aspect of the semiconductor memory of the present invention, the semiconductor memory includes a plurality of memory banks selected according to a bank address and operating independently of each other. Each memory bank includes a plurality of memory blocks, a plurality of word line groups, a plurality of first word decoders, and a plurality of second word decoders. In response to the access request, the word control circuit unselects the word line selection signal line only for the memory bank selected according to the bank address, while continuously selecting the word line selection signal line for refresh. Accordingly, similarly to the above, the word line selection signal line can be selected/unselected independently in each memory bank. In the memory bank uninvolved in the access request, unnecessary unselection of the word line selection signal line can be prevented, which can reduce power consumption.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
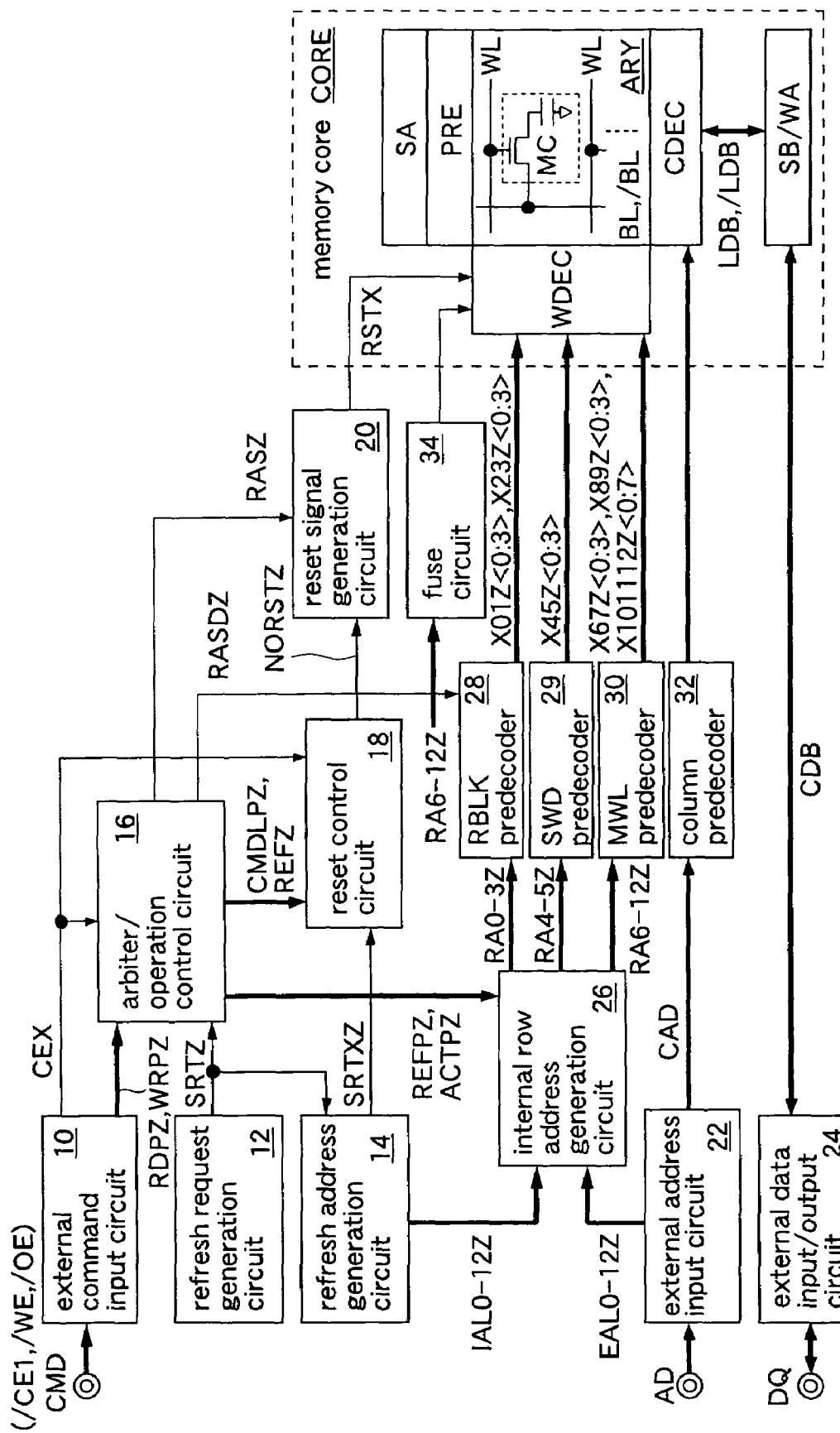
FIG. 1 is a block diagram showing a first embodiment of a semiconductor memory of the present invention.

Hereinafter, embodiments of the present invention will be described, using the drawings. In the drawings, each double circle denotes an external terminal. Each signal line shown by a heavy line is constituted of a plurality of signal lines. Part of blocks to which the heavy lines are connected is constituted of a plurality of circuits. Each signal supplied through an external terminal is denoted by the same reference symbol as the name of the terminal. Further, each signal line through which a signal is transmitted is denoted by the same reference symbol as the name of the signal. Each signal with "Z" at the end of its name indicates positive logic. Each signal with "/" at the head of its name and each signal with "X" at the end of its name indicate negative logic.

FIG. 1 shows a first embodiment of a semiconductor memory of the present invention.

This semiconductor memory is formed as a pseudo SRAM on a silicon substrate using a CMOS process. The pseudo SRAM is used, for example, for a work memory mounted in portable equipment such as a mobile phone. The pseudo SRAM has a burst access function of continuously performing a read operation or a write operation in response to one access request.

The pseudo SRAM includes an external command input circuit 10, a refresh request generation circuit 12, a refresh address generation circuit 14, an arbiter/operation control circuit 16, a reset control circuit 18 (reset disable control circuit), a reset signal generation circuit 20 (reset disable control circuit), an external address input circuit 22, an external data input/output circuit 24, an internal row address generation circuit 26, a predecoder 28 to select a row block RBLK (memory block) described later, a predecoder 29 to select a sub-word line SWL (word line) described later, a predecoder 30 to select a main word line MWLX described later, a predecoder 32 for a column address CAD, a fuse circuit 34 (program circuit), and a memory core CORE. The reset control circuit 18, the reset signal generation circuit 20, and a block reset control circuit RSTC shown in FIG. 4 operate as a word control circuit which holds a selection state of the main word line MWLX (FIG. 4) selected in each row block RBLK corresponding to a refresh address after a refresh operation and unselects only the main word line MWLX of the row block RBLK selected by an external address EAL supplied corresponding to an access request. Generally, the pseudo SRAM having the burst access function operates in synchronization with an external clock received at a clock terminal, but in this embodiment, the description of the external clock is omitted.

The external command input circuit 10 includes an input buffer, and receives a command signal CMD (e.g. chip enable signal /CE1, write enable signal /WE, output enable signal /OE) supplied to a command terminal CMD. The external command input circuit 10 has a command decoder function and outputs a read control signal RDPZ to perform the read operation, a write control signal WRPZ to perform the write operation, or the like in response to the received command signal CMD. The chip enable signal /CE1 indicating the access request is supplied as an internal chip enable signal CEX to internal circuits via the input buffer.

The refresh request generation circuit 12 includes a refresh timer (not shown) which generates a refresh request SRTZ to refresh a memory cell MC in a predetermined cycle. For example, the refresh request SRTZ is generated every several μs. The refresh address generation circuit 14 performs a count operation in synchronization with the refresh request SRTZ and generates an internal address (hereinafter also referred to as a refresh address) IAL0-12Z composed of 13 bits. Out of the refresh address IAL0-12Z, the low-order 4 bits IAL0-3Z are used to select a row block RBLK0-15, the next 2 bits are used to select the sub-word line SWL, and the high-order 7 bits are used to select the main word line MWLX. The sub-word line SWL connected to the memory cell MC to be refreshed is specified by the refresh address IAL0-12Z. The low-order bits of the refresh address IAL0-12Z are assigned to the row block RBLK, so that the refresh operation is performed in the different row block RBLK at each refresh request. By assigning the low-order bits and the high-order bits of the refresh address IAL to the row block RBLK and the main word line MWLX, as will be described later, the frequency with which the main word lines MWLX are unselected during a standby period of the pseudo SRAM can be lowered. Further, the refresh address generation circuit 14 holds a refresh counter signal SRTXZ at a high level while the refresh address (bits IAL4-5Z are both high-level) to select the last sub-word line SWL3 out of four sub-word lines SWL0-3 is outputted.

The arbiter/operation control circuit 16 has an arbiter function of deciding the priority between the access request (a read command and a write command) supplied from outside the pseudo SRAM and the refresh request generated inside the pseudo SRAM. Further, the arbiter/operation control circuit 16 has an operation control circuit function of outputting control signals and timing signals to internal circuits to allow the memory core CORE to perform the read operation or the write operation in response to the access request and allow the memory core CORE to perform the refresh operation in response to the refresh request. More specifically, the arbiter/operation control circuit 16 outputs a command latch signal (pulse signal) CMDLPZ in synchronization with the reception of the access request (RDPZ, WRPZ), outputs an access signal ACTPZ when an access operation (read operation, write operation) is performed, outputs refresh signals REFZ, REFPZ when the refresh operation is performed, and outputs basic timing signals RASZ, RASDZ to operate the memory core CORE when the access operation and the refresh operation are performed. The basic timing signal RASDZ is a signal obtained by delaying the basic timing signal RASZ. For example, the selection period of a word line WL is set by the basic timing signal RASZ.

The reset control circuit 18 activates a reset disable signal NORSTZ in synchronization with the start of the refresh operation and inactivates the reset disable signal NORSTZ in synchronization with the reception of the access request. Note, however, that during a burst access operation described later and the selection period of the sub-word line SWL3 (high-level period of the refresh counter signal SRTXZ), the activation of the reset disable signal NORSTZ is masked, so that the reset disable signal NORSTZ remains inactivated. The reset signal generation circuit 20 outputs the basic timing signal RASZ as a reset signal RSTX during the inactivation (low-level period) of the reset disable signal NORSTZ.

The external address input circuit 22 includes an input buffer, receives an external address AD supplied to an address terminal AD, and outputs the received signal as an external address EAL0-12Z (row address) and a column address CAD. The external data input/output circuit 24 includes an input buffer and an output buffer. In the read operation the external input/output circuit 24 outputs read data transferred from the memory core CORE via a common data bus CDB to an external date terminal DQ. In the write operation, the external data input/output circuit 24 receives write data via the external data terminal DQ and transfers the received data to the memory core CORE via the common data bus CDB.

The internal row address generation circuit 26 outputs the external address EAL0-12Z as a row address RA0-12Z when the access operation is performed, and outputs the internal address IAL0-12Z as the row address RA0-12A when the refresh operation is performed. Namely, the internal row address generation circuit 26 functions as a selector which switches between the external address EAL and the internal address IAL. The internal row address generation circuit 26 has a function of latching the row address RA0-12Z.

To select any of the row blocks RBLK0-15 (FIG. 4), the predecoder 28 predecodes a 4-bit row address RA0-3Z and generates eight predecode signals X01Z<0:3>, X23Z<0:3> (row block addresses). Incidentally, <0:n> at the end of the name of the signal indicates that the signal is composed of n+1 bits. The predecode signals X01Z, X23Z are signals obtained by decoding row addresses RA0-1Z, RA2-3Z, respectively. To select any of main word lines MWLX0-127 (FIG. 5) in each row block RBLK, the predecoder 30 predecodes a 7-bit row address RA6-12Z and generates 16 predecode signals X67Z<0:3>, X89Z<0:3>, X101112Z<0:7> (main word addresses). The predecode signals X67Z, Z89Z, X101112Z are signals obtained by decoding row addresses RA6-7Z, RA8-9Z, RA10-12Z, respectively. To select a column switch connected to bit lines BL, /BL for each data terminal DQ, the predecoder 32 predecodes the column address CAD and outputs the generated predecode signal to a column decoder CDEC.

The fuse circuit 34 outputs a redundancy hit signal RHIT and so on when the value of the row address RA6-12Z matches a programmed address value. The fuse circuit 34 is a control circuit to replace the defective main word line MWLX (MWLX corresponding to a defective memory cell) with a redundancy main word line RMWLX. In this embodiment, one main word line MWLX can be relieved in each row block RBLK.

The memory core CORE includes a memory array ARY, word decoders WDEC, the column decoder CDEC, a sense amplifier SA, a precharge circuit PRE, a sense buffer SB, and a write amplifier WA. The memory cell array ARY includes a plurality of volatile memory cells MC (dynamic memory cells) arranged in a matrix, and a plurality of word lines WL (hereinafter also referred to as sub-word lines SWL) and a plurality of bit line pairs BL, /BL connected to the memory cells MC. The memory cell MC includes a capacitor to hold data as an electric charge and a transfer transistor placed between the capacitor and the bit line BL (or /BL). A gate of the transfer transistor is connected to the word line WL.

Figure 4:
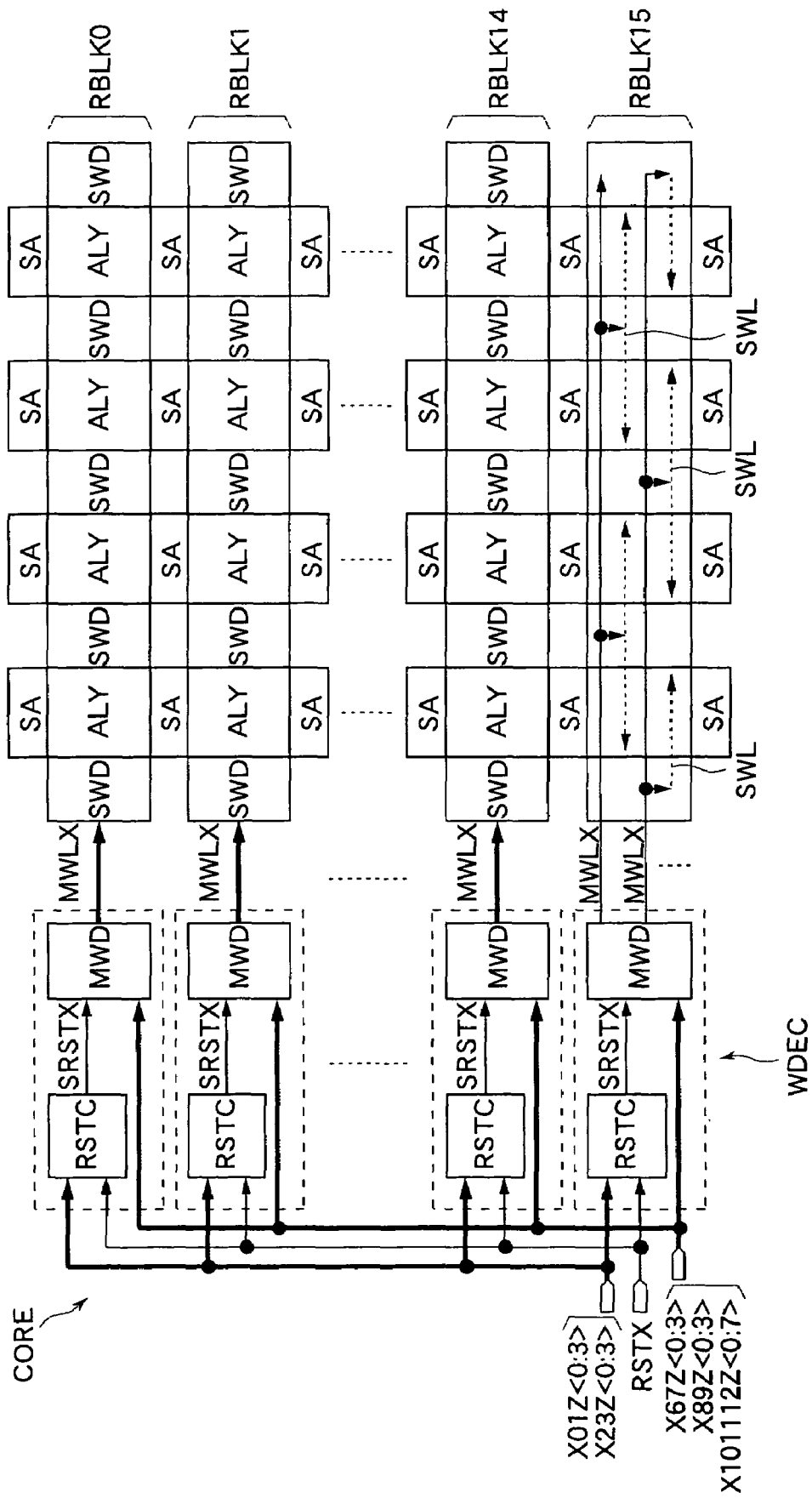
FIG. 4 is a circuit diagram showing a major portion of a memory core shown in FIG. 1.

The word decoder WDEC includes a main word decoder MWD (first word decoder) and sub-word decoders SWD (second word decoders) as shown in FIG. 4 described later. The main word line MWLX selected by the main word decoder MWD following the refresh operation is unselected in synchronization with the activation of the reset signal RSTX. In other words, in each row block RBLK, the main word line MWLX selected for the refresh operation is not unselected until the access request is received or another main word line MWLX is selected by the subsequent refresh operation. The column decoder CDEC outputs a column line signal which turns on the column switch (not shown) to connect the bit lines BL, /BL and local data bus lines LDB, /LDB, respectively.

The sense amplifier SA is activated during the activation of a sense amplifier activation signal outputted from the arbiter/operation control circuit 16 and differentially amplifies data signals read on the bit lines BL, /BL. The precharge circuit PRE is activated during the activation of a precharge control signal outputted from the arbiter/control operation circuit 16 and supplies a precharge voltage to the bit lines BL, /BL. In the read operation, the sense buffer SB amplifies the signal amounts of data read on the local data bus lines LDB, /LDB and outputs them to the common data bus CDB. In the write operation, according to write data on the common data bus CDB, the write amplifier WA outputs the write data to the local data bus lines LDB, /LDB.

Figure 2:
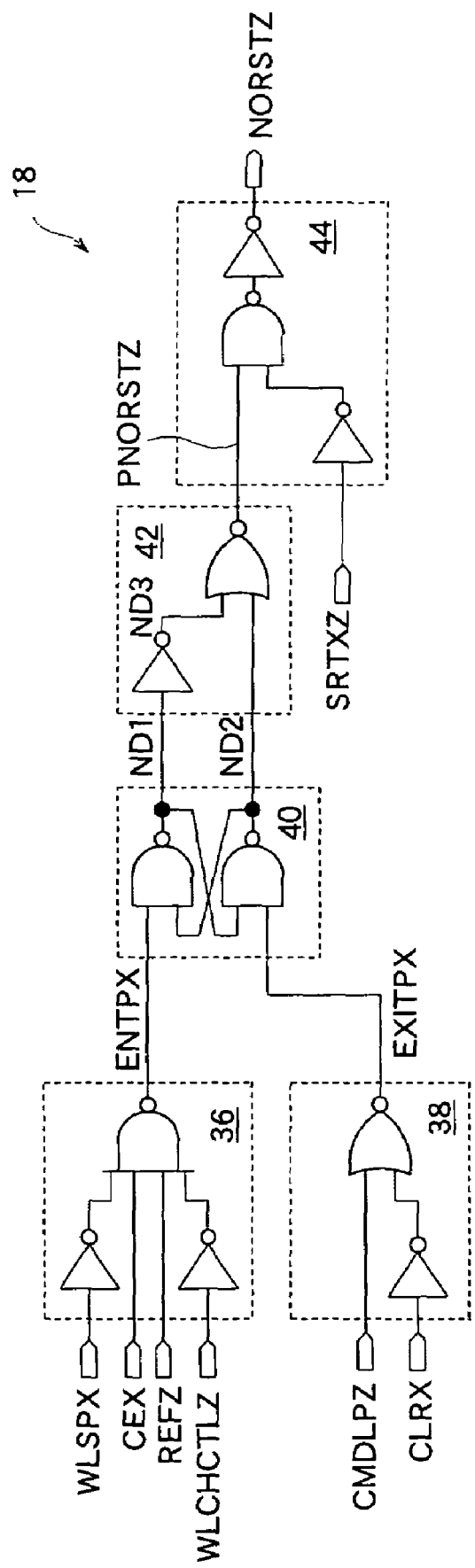
FIG. 2 is a circuit diagram showing details of a reset control circuit shown in FIG. 1.

FIG. 2 shows details of the reset control circuit 18 shown in FIG. 1. The reset control circuit 18 includes an entry generation circuit 36 which generates an entry pulse signal ENTPX responding to the refresh request using a plurality of timing signals WLSPX, CEX, REFZ, WLCHCTLZ, an exit generation circuit 38 which generates an exit pulse signal EXITPX, an RS flip-flop 40 constituted of a pair of NAND gates, a filter circuit 42, and a reset disable generation circuit 44 which generates the reset disable signal NORSTZ.

During a period (CEX=high level) when the access request is not received and a period (burst flag signal WLCHCTLZ=low level) when the burst access operation is not performed, the entry generation circuit 36 temporarily activates the entry pulse signal ENTPX in synchronization with the activation of a word line set timing signal WLSPX (pulse signal) indicating the start of the refresh operation (refresh signal REFZ=H). The activation of the entry pulse signal ENTPX is disabled during the burst access operation by the burst flag signal WLCHCTLZ. Therefore, the entry generation circuit 36 operates as an activation mask circuit which masks the activation of the reset disable signal NORSTZ during the burst access operation.

The exit generation circuit 38 temporarily activates the exit pulse signal EXITPX in synchronization with the activation of the command latch signal CMDLPZ or a clear signal CLRX. The clear signal CLRX is activated to a low level when the pseudo SRAM is powered on. By the activation of the clear signal CLRX, the exit pulse signal EXITPX is activated, the reset disable signal NORSTZ is inactivated, and the main word lines MWLX described later are unselected. By unselecting all the main word lines MWLX at power-on, multiple selection of the word lines immediately after power-on is prevented, and thereby malfunction of the pseudo SRAM is prevented.

The flip-flop 40 sets output nodes ND1, ND2 to a high and a low level, respectively, in synchronization with the activation of the entry pulse signal ENTPX, and resets the output nodes ND1, ND2 to the low and the high level, respectively, in synchronization with the activation of the exit pulse signal EXITPX. In the pseudo SRAM, the refresh request and the access request are generated asynchronously with each other. By activating the entry pulse signal ENTPX in synchronization with the start of the refresh operation, the entry pulse signal ENTPX and the exit pulse signal EXITPX are prevented from being supplied simultaneously to the flip-flop 40 even when the refresh request and the access request are generated simultaneously. Accordingly, malfunction of the reset control circuit 18 is prevented.

The filter circuit 42 includes an inverter which inverts the node ND1 and transmits it to the node ND3 and a NOR gate which outputs the AND logic of the negative logics of the nodes ND2, ND3. When the entry pulse signal ENTPX is generated, the filter circuit 42 disables the low level of the node ND2 from being transmitted as a pre-reset disable signal PNORSTZ to the reset disable generation circuit 44 until the setting of the flip-flops 40 is completed. Accordingly, even when the entry pulse signal ENTPX with a short pulse width is generated due to noise or the like and thereby the state of the flip-flop 40 becomes unstable, the malfunction of the reset control circuit 18 is prevented. Incidentally, only three gates are in a signal path from the activation of the command latch signal CMDLPZ to the inactivation of the pre-reset disable signal PNORSTZ. Therefore, the pre-reset disable signal can be rapidly inactivated. As a result, the main word line MWLX selected for the refresh operation can be switched rapidly in response to the access request, resulting in a reduction in access time.

The reset disable generation circuit 44 activates the reset disable signal NORSTZ in synchronization with the pre-reset disable signal PNORSTZ while the refresh counter signal SPTXZ is at a low level. The reset disable generation circuit 44 fixes the reset disable signal NORSTZ to a low level while the refresh counter signal SRTXZ is at a high level. The refresh counter signal SRTXZ is activated while the internal addresses IAL4-5Z for selecting the sub-word line outputted from the refresh address generation circuit 14 are both at a high level. Namely, the reset disable signal NORSTZ is inactivated to the low level independently of the pre-reset disable signal PNORSTZ while the last sub-word line SWL3 out of the four sub-word lines SWL0-3 corresponding to each main word line is selected as an object of the refresh operation.

Figure 3:
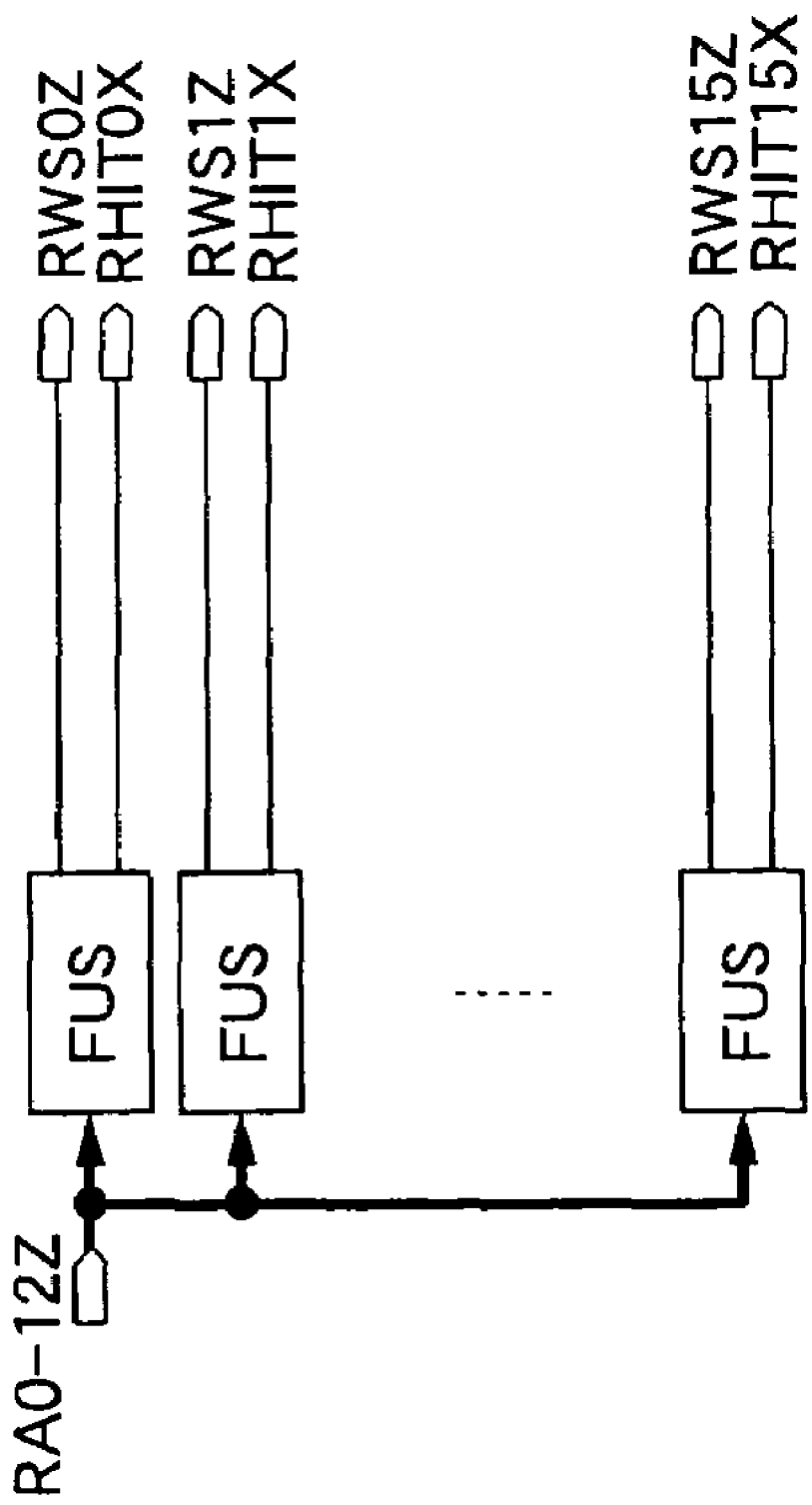
FIG. 3 is a block diagram showing details of a fuse circuit shown in FIG. 1.

FIG. 3 shows details of the fuse circuit 34 shown in FIG. 1.

The fuse circuit 34 includes fuse parts FUS which program addresses of the redundancy main word lines RMWLX of the row blocks RBLK0-15, respectively. Each fuse part FUS activates a redundancy selection signal RWSZ (any of RWS0Z-RWS15Z) and the redundancy hit signal RHITX (any of RHIT0X-RHIT15X) when the row address RA0-12Z matches the programmed address.

FIG. 4 shows a major portion of the memory core CORE shown in FIG. 1. The memory core CORE includes 16 row blocks RBLK0-15 selected according to the row block addresses X01Z<0:3>, X23Z<0:3>. The word decoder WDEC includes a block reset control circuit RSTC, the main word decoders MWD (first word decoders) and the sub-word decoders SWD (second word decoders). The block reset control circuit RSTC is formed for each row block RBLK0-15. The main word decoder MWD is formed for each main word line MWLX. The sub-word decoder SWD is formed for each sub-word line SWL.

The block reset control circuit RSTC outputs a block reset signal SRSTX and timing signals not shown to operate the memory core CORE according to the reset signal RSTX and the row block addresses X01Z<0:3>, X23Z<0:3>. The main word decoder MWD is selected according to the main word addresses X67Z<0:3>, X89Z<0:3>, X101112Z<0:3> in each row block RBLK0-15. The selected main word decoder MWD selects the main word line MWLX during the inactivation of the block reset signal SRSTX. The main word decoder MWD which is selecting the main word line MWLX unselects the main word line MWLX (word line selection signal line) in synchronization with the selection of the block reset signal SRSTX.

Although not shown in detail, each main word line MWLX is connected to four sub-word decoders SWD. In the access operation (read operation, write operation) and the refresh operation, four sub-decoders SWD corresponding to the sub-word lines SWL0-3 are selected by the selected main word line MWLX, further one sub-word decoder SWD is selected by the sub-word address RA4-5Z, and the sub-word line SWL is selected by the selected sub-word decoder SWD. The sub-word lines SWL0-3 corresponding to each main word line MWLX constitute a word line group. Namely, the main word decoder MWD is formed for each word line group. The sub-word decoders SWD are arranged dispersedly in the row block RBLK. Since the main word line MWLX is connected to all of the sub-word decoders SWD corresponding thereto, its wiring length is long. Accordingly, a large charge/discharge current flows with respect to each selection/unselection of the main word line MWLX. In this embodiment, as will be described later, by lowering the frequency of selection/unselection of the main word lines MWLX, the charge/discharge current is reduced, thereby reducing power consumption.

Incidentally, the sub-word decoder SWD sandwiched between memory cell arrays ALY is used in common by the memory cell arrays ALY on both sides. Therefore, in the sub-word decoders SWD arranged in a lateral direction in the figure, the access operation or the refresh operation is performed by either odd number-th sub-word decoders SWD or even number-th sub-word decoders SWD being operated.

Figure 5:
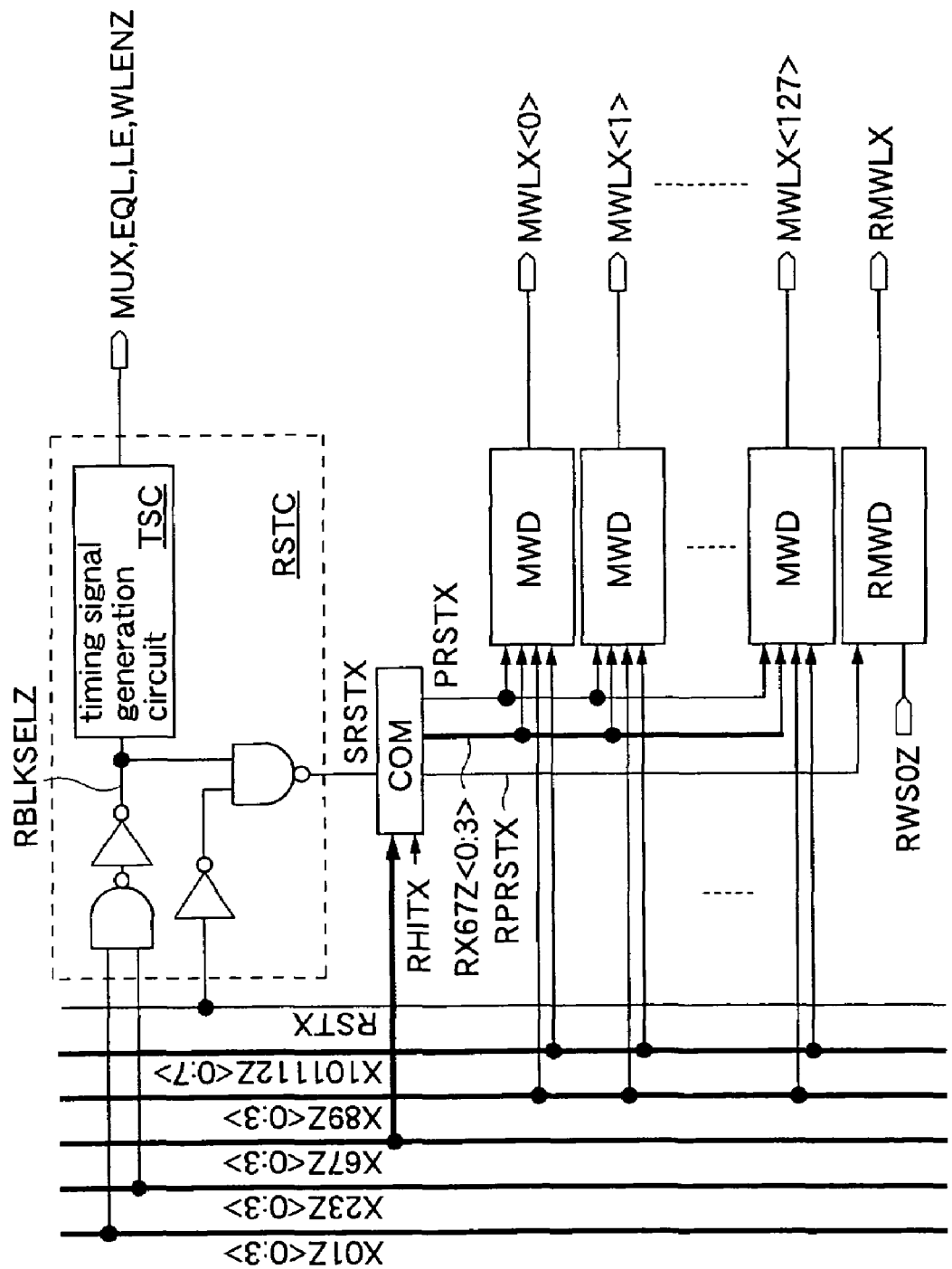
FIG. 5 is a block diagram showing details of each word decoder shown in FIG. 4.

FIG. 5 shows details of each word decoder WDEC shown in FIG. 4. The block reset control circuit RSTC includes an AND circuit which generates a row block selection signal RBLKSELZ according to the row block addresses X01Z<0:3>, X23Z<0:3>, a timing signal generation circuit TSC which generates timing signals MUX, EQL, LE, and WLENZ according to the row block selection signal RBLKSELZ, and a NAND gate which outputs the reset signal RSTX as the block reset signal SRSTX during the activation of the row block selection signal RBLKSELZ. The block reset signal SRSTX is activated in synchronization with the reset signal RSTX generated in response to the inactivation of the reset disable signal NORSTZ in each row block RBLK.

As will be described later, by the inactivation of the block reset signal SRSTX, the main word line MWLX selected in its corresponding row block RBLK is unselected. The timing signal MUX is used to turn on/off a switch which connects the bit lines BL, /BL to the sense amplifier SA. The timing signal EQL is used to equalize and set voltages of the bit lines BL, /BL to a precharge voltage. The timing signal LE is used to activate the sense amplifier SA. The timing signal WLENZ is used to generate a selection timing of the sub-word line SWL.

The pseudo SRAM includes a redundancy main word decoder RMWD connected to the redundancy main word line RMWLX in each row block RBLK0-15. The redundancy main word line RMWLX is selected in synchronization with the activation of the redundancy selection signal RWS0Z (the number of the signal name denotes the number of the row block RBLK). When the redundancy main word line RMWLX is selected, the redundancy hit signal RHITX is activated, and the main word decoder MWD is unselected. In this embodiment, the redundancy main word line RMWLX is used to relieve the main word line MWLX of its corresponding row block RBLK. Also when there is a defect in the memory cell MC connected to one sub-word line SWL, the defect is relieved on the basis of each main word line MWLX (on the basis of every sub-word lines SWL0-3).

Figure 6:
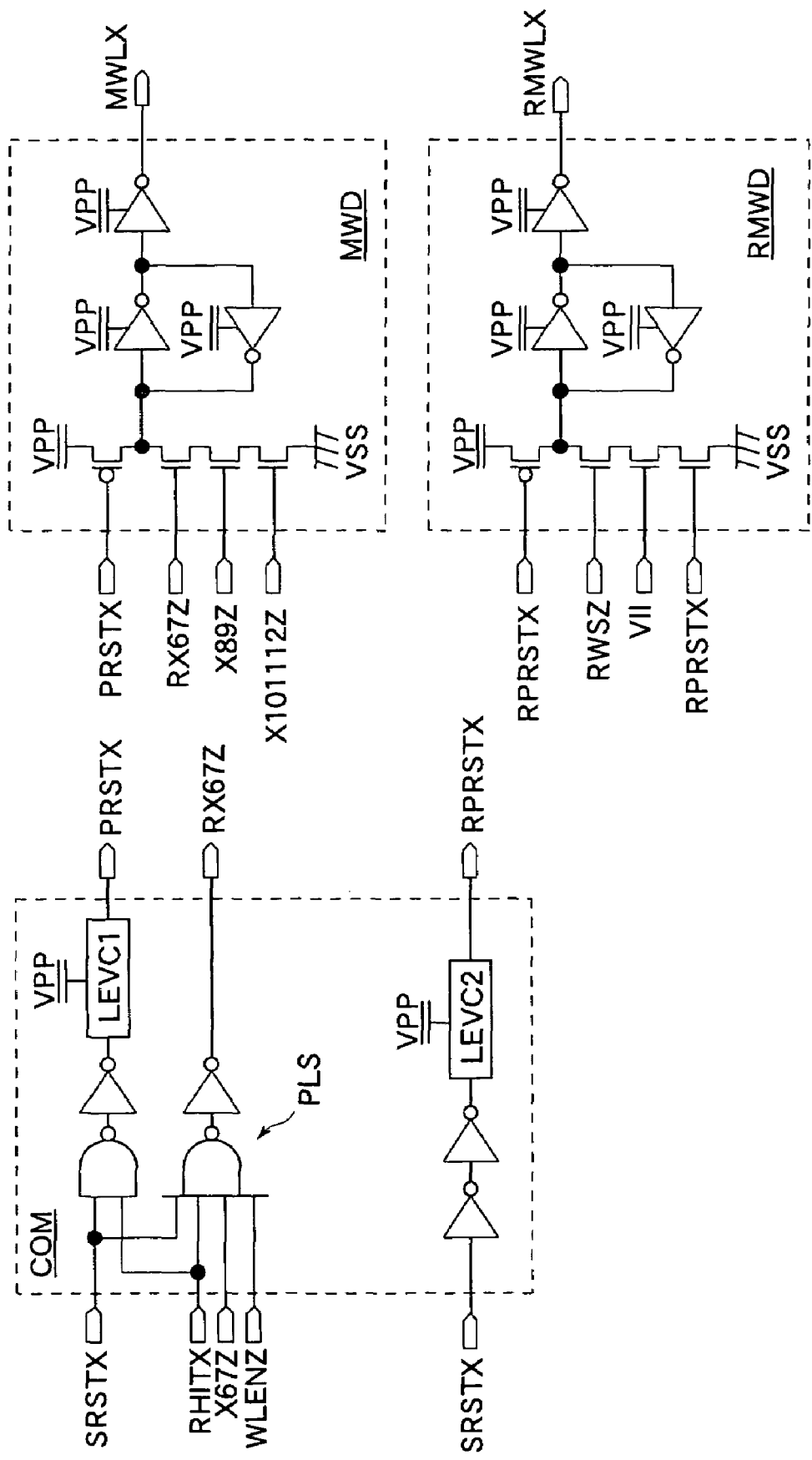
FIG. 6 is a circuit diagram showing details of a main word decoder and a redundancy main word decoder shown in FIG. 5.

FIG. 6 shows details of the main word decoder MWD and the redundancy main word decoder RMWD. In this figure, the main word addresses X67Z, X89Z, X101112Z show any of the main word address X67Z<0:3>, X89Z<0:3>, X101112Z<0:7>, respectively. A common circuit COM is a circuit common to the main word decoders MWD, RMWD. The common circuit COM includes a level converter LEVC1 for the main word decoder MWD, a pulse part PLS which generates a pulsed predecode signal RX67Z, and a level converter LEVC2 for the redundancy main word decoder RMWD.

The level converter LEVC1 converts the high level of the block reset signal SRSTX from an internal supply voltage VII to a boost voltage VPP to generate the block reset signal PRSTX during the inactivation of the redundancy hit signal RHITX (RHIT0X-RHIT15X). The boost voltage VPP is generated by a boost voltage generation circuit formed in the pseudo SRAM. The pulse part PLS converts the predecode signal X67Z to the predecode signal RX67Z which synchronizes with the timing signal WLENZ determining the selection period of the sub-word line SWL during the inactivation of the redundancy hit signal RHITX. The level converter LEVC2 converts the high level of the block reset signal SRSTX from the internal supply voltage VII to the boost voltage VPP to generate a redundancy block reset signal RPRSTX.

The main word decoder MWD includes a pMOS transistor which receives the block reset signal PRSTX at its gate, nMOS transistors which receive the predecode signals RX67Z, X89Z, X101112Z at their gates, respectively, and a latch connected to a drain of the pMOS transistor. The pMOS transistor and the nMOS transistors are connected in series between a boost voltage supply line VPP and a ground line VSS. An output of the latch is connected to the main word line MWLX via an inverter.

The redundancy main word decoder RMWD is the same circuit as the main word decoder MWD. A pMOS transistor of the redundancy main word decoder RMWD receives the redundancy block reset signal RPRSTX at its gate. nMOS transistors of the redundancy main word decoder RMWD receive the redundancy selection signal RWSZ, the internal supply voltage VII, and the redundancy block reset signal RPRSTX at their gates, respectively.

Figure 7:
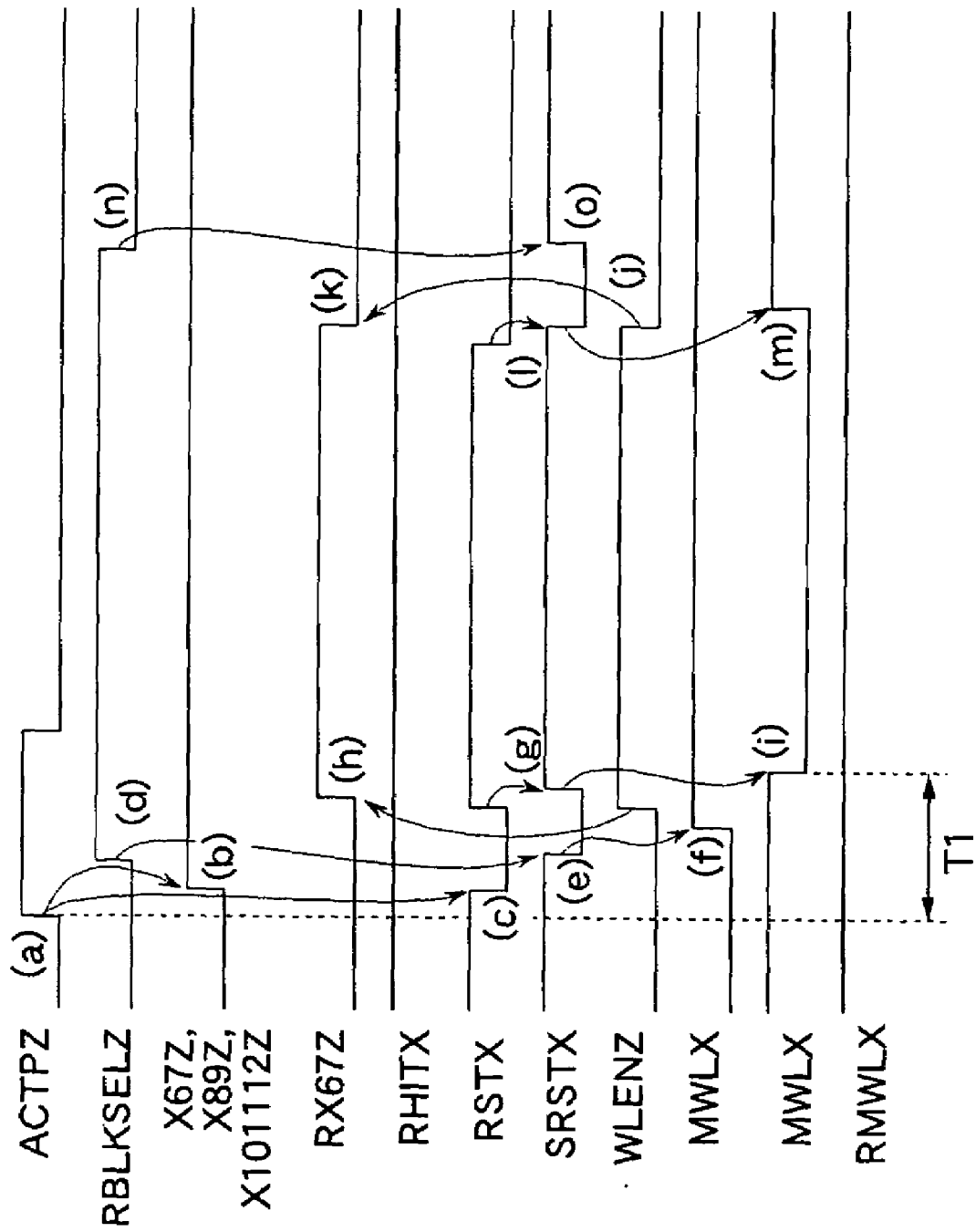
FIG. 7 is a timing chart showing the operations of the main word decoders and the redundancy main word decoder when a read operation or a write operation is performed in the first embodiment.

FIG. 7 shows the operations of the main word decoders MWD and the redundancy main word decoder RMWD when the read operation or the write operation is performed. This example shows a case where there is no defect in the main word lines MWLX, the memory cells MC, and so on, and the redundancy hit signal RHITX is not activated.

First, the arbiter/operation control circuit 16 activates the access signal ACTPZ in response to an access command (read command or write command) (FIG. 7(a)). In synchronization with the activation of the access signal ACTPZ, the main word addresses X67Z, X89Z, X101112Z (predecode signals) are activated (FIG. 7(b)), and the reset signal RSTX is activated (FIG. 7(c)). Also, the row block selection signal RBLKSELZ of the row block RBLK selected by the row block addresses X01Z, X23Z (predecode signals) is activated (FIG. 7(d)). In synchronization with the activation of the row block selection signal RBLKSELZ, the block reset signal SRSTX is activated (FIG. 7(e)), the pMOS transistor of the main word decoder MWD is turned on, and the main word line MWLX which continues to be selected to perform the refresh operation is unselected (FIG. 7(f)). Namely, only in the row block RBLK where the read operation or the write operation (access operation) is performed, the main word line MWLX is unselected.

After this, the basic timing signal RASZ is activated for the access operation, and the reset signal RSTX and the block reset signal SRSTX are sequentially inactivated (FIG. 7(g)). The main word decoder MWD selected for the access operation activates the predecode signal RX67Z in synchronization with the activation of the timing signal WLENZ and the inactivation of the block reset signal SRSTX (FIG. 7(h)). The predecode signal RX67Z is not activated until the block reset signal SRSTX is inactivated. This prevents the pMOS transistor and the nMOS transistors of a decode part DEC of the main word decoder MWD from being turned on simultaneously, which prevents a feedthrough current from flowing. Namely, the malfunction of the main word decoder MWD is prevented.

In synchronization with the activation of the predecode signal RX67Z, the main word line MWLX corresponding to the access request is selected, and the access operation is performed (FIG. 7(i)). The time from the activation of the access signal ACTPZ to the selection of the main word line MWLX is T1.

The access operation is completed, the timing signal WLENZ is inactivated (FIG. 7(j)), and the predecode signal RX67Z is inactivated (FIG. 7(k)). After the predecode signal RX67Z is inactivated, the selection state of the main word line MWLX is held by a latch circuit. In synchronization with the inactivation of the basic timing signal RASZ, the reset signal RSTX and the block reset signal SRSTX are activated (FIG. 7(l)). In synchronization with the activation of the block reset signal SRSTX, the pMOS transistor of the decoder part DEC is turned on, and the main word line MWLX selected for the access operation is inactivated (FIG. 7(m)). The supply of the external address EAL0-12Z is stopped, thereby the block selection signal RBLKSELZ is inactivated (FIG. 7(n)), and the block reset signal SRSTX is inactivated again (FIG. 7(o)). Then, an access cycle is completed.

Figure 8:
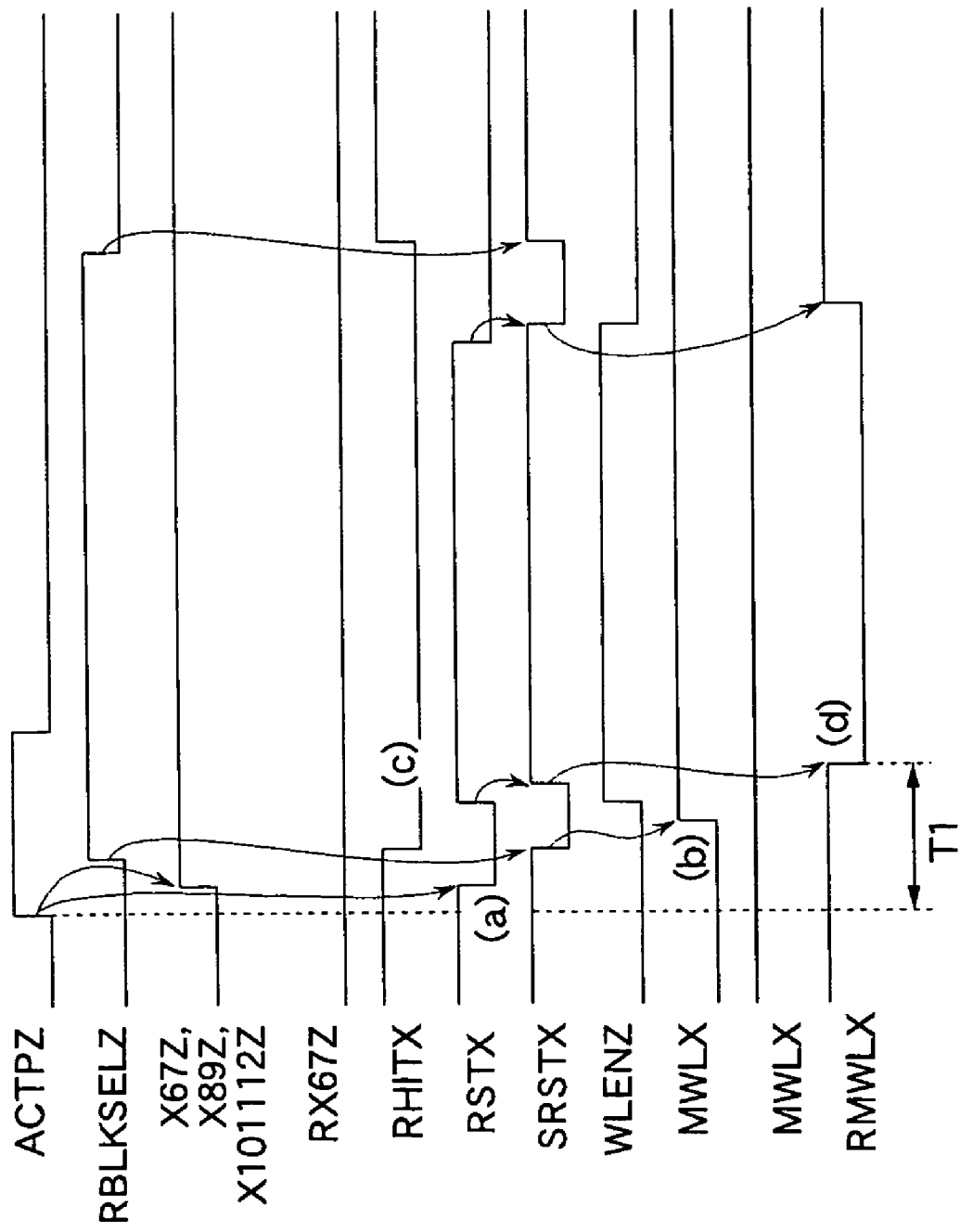
FIG. 8 is a timing chart showing another example of the operations of the main word decoders and the redundancy main word decoder when the read operation or the write operation is performed in the first embodiment.

FIG. 8 shows another example of the operations of the main word decoders MWD and the redundancy main word decoder RMWD when the read operation or the write operation is performed. This example shows a case where there is a defect in the main word line MWLX, the memory cell MC, or the like, and the redundancy hit signal RHITX is activated. A detailed description of the same operations as in FIG. 7 is omitted.

First, as in FIG. 7, the reset signal RSTX and the block reset signal SRSTX are activated (FIG. 8(a)), and the main word line MWLX which continues to be selected to perform the refresh operation is unselected (FIG. 8(b)). Upon receiving the row address RA6-12Z, the fuse circuit 34 activates the redundancy hit signal RHITX (FIG. 8(c)). The activation of the redundancy hit signal RHITX disables the activation of the predecode signal RX67Z and activates the block reset signal PRSTX, so that the main word decoder MWD holds the unselection state of the main word line MWLX. Since the fuse circuit 34 activates the redundancy selection signal RWSZ and inactivates the block reset signal SRSTX (RPRSTX), the redundancy word decoder RMWD selects the redundancy main word line RMWLX (FIG. 8(d)). Namely, the main word line is replaced, and thereby the defect is relieved. The time from the activation of the access signal ACTPZ to the selection of the redundancy main word line RMWLX is the same T1 as in FIG. 7. After this, the access operation is completed, and as in FIG. 7, the redundancy main word line RMWLX is unselected.

Figure 9:
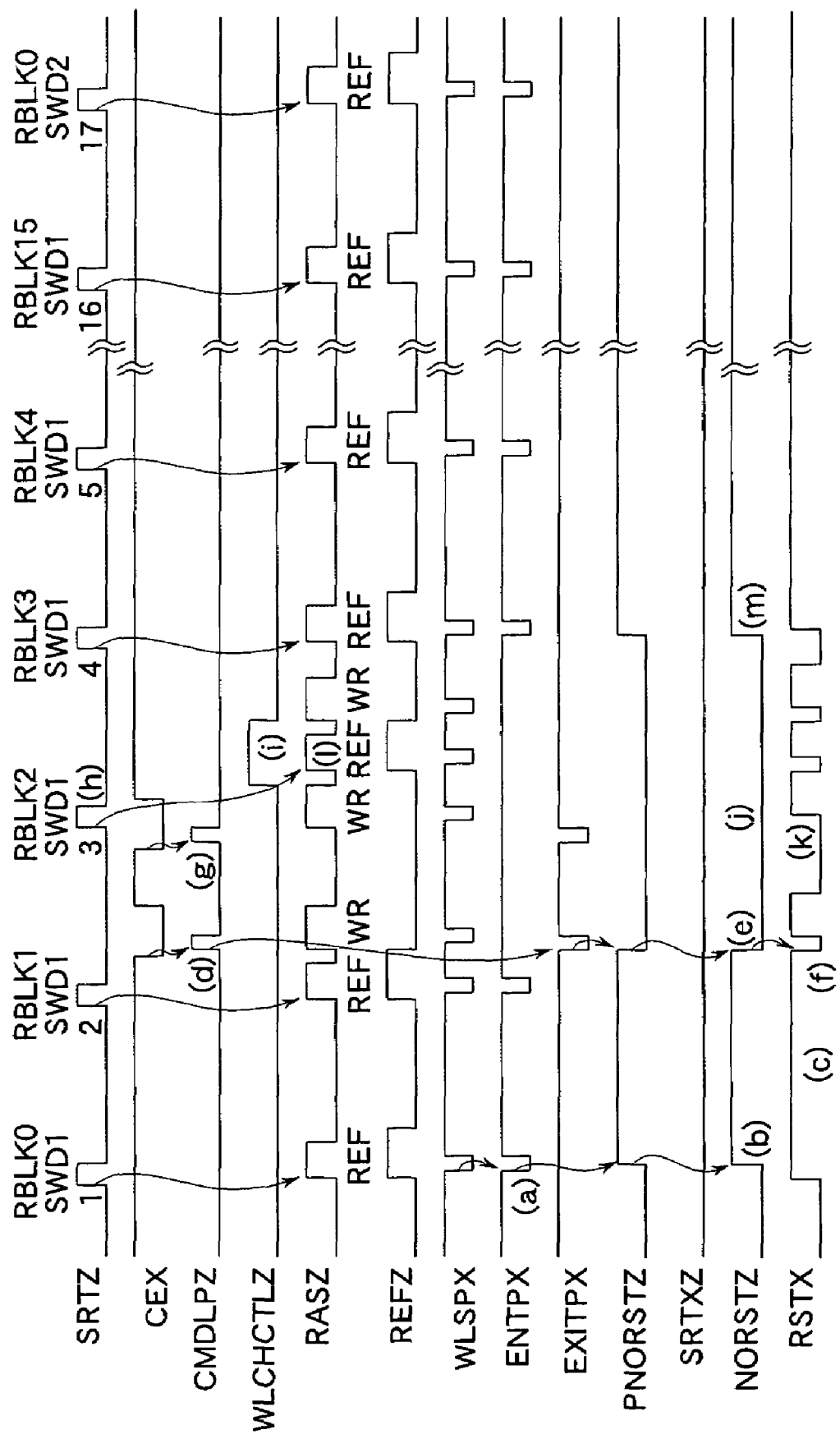
FIG. 9 is a timing chart showing the operations of an arbiter/operation control circuit, the reset control circuit, and a reset signal generation circuit in the first embodiment.
Figure 10:
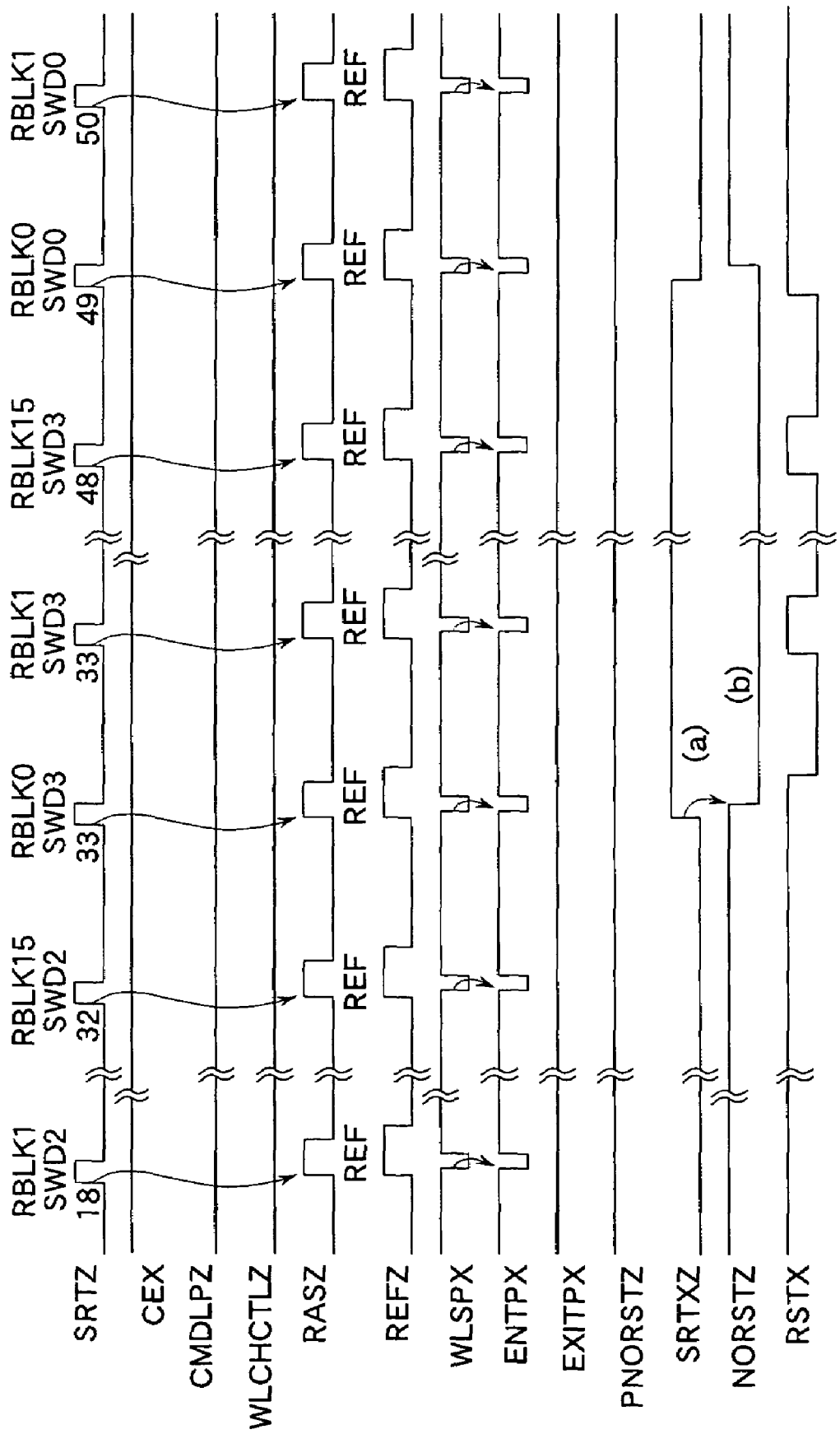
FIG. 10 is a timing chart showing the operations of the arbiter/operation control circuit, the reset control circuit, and the reset signal generation circuit in the first embodiment.

FIG. 9 and FIG. 10 show the operations of the arbiter/operation control circuit 16, the reset control circuit 18, and the reset signal generation circuit 20 in the first embodiment. Waveforms at the right end of FIG. 9 connect with waveforms at the left end of FIG. 10. At each refresh request, the refresh operation which is automatically performed inside the pseudo SRAM is first performed by updating the number of the row block RBLK, then performed by updating the number of the sub-word line SWL, and finally performed by updating the number of the main word line MWLX. The order of updating is determined by assignment of the internal address IAL0-12Z generated by the refresh address generation circuit 14. In this example, the pseudo SRAM receives a write request and a burst write request in sequence between the second and the third refresh request SRTZ. After a burst write operation, a standby state in which no access request is received continues. In the refresh operation and the write operation (or read operation), the sub-word line SWL connected to the memory cell MC is activated in synchronization with the high-level period of the basic timing signal RASZ. In a burst access operation (burst write operation or burst read operation), in response to one write request or read request, the write operation or read operation is continuously performed even after the chip enable signal /CE1 is inactivated.

In FIG. 9, in synchronization with the start of the first refresh operation, the entry pulse signal ENTPX is generated (FIG. 9(a)), and the reset disable signal NORSTZ is activated (FIG. 9(b)). During the activation of the reset disable signal NORSTZ, the pseudo SRAM is placed in a reset disable mode. The reset signal RSTX is generated by the OR logic of the reset disable signal NORSTZ and the basic timing signal RASZ (FIG. 9(c)). The unselection of the main word line MWLX is disabled during the inactivation (high-level) period of the reset signal RSTX.

The write request (CEX=low level) is supplied during or immediately after the second refresh operation, and the command latch signal CMDLPZ is activated (FIG. 9(d)). In synchronization with the command latch signal CMDLPZ, the exit pulse signal EXITPX is generated, and the reset disable signal NORSTZ is inactivated (FIG. 9(e)). Then, the reset disable mode is released. The reset signal RSTX is activated in synchronization with an earlier one of the inactivation of the reset disable signal NORSTZ and the inactivation of the basic timing signal RASZ following the refresh operation (FIG. 9(f)).

By the inactivation of the reset signal RSTX, in the row block RBLK where the write operation is performed, the main word line MWLX which continues to be selected for the refresh operation is unselected and the main word line MWLX in which the write operation is to be performed is selected. In each of the other row blocks RBLK, the main word line MWLX continues to be selected for the refresh operation.

Then, the burst write request is supplied, and the command latch signal CMDLPZ is activated (FIG. 9(g)). Immediately after the burst write request, the third refresh request is generated (FIG. 9(h)). The refresh operation corresponding to this refresh request is performed during the burst write operation. Here, for ease of explanation, an example in which the burst operation is performed by two write operations is shown. The reset control circuit 18 receives the burst flag signal WLCHCTLZ having an activation period longer than an activation period of the basic timing signal RASZ for the refresh operation during the burst write operation (FIG. 9(i)). Therefore, the reset disable signal NORSTZ is not activated even when the refresh operation is performed (FIG. 9(j)). The reset signal RSTX is activated in synchronization with the inactivation of the basic timing signal RASZ during the inactivation of the reset disable signal NORSTZ (FIG. 9(k)).

The third refresh operation is performed immediately after the first burst write by the control of the arbiter/operation control circuit 16 (FIG. 9(l)). After the burst write operation is completed, the reset disable signal NORSTZ is activated in synchronization with the start of the fourth refresh operation (FIG. 9(m)). After this, no access request is generated, so that the reset disable signal NORSTZ remains activated. Therefore, the main word line MWLX selected for the refresh operation is not unselected unless the main word addresses X67Z, X89Z, X101112Z are updated.

In FIG. 10, the 33-48th refresh operations are performed for the last sub-word line SWL3 (sub-word decoder SWD3). During this period, the bits IAL4-5Z of the internal address are held at the high level, and the refresh address generation circuit 14 holds the refresh counter signal SRTXZ at the high level (FIG. 10(a)). The reset disable signal NORSTZ is inactivated by the high-level refresh counter signal SRTXZ (FIG. 10(b)). Hence, the main word lines MWLX selected in the respective row blocks RBLK are unselected sequentially in synchronization with the inactivation of the basic timing signal RASZ for the refresh operation. After the refresh operations for the four sub-word lines SWL0-3 are performed sequentially, the refresh operation for the sub-word line SWL0 for another main word line MWLX is performed. By unselecting the selected main word line MWLX in synchronization with the completion of the refresh operation of the last sub-word line SWL3, the next main word line MWLX can be selected rapidly in the subsequent refresh operation.

Figure 11:
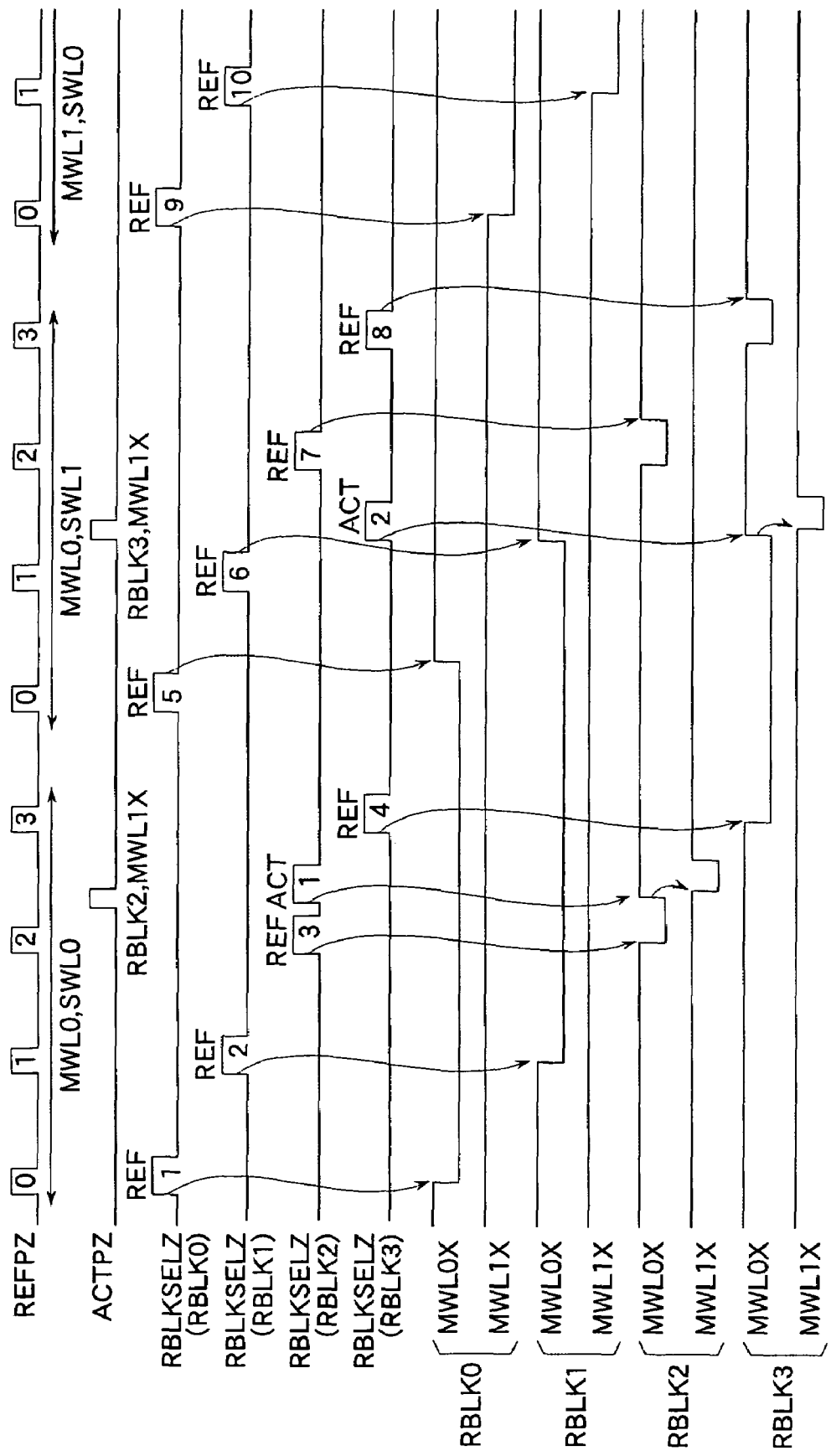
FIG. 11 is a timing chart showing the operation of the memory core in the first embodiment.

FIG. 11 shows the operation of the memory core CORE in the first embodiment. For ease of explanation, an example in which the memory core CORE includes four row blocks RBLK0-3 and two sub-word lines SWL0-1 is shown. The number given to the refresh signal REFPZ denotes the number of the row block where a refresh operation REF is performed.

The row block RBLK is assigned to the low-order 2 bits (in actuality, low-order 4 bits) of the internal address IAL generated by the refresh address generation circuit 14, so that the refresh operation REF is performed by incrementing the number of the row block RBLK by one at each refresh request. In this example, immediately after the third refresh operation REF, an access operation ACT of the row block RBLK2 where the refresh operation REF is being performed is performed. Further, after the sixth refresh operation REF, the access operation ACT in the row block RBLK3 different from the row block RBLK1 where the refresh operation REF is being performed is performed.

At this time, the unselection of the main word line MWLX is performed only in the row block RBLK which has received the access request. In the other row blocks RBLK, the selected main word line MWLX remains selected. Since plural main word lines MWLX are not unselected simultaneously, peak currents caused by charge/discharge of the main word lines MWLX can be dispersed. Accordingly, compared with a case where the plural main word lines MWLX are unselected simultaneously, the voltage drop can be reduced. In other words, the power supply wiring can be narrowed, and consequently the chip size of the pseudo SRAM can be reduced. Further, electromigration in the power supply wiring no longer tends to occur, resulting in an improvement in reliability.

When no access request is generated, in each row block RBLK0-3, in the refresh operation REF of the sub-word line SWL0 (in actuality, SWL0-2) other than the last sub-word line SWL1 (in actuality, SWL3), the main word line MWLX is selected in synchronization with the start of the refresh operation REF. The selection state of the main word line MWLX is held even if the refresh operation REF is completed (1st, 2nd, 4th, 9th, 10th refresh operation REF). Note, however, that when the access request is generated, the selected main word line MWLX is unselected, and the main word line MWLX corresponding to the access request is selected (1st, 2nd access operation ACT). If the refresh address and the access address are the same, the main word line MWLX is selected again after being unselected once.

In the refresh operation REF (5th, 6th REF) of the last sub-word line SWL1 in each row block RBLK0-3, the main word line MWLX is unselected in synchronization with the completion of the refresh operation REF. When the main word line MWLX is unselected by performing the access operation ACT (7th, 8th REF), the main word line MWLX is selected only during the period of the refresh operation REF. The unselection of the main word line MWLX after the refresh operation is performed in each row block RBLK, so that the peak currents caused by charge/discharge of the main word lines MWLX can be dispersed.

As described above, in the first embodiment, in each row block RBLK, the main word line MWLX selected for the refresh operation is not unselected until the refresh operations of all of its corresponding sub-word lines SWL are completed or until the access request is received. Therefore, the frequency of unselection and selection of the main word lines MWLX can be lowered. In particular, since the main word line MWLX is connected to the sub-word decoders SWD arranged dispersedly in the memory core CORE, its wiring length is long. Therefore, the charge/discharge current generated by selection/unselection of the main word line MWLX is large. By lowering the frequency of selection/unselection of the main word lines MWLX by the present invention, the charge/discharge current of the main word lines MWLX can be reduced, thereby making it possible to reduce the current consumption of the pseudo SRAM. Further, the main word lines MWLX are selected/unselected in the respective row blocks RBLK, so that the peak currents caused by the charge/discharge of the main word lines MWLX can be dispersed.

By generating the reset signal RSTX common to the row blocks RBLK by the reset control circuit 18 and the reset signal generation circuit 20 and generating the block reset signal SRSTX by the block reset control circuit RSTC formed in each row block RBLK, the main word line MWLX selected in the row block RBLK accessed by the access request can be easily unselected by a simple circuit.

After the main word line MWLX for refresh is unselected, the main word line MWLX for access is selected, which can prevent multiple selection of the word lines SWL. As a result, the malfunction of the pseudo SRAM can be prevented. Moreover, it is unnecessary to designate the main word line MWLX to be unselected, so that a circuit to unselect the main word line MWLX can be simplified.

By generating the entry pulse signal ENTPX in synchronization with the start of the refresh operation, malfunction of the flip-flop 40 can be prevented, and the reset disable signal NORSTZ can be certainly activated or inactivated.

By masking the activation of the reset disable signal NORSTZ during the burst access, the reset control circuit 18 and the reset signal generation circuit 20 can be prevented from operating uselessly during the burst access. This can reduce power consumptions of these circuits and save the time to inactivate the reset disable signal NORSTZ.

By inactivating the reset disable signal NORSTZ during the selection period of the sub-word line SWL3 which is refreshed last out of the sub-word lines SWL0-3 connected to the main word line MWLX, that is, during the period when the bits IAL4-SZ (RA4-5Z) of the refresh address are both at the high level, the main word line MWLX which no longer needs to be selected can be unselected in synchronization with the completion of the refresh operation of the sub-word line SWL3. Accordingly, at the time of switching between the main word lines MWLX by updating the refresh address, two main word lines MWLX can be prevented from being unselected and selected simultaneously, which can simplify switching control of the main word line MWLX.

All the main word lines MWLX are unselected when the pseudo SRAM is powered on, so that by inactivating the reset disable signal NORSTZ in response to the clear signal CLRX, the multiple selection of the word lines SWL and the malfunction of the pseudo SRAM can be prevented.

By inactivating the main word line MWLX selected for refresh in synchronization with the redundancy hit signal RHITX outputted from the fuse circuit 34, also in the pseudo SRAM including the redundancy main word lines RMWLX, it is possible to hold the selection state of the main word line MWLX selected by the refresh operation and, at the time of access to the redundancy main word line RMLX, unselect the main word line MWLX corresponding thereto.

By assigning the refresh address IAL0-12Z in order from the lowest-order bit to the row block RBLK, the sub-word line SWL, and the main word line MWLX, the frequency of switching of the main word lines MWLX can be made lowest when the refresh operation is repeatedly performed, which can reduce the power consumption of the pseudo SRAM.

Figure 12:
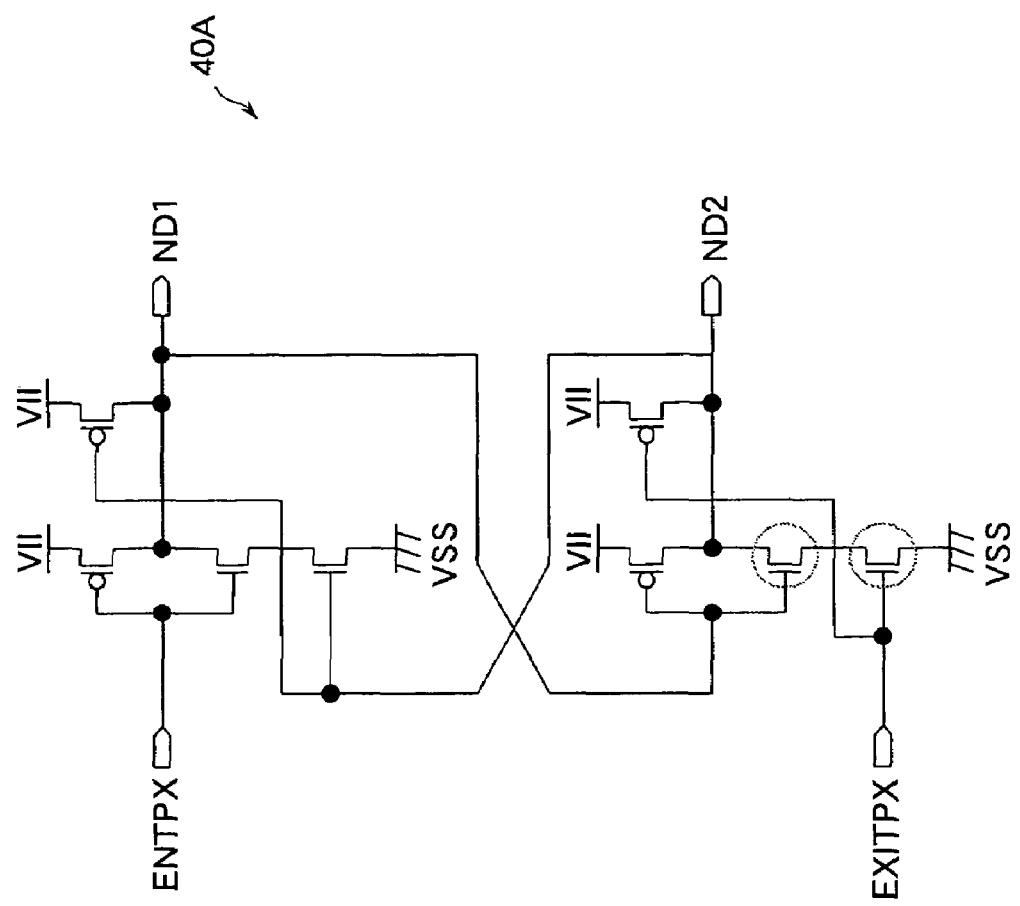
FIG. 12 is a circuit diagram showing a major portion of a second embodiment of the semiconductor memory of the present invention.

FIG. 12 shows a major portion of a second embodiment of the semiconductor memory of the present invention. The same reference symbols are used to designate the same elements as in the first embodiment, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. This embodiment includes a flip-flop 40A instead of the flip-flop 40 (FIG. 2) of the first embodiment. The other constitutions are the same as in the first embodiment.

In the flip-flop 40A, the threshold voltage of an nMOS transistor of a NAND gate which receives the exit pulse signal EXITPX is set lower than the threshold voltages of the other nMOS transistors. In other words, the threshold voltages of part of transistors in a signal path fed back from the entry pulse signal ENTPX to an input via the node ND2 are set lower than the threshold voltages of the other transistors. Hence, the flip-flop 40A can certainly change the node ND2 to a low level even when receiving the entry pulse signal ENTPX having a narrow pulse width (activation period). Namely, in this embodiment, it is possible to prevent the state of the flip-flop 40A from becoming unstable and certainly invert its output. In particular, as shown in FIG. 2, the entry pulse signal ENTPX is generated using plural signals WLSPX, CEX, REFZ, WLCHCTLZ having different timings. Out of these, the chip enable signal CEX and the internal refresh signal REFZ are generated asynchronously with each other, so that generation timings are sometimes displaced from each other. Therefore, the pulse width of the entry pulse signal ENTPX tends to change. Accordingly, by setting the threshold voltage low, the speed of the internal operation of the flip-flop 40A can be increased, and the malfunction of the flip-flop 40A can be prevented.

As described above, also in the second embodiment, the same effect as in the first embodiment can be obtained. Further, even when the pulse width of the entry pulse signal ENTPX is narrow, the reset disable signal NORSTZ can be certainly activated. Namely, even when the generation timings of the timing signals are displaced from each other due to a change in semiconductor manufacturing condition, the malfunction of the pseudo SRAM can be prevented.

Figure 13:
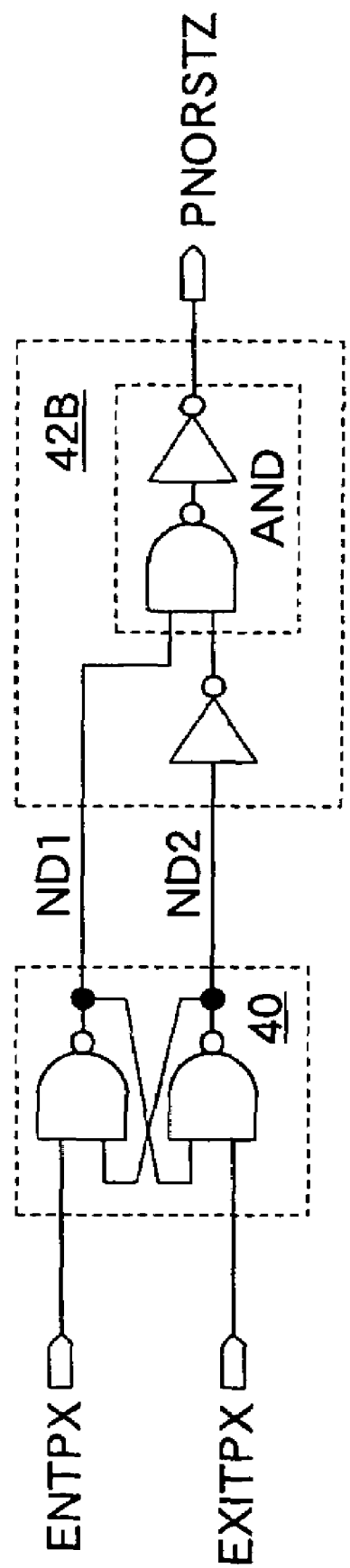
FIG. 13 is a circuit diagram showing a major portion of a third embodiment of the semiconductor memory of the present invention.

FIG. 13 shows a major portion of a third embodiment of the semiconductor memory of the present invention. The same reference symbols are used to designate the same elements as in the first embodiment, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. This embodiment includes a filter 42B instead of the filter 42 (FIG. 2) of the first embodiment. The other constitutions are the same as in the first embodiment.

The filter 42B includes an AND circuit which receives the node ND1 and the inverted logic of the node ND2. In this embodiment, three gates are in a signal path from the node ND2 to an output node of the pre-reset disable signal PNORSTZ, so that the filter effect is larger compared to the filter 42 of the first embodiment. Namely, even when the entry pulse signal ENTPX has plural thin pulses due to noise or the like, the activation of the pre-reset disable signal PNORSTZ can be prevented.

As described above, also in the third embodiment, the same effect as in the first embodiment can be obtained. Further, noise of the entry pulse signal ENTPX can be certainly removed, that is, the malfunction of the pseudo SRAM can be prevented.

Figure 14:
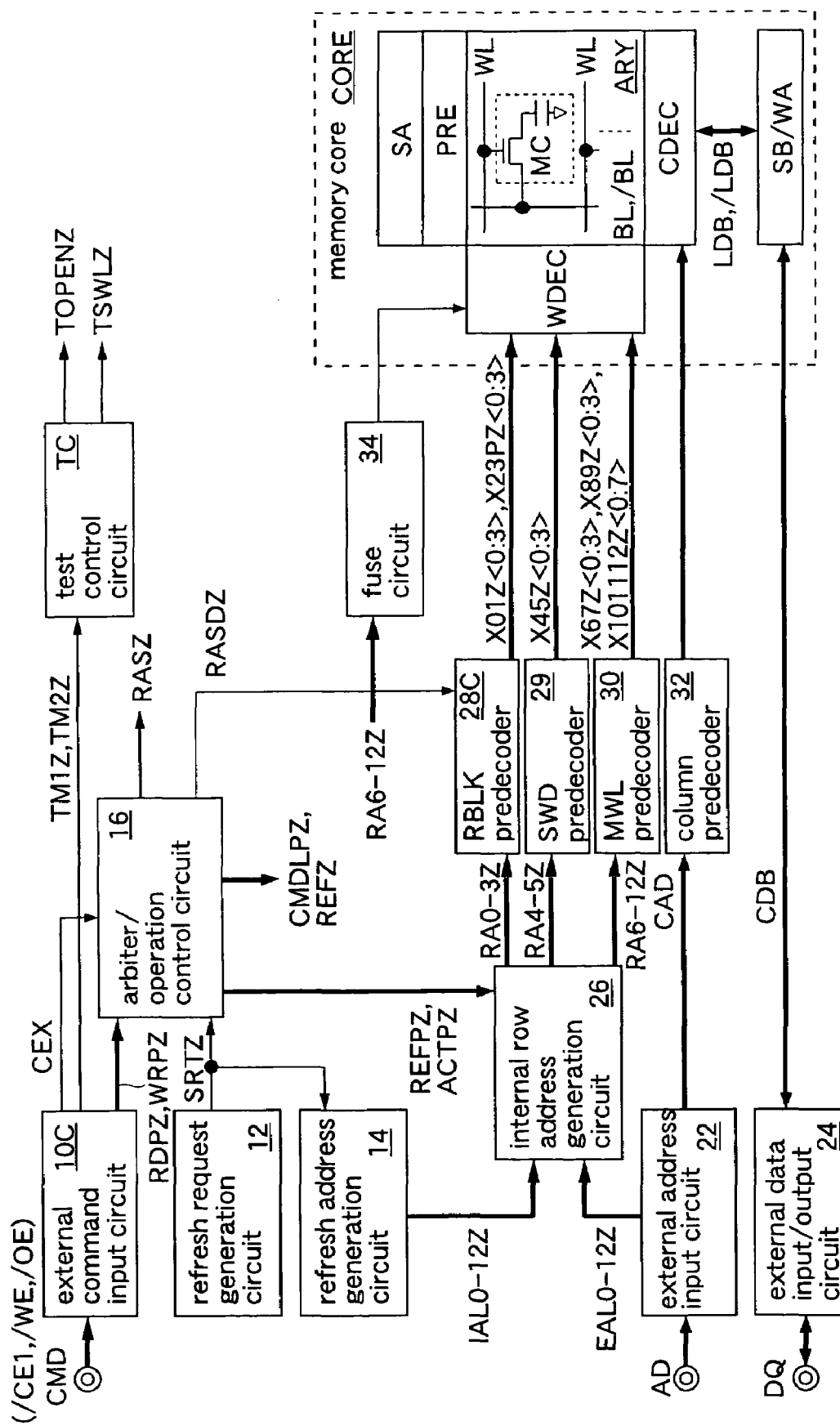
FIG. 14 is a block diagram showing a fourth embodiment of the semiconductor memory of the present invention.

FIG. 14 shows a fourth embodiment of the semiconductor memory of the present invention. The same reference symbols are used to designate the same elements as in the first embodiment, and a detailed description thereof is omitted. This semiconductor memory is formed as a pseudo SRAM on a silicon substrate using a CMOS process. The pseudo SRAM is used, for example, for a work memory mounted in portable equipment such as a mobile phone.

The pseudo SRAM includes an external command input circuit 10C, the refresh request generation circuit 12, the refresh address generation circuit 14, the arbiter/operation control circuit 16, the external address input circuit 22, the external data input/output circuit 24, the internal row address generation circuit 26, predecoders 28C, 30, 32, the fuse circuit 34, the memory core CORE, and a test control circuit TC (first and second test control circuits).

When receiving a test command at the command terminal CMD, the external command input circuit 10C activates either of test activation signals TM1Z, TM2Z according to the test command, and when receiving a test release command, it inactivates the test activation signals TM1Z, TM2Z. The pseudo SRAM shifts from a normal operation mode to a test mode when the test command is received, and shifts from the test mode to the normal operation mode when the test release command is received. The other functions of the external command input circuit 10C are the same as those of the external command input circuit 10 of the first embodiment.

The predecoder 28C differs from the predecoder 28 of the first embodiment in that it generates a pulsed predecode signal X23PZ<0:3>. Moreover, the word decoder WDEC differs from that of the first embodiment. The test control circuit TC activates a first test signal TOPENZ and a second test signal TSWLZ in response to the activation of the test activation signals TM1Z, TM2Z, respectively. The other constitutions are the same as in the first embodiment.

Figure 15:
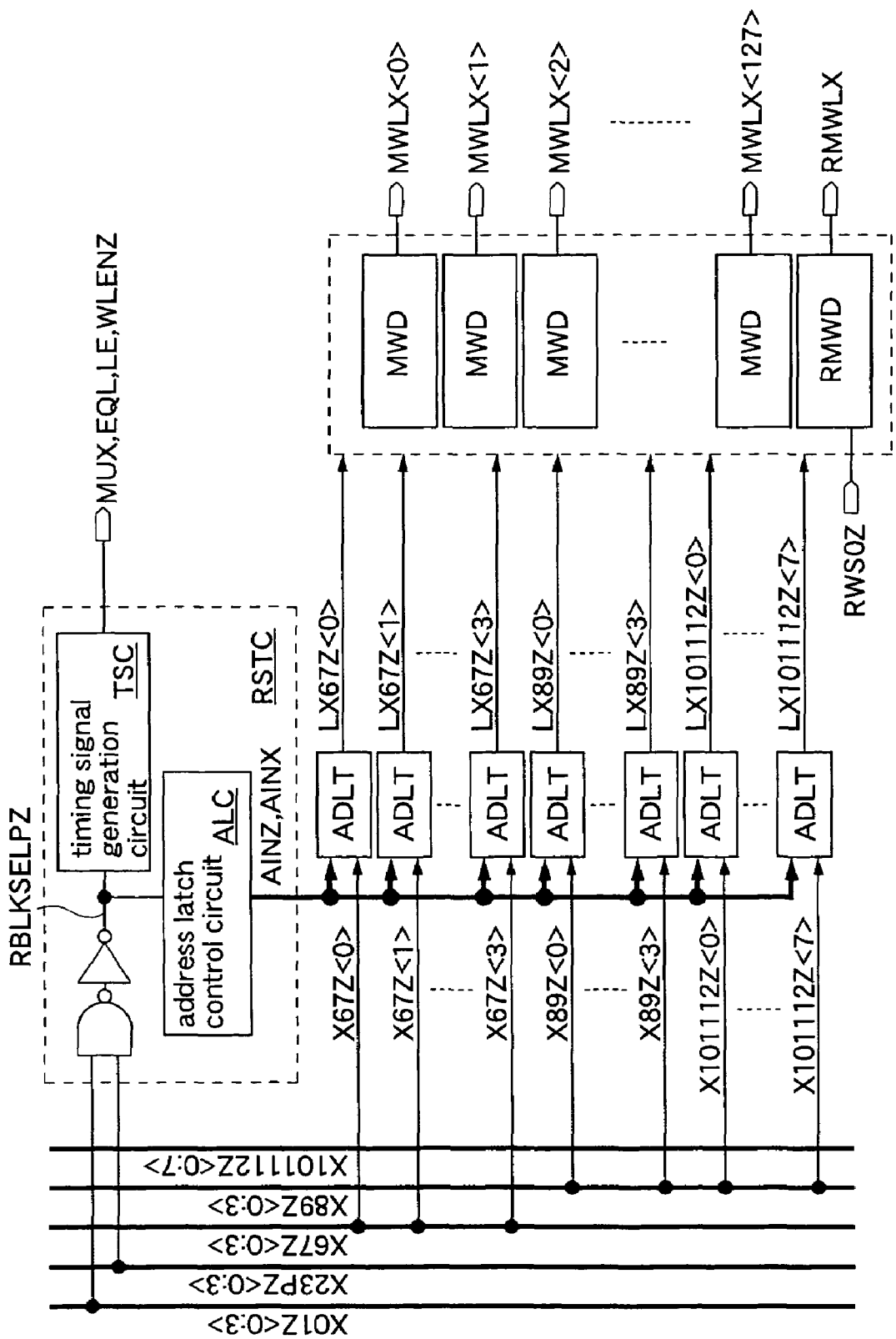
FIG. 15 is a block diagram showing details of a word decoder shown in FIG. 14.

FIG. 15 shows details of the word decoder WDEC shown in FIG. 14. This word decoder differs from the word decoder WDEC (FIG. 5) of the first embodiment in that this word decoder does not receive the reset signal RSTX, the block reset control circuit RSTC includes an address latch control circuit ALC which outputs address latch signals AINZ, AINX instead of the circuit which outputs the block reset signal SRSTX, this word decoder includes address latch circuits ADLT which latch predecode signals X67Z<0:3>, X89Z<0:3>, X101112Z<0:7>, and the main word decoder MWD and the redundancy main word decoder RMWD are different. The other constitutions are the same as in the first embodiment. Incidentally, a row block selection signal RBLKSELPZ has a pulse shape synchronous with the pulsed predecode signal X23PZ<0:3>.

The address latch control circuit ALC generates the address latch signals AINZ, AINX in synchronization with the pulsed row block selection signal RBLKSELPZ. The address latch signals AINZ, AINX are signals complementary to each other. When the address latch signal AINZ is at a high level, the address latch circuits ADLT output it as latch decode signals LX67Z, LX89Z, LX101112Z to the main word decoders MWD through the predecode signals X67Z, X89Z, X101112Z and latch the predecode signals X67Z, X89Z, X101112Z in synchronization with the change of the address latch signal AINZ to a low level. The main word decoders MWD select the main word lines MWLX using the latch decode signals LX67Z, LX89Z, LX101112Z.

Figure 16:
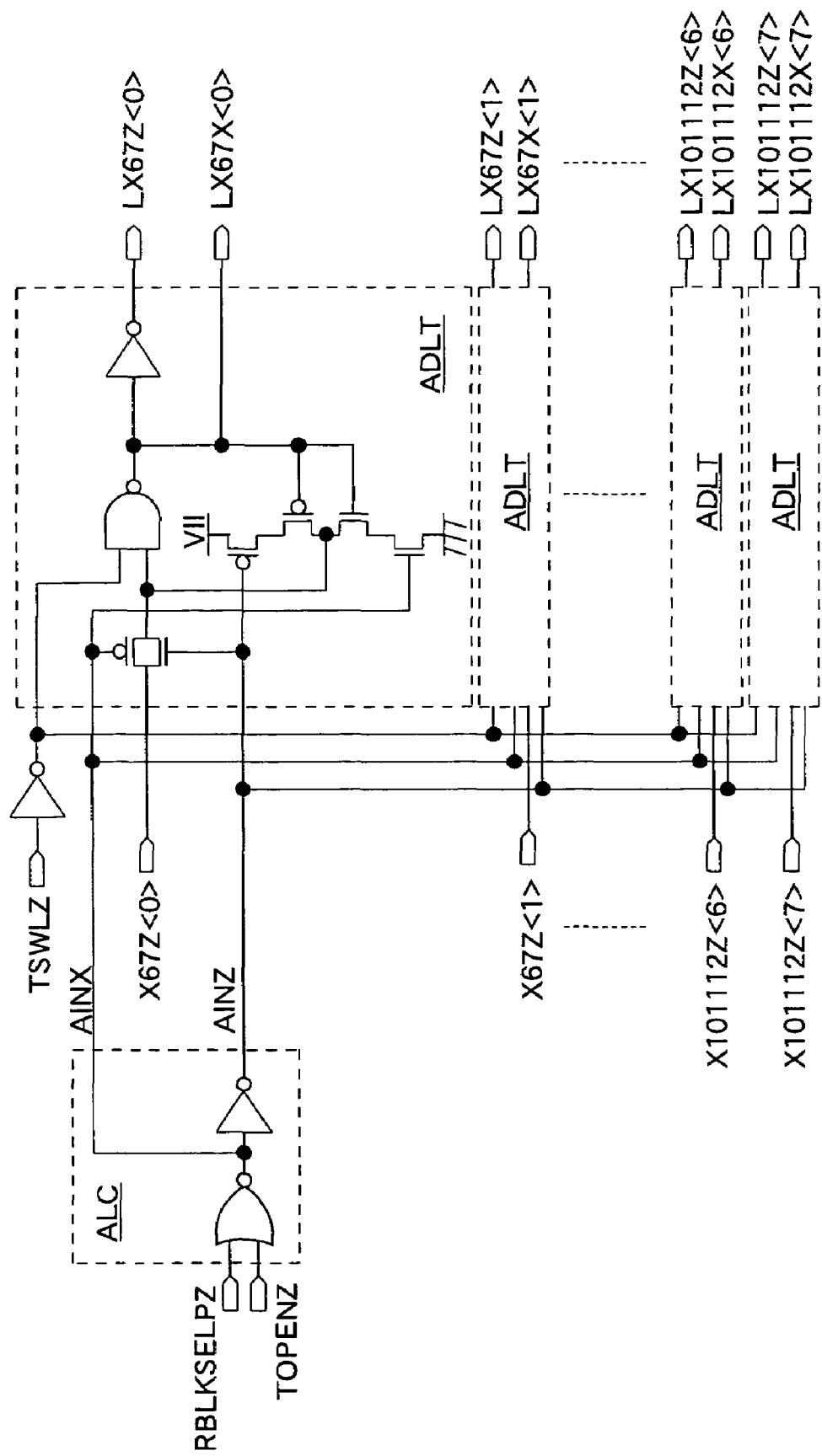
FIG. 16 is a circuit diagram showing details of an address latch control circuit and an address latch circuit.

FIG. 16 shows details of the address latch control circuit ALC and the address latch circuit ADLT. The address latch control circuit ALC outputs the low-level address latch signal AINX and the high-level address latch signal AINZ while the row block selection signal RBLKSELPZ or the first test signal TOPENZ is at a high level. The first test signal TOPENZ is a signal common to the address latch control circuits ALC of the row blocks RBLK0-15. The first test signal TOPENZ is activated when the main word lines MWLX of plural row blocks RBLK are selected simultaneously to carry out a multiple selection test or a disturb test of word lines in the test mode. For example, in the disturb test, the word line MWLX, SWL adjacent to the target word line MWL, SWL is selected, and the influence on the target word line MWLX, SWL is studied. The first test signal TOPENZ is fixed to a low level in the normal operation mode.

The address latch circuit ADLT includes a CMOS transmission gate which is turned on when the address latch signal AINZ is at the high level to transmit the predecode signal (X67Z<0> or the like), a latch which is connected to an output of the CMOS transmission gate, and an AND circuit whose one input is connected to an output of the latch and which outputs the latch decode signal (LX67X<0> or the like). The latch is activated and holds the received predecode signal while the address latch signal AINZ is at the low level. The AND circuit outputs the positive logic latch decode signal (LX67Z<0> or the like).

The other input of the AND circuit receives the second test signal TSWLZ via an inverter. The second test signal TSWLZ is a signal common to the address latch circuits ADLT and all the main word decoders MWD of all the row blocks RBLK0-15. The second test signal TSWLZ is activated when all the main word lines MWLX are selected to efficiently perform a burn-in test mode in the test mode. The second test signal TSWLZ is fixed to a low level in the normal operation mode.

Figure 17:
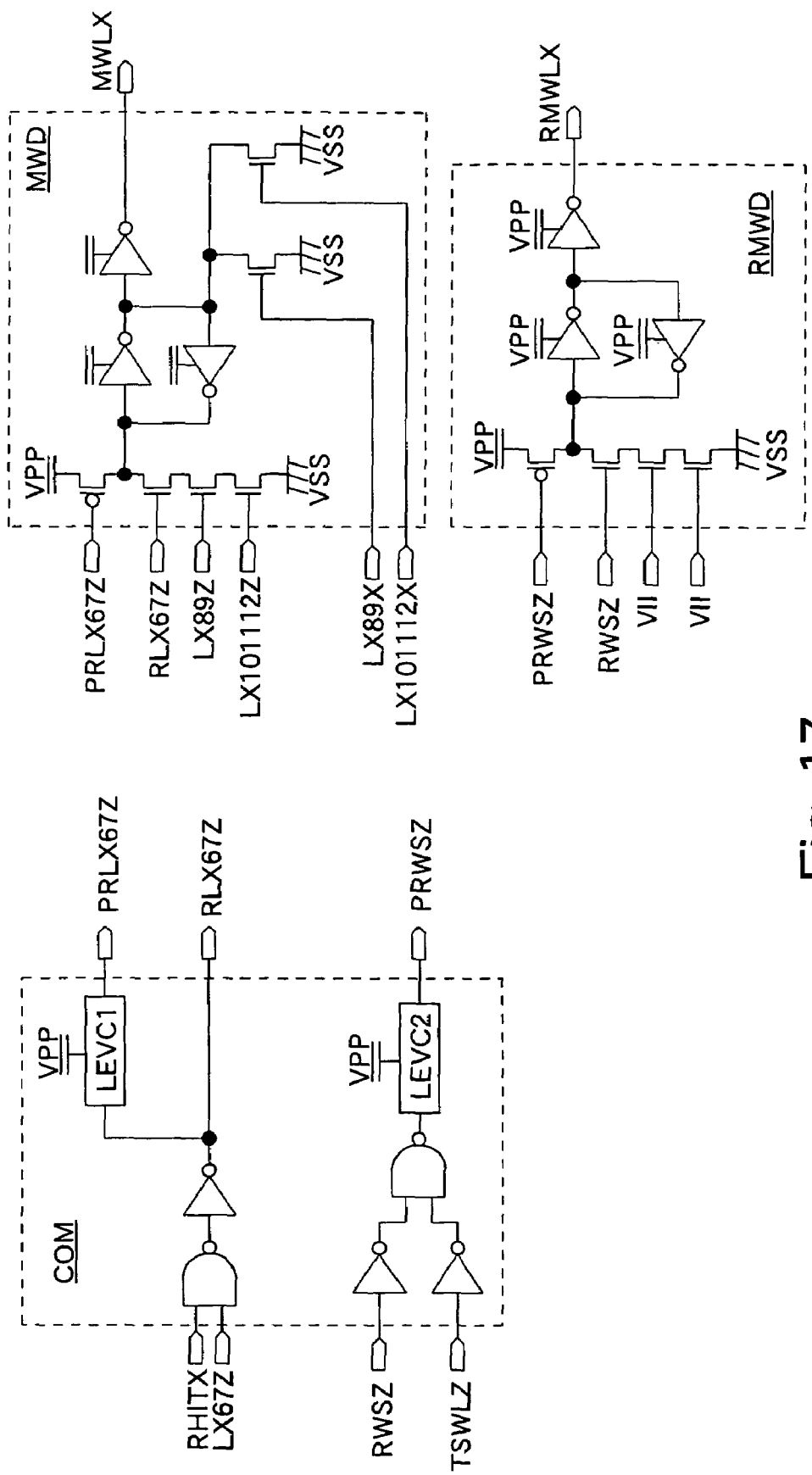
FIG. 17 is a circuit diagram showing details of a main word decoder and a redundancy main word decoder.

FIG. 17 shows details of the main word decoder MWD and the redundancy main word decoder RMWD. In this figure, the latch decode signals LX67Z, LX89Z, LX101112Z show any of the latch decode signals LX67Z<0:3>, LX89Z<0:3>, LX101112Z<0:7>, respectively. The common circuit COM is a circuit common to the main word decoders MWD, RMWD. The common circuit COM includes the level converter LEVC1 for the main word decoder MWD and the level converter LEVC2 for the redundancy main word decoder RMWD.

The level converter LEVC1 converts the high level of the latch decode signal LX67Z from the internal supply voltage VII to the boost voltage VPP to generate a latch decode signal PRLX67Z during the inactivation of the redundancy hit signal RHITX. The level converter LEVC1 fixes the latch decode signal PRLX67Z to a low level to select all the main word lines MWLX during the activation of the redundancy hit signal RHITX. The latch decode signal RLX67Z is generated according to the latch signal LX67Z during the inactivation of the redundancy hit signal RHITX. The level converter LEVC2 converts the high level of the redundancy selection signal RWSZ (any of RWS0Z-RWS15Z shown in FIG. 3) or the second test signal TSWLZ from the internal supply voltage VII to the boost voltage VPP and outputs it as the redundancy selection signal PRWSZ.

The main word decoder MWD includes a pMOS transistor which receives the latch decode signal PRLX67Z at its gate, nMOS transistors which receive the latch decode signals RLX67Z, LX89Z, LX101112Z at their gates, respectively, a latch connected to a drain of the pMOS transistor, and a reset circuit composed of nMOS transistors which are connected to an output of the latch and receive the latch decode signals LX89Z, LX101112Z at their gates, respectively. The pMOS transistor and the nMOS transistors which receive the latch decode signals PRLX67Z, RLX67Z, LX89Z, LX101112Z, respectively, are connected in series between the boost voltage supply line VPP and the ground line VSS. The output of the latch is connected to the main word line MWLX via an inverter. When the reset circuit (nMOS transistors) is turned on, the main word line MWDX is unselected.

The redundancy main word decoder RMWD is the same circuit as that of the first embodiment (FIG. 6). Therefore, the defect relief is performed for each main word line MWLX. A pMOS transistor of the redundancy main word decoder RMWD receives the redundancy selection signal PRWSZ at its gate. nMOS transistors of the redundancy main word decoder RMWD receive the redundancy selection signal RWSZ and the internal supply voltage VII at their gates. In the main word decoders MWD, RMWD shown, only the latch decode signal PRLX67Z and the redundancy selection signal PRWSZ are signals which use the boost voltage VPP as their high level. By minimizing the number of signals which use the boost voltage VPP, the power consumption of a boost circuit which generates the boost voltage VPP can be reduced. As a result, particularly, the standby current of the pseudo SRAM can be reduced.

Figure 18:
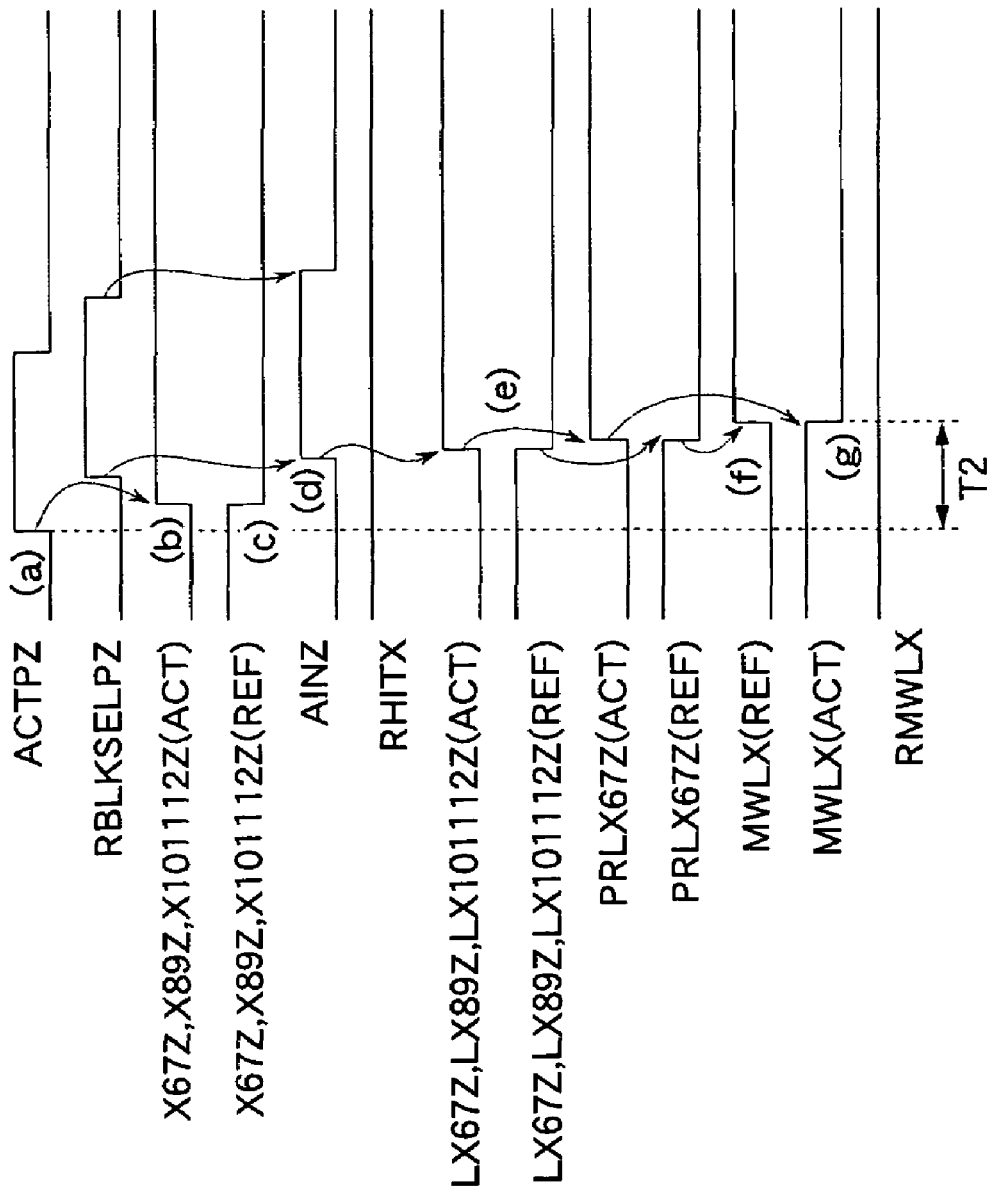
FIG. 18 is a timing chart showing the operations of the main word decoders and the redundancy main word decoder when the read operation or the write operation is performed in the fourth embodiment.

FIG. 18 shows the operations of the main word decoders MWD and the redundancy main word decoder RMWD when the read operation or the write operation is performed in the fourth embodiment. A detailed description of the same operation as in FIG. 7 is omitted. This example shows a case where there is no defect in the main word lines MWLX, the memory cells, or the like, and the redundancy hit signal RHITX is not activated.

First, the access signal ACTPZ is activated in response to the access command (read command or write command) (FIG. 18(a)). In synchronization with the activation of the access signal ACTPZ, the predecode signals X67Z, X89Z, X101112Z of an access object (ACT) are activated (FIG. 18(b)). Simultaneously, the row address RA0-12Z (internal address IAL0-12Z) held in the internal row address generation circuit 26 for the refresh operation is switched, so that the predecode signals X67Z, X89Z, X101112Z of a refresh object (REF) are inactivated (FIG. 18(c)).

In the row block RBLK where the access operation is performed, the row block selection signal RBLKSELPZ is activated, and in synchronization with the row block selection signal RBLKSELPZ, the address latch signal AINZ is activated (FIG. 18(d)). The address latch circuit ADLT of the row block RBLK where the access operation is performed latches the predecode signals X67Z, X89Z, X101112Z and outputs them as the latch decode signals LX67Z, LX89Z, LX101112Z (FIG. 18(e)). Since in the row block RBLK where the access operation is performed, the latch decode signals LX67Z, LX89Z, LX101112Z, PRLX67Z activated to perform refresh are inactivated, the main word line MWLX which continues to be selected to perform the refresh operation is unselected (FIG. 18(f)). Simultaneously, the latch decode signals LX67Z, LX89Z, LX101112Z, PRLX67Z of the access object (ACT) are activated, and the main word line MWLX to perform the access operation is selected (FIG. 18(g)). The unselection/selection of the main word lines MWLX are performed simultaneously, so that the time from the activation of the access signal ACTPZ to the selection of the main word line MWLX becomes T2 which is shorter than T1 in the first embodiment.

In the row block RBLK where the access operation is not performed, the row block selection signal RBLKSELPZ is not activated, and the address latch signals AINZ, AINX are not outputted, so that the address latch circuits ADLT continue to activate the latch decode signals LX67Z, LX89X, LX101112Z to perform refresh. Namely, the unselection of the main word line MWLX as the refresh object is performed only in the row block RBLK which has received the access request.

Figure 19:
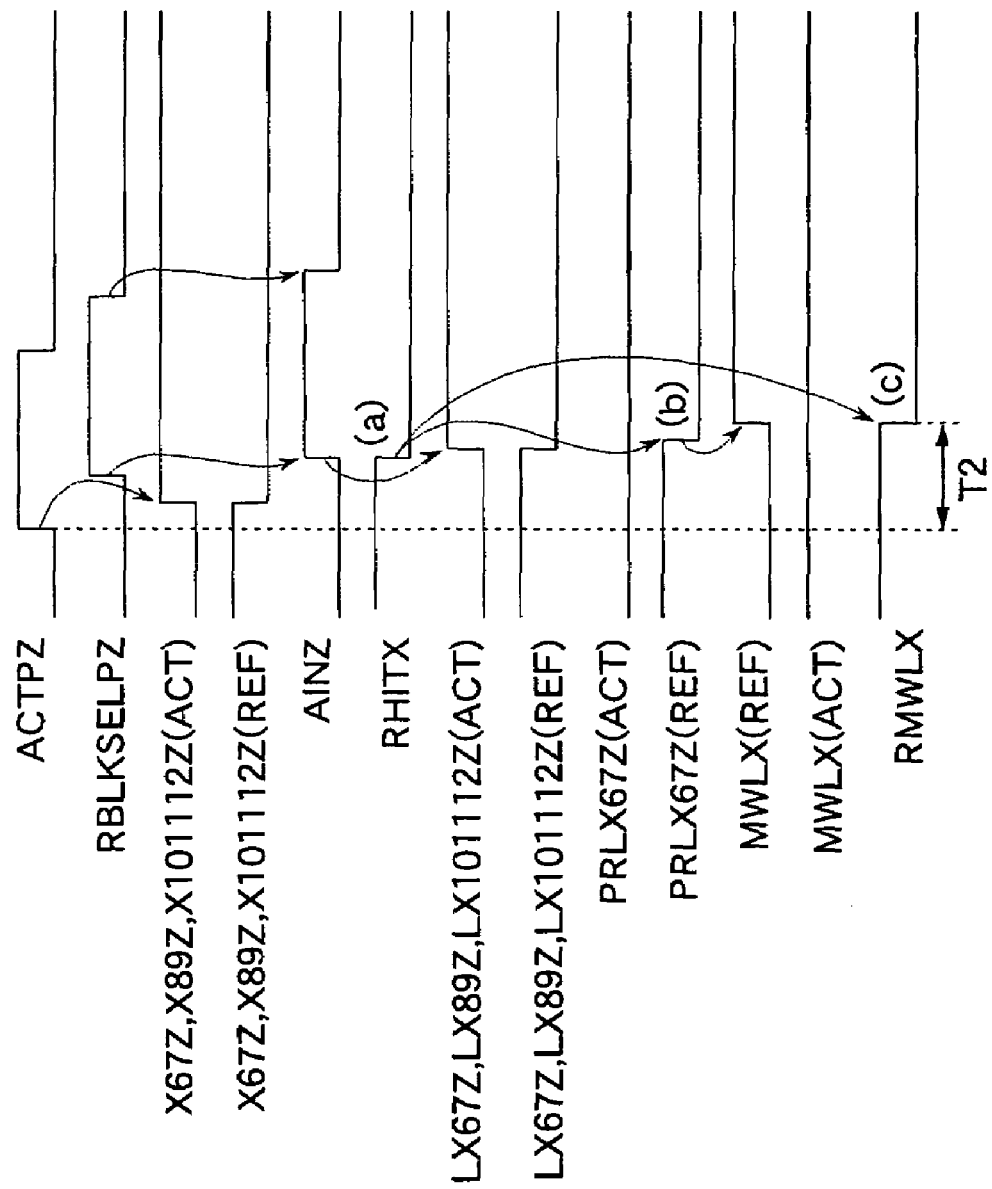
FIG. 19 is a timing chart showing another example of the operations of the main word decoders and the redundancy main word decoder when the read operation or the write operation is performed in the fourth embodiment.

FIG. 19 shows another example of the operations of the main word decoders MWD and the redundancy main word decoder RMWD when the read operation or the write operation is performed. This example shows a case where there is a defect in the main word line MWLX, the memory cell, or the like, and the redundancy hit signal RHITX is activated. A detailed description of the same operations as in FIG. 18 is omitted.

In this example, upon receiving the row address RA6-12Z, the fuse circuit 34 activates the redundancy hit signal RHITX (FIG. 19(a)). By the activation of the redundancy hit signal RHITX, the latch decode signal PRLX67Z activated for the refresh operation is inactivated (FIG. 19(b)). Simultaneously, the redundancy selection signal RWSZ (not shown) is activated, and the redundancy main word line RMWLX is selected (FIG. 19(c)). Also in this example, the unselection and selection of the main word lines MWLX, RMWLX are performed simultaneously, so that the time from the activation of the access signal ACTPZ to the selection of the redundancy main word line RMWLX becomes T2 which is shorter than T1 in the first embodiment.

In the row block RBLK where the access operation is not performed, the address latch signals AINZ, AINX and the redundancy hit signal RHITX are not outputted as in FIG. 18, so that the address latch circuits ADLT continue to activate the latch decode signals LX67Z, X89Z, LX101112Z to perform refresh. Namely, the unselection of the main word line MWLX as the refresh object is performed only in the row block RBLK which has received the access request.

Figure 20:
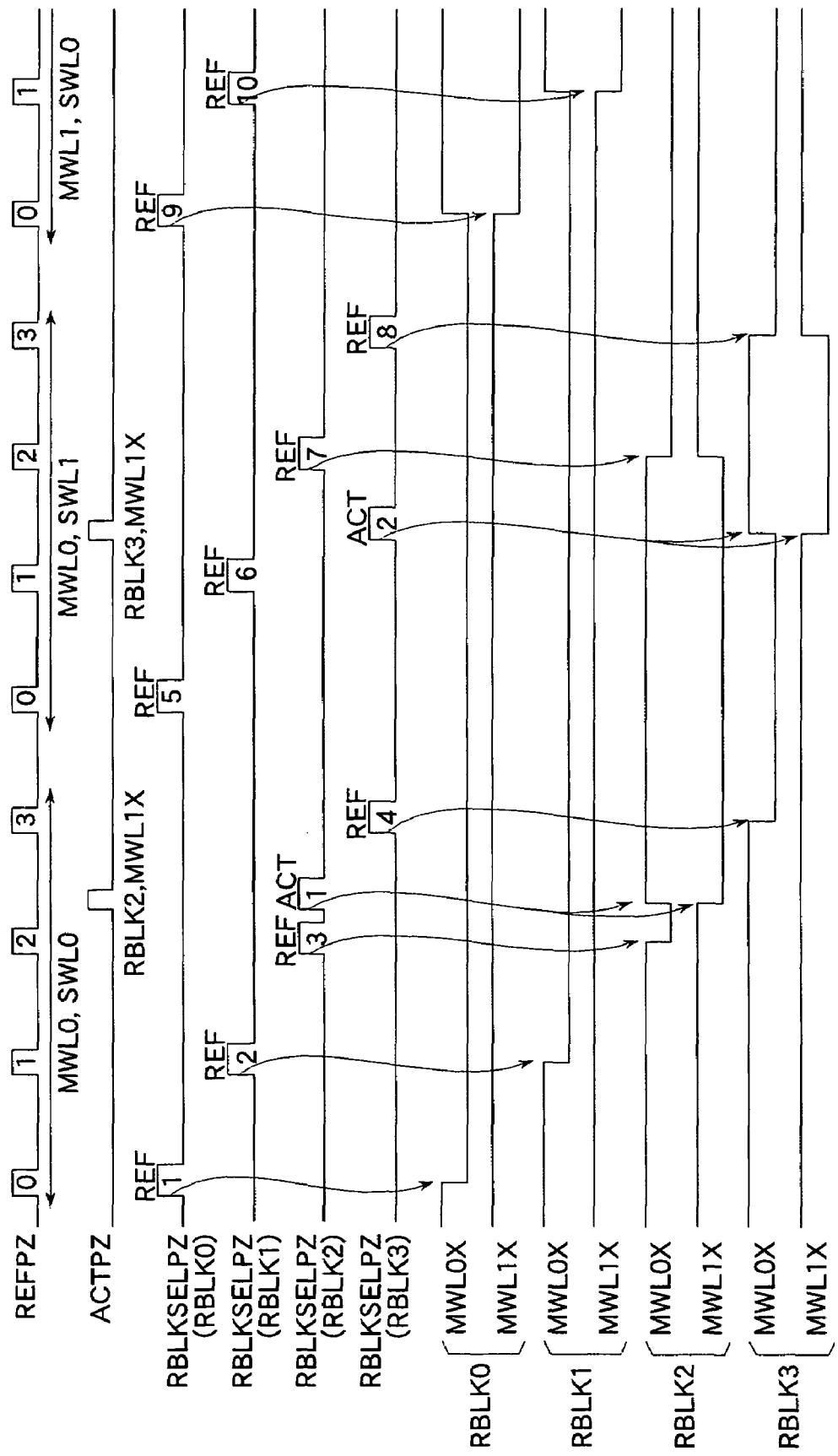
FIG. 20 is a timing chart showing the operation of a memory core in the fourth embodiment.

FIG. 20 shows the operation of the memory core CORE in the fourth embodiment. A detailed description of the same operations as in FIG. 11 is omitted. For ease of explanation, as in the first embodiment (FIG. 11), an example in which the memory core CORE includes four row blocks RBLK0-3 and two sub-word lines SWL0-1 is shown. The number given to the refresh signal REFPZ denotes the number of the row block RBLK where the refresh operation REF is performed.

This embodiment differs from the first embodiment in the following points. First, the unselection of the main word line MWLX selected for the refresh operation and the selection of the main word line MWLX for the access operation are performed simultaneously. In each row block RBLK, the main word line MWLX continues to be selected until the next operation is performed regardless of whether the refresh operation or the access operation. Even after the refresh operation REF of the last sub-word line SWL1 (in actuality, SWL3), the main word line MWLX continues to be selected.

As described above, also in the fourth embodiment, the same effect as in the first embodiment can be obtained. Moreover, by forming the address latch circuits ADLT corresponding to the decode signals X67Z<0:3>, X89Z<0:3>, X011112Z<0:7> to select the main word decoders MWD, respectively, the main word lines MWLX can be selected or unselected according to the latch decode signals LX67Z, LX89Z, LX101112Z held in the address latch circuits ADLT. Accordingly, the states of the address latch circuits ADLT change according to the external address EAL supplied corresponding to the access request, and thereby the main word line MWLX selected for refresh can be unselected and simultaneously the main word line MWLX for access can be selected. Consequently, the circuits to generate the reset disable signal NORSTZ, the reset signal RSTX, and the block reset signal SRSTX become unnecessary. Namely, after the refresh operation, the selection state of the main word line MWLX can be held, and the main word line MWLX to be selected in response to the access request can be switched in each memory block by a simple logic circuit. Since the circuit configuration becomes simple, the operation verification time at the time of circuit design can be reduced. The unselection/selection of two main word lines MWLX can be switched simultaneously, which can reduce the time T2 from the access request to the start of the access operation. Namely, the access time can be reduced.

By activating the first test signal TOPENZ common to the address latch control circuits ALC during the test mode and generating the address latch signals AINZ, AINX in synchronization with the activation of the first test signal TOPENZ, the address latch circuits ADLT of the respective row blocks RBLK can be operated simultaneously. As a result, the multiple selection test and the disturb test of the word lines SWL can be carried out.

By activating the second test signal TSWLZ common to the main word decoders MWD during the test mode, all the main word lines MWLX can be selected simultaneously in synchronization with the activation of the second test signal TSWLZ. As a result, the test time of the burn-in test can be reduced.

Figure 21:
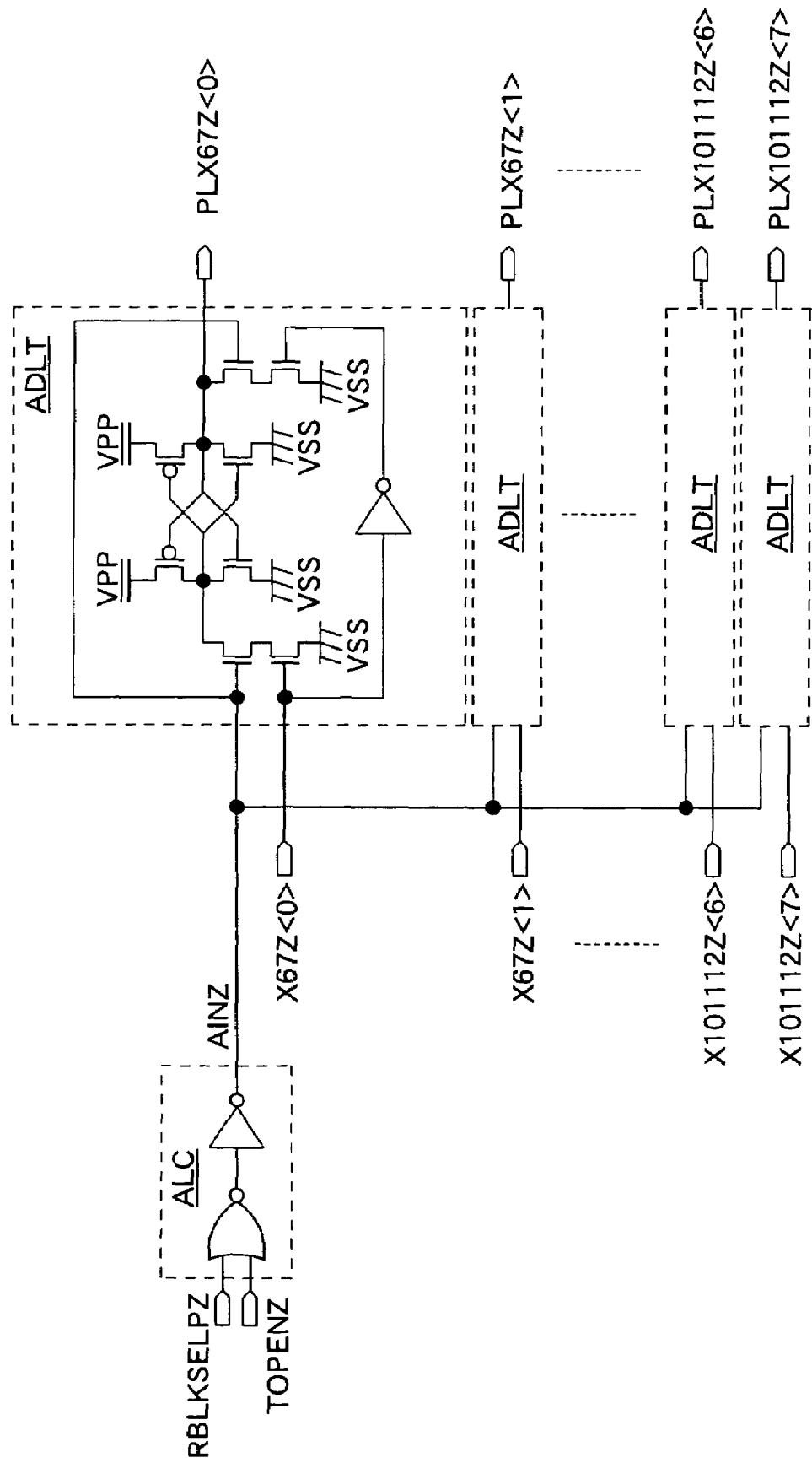
FIG. 21 is a circuit diagram showing a major portion of a fifth embodiment of the semiconductor memory of the present invention.
Figure 22:
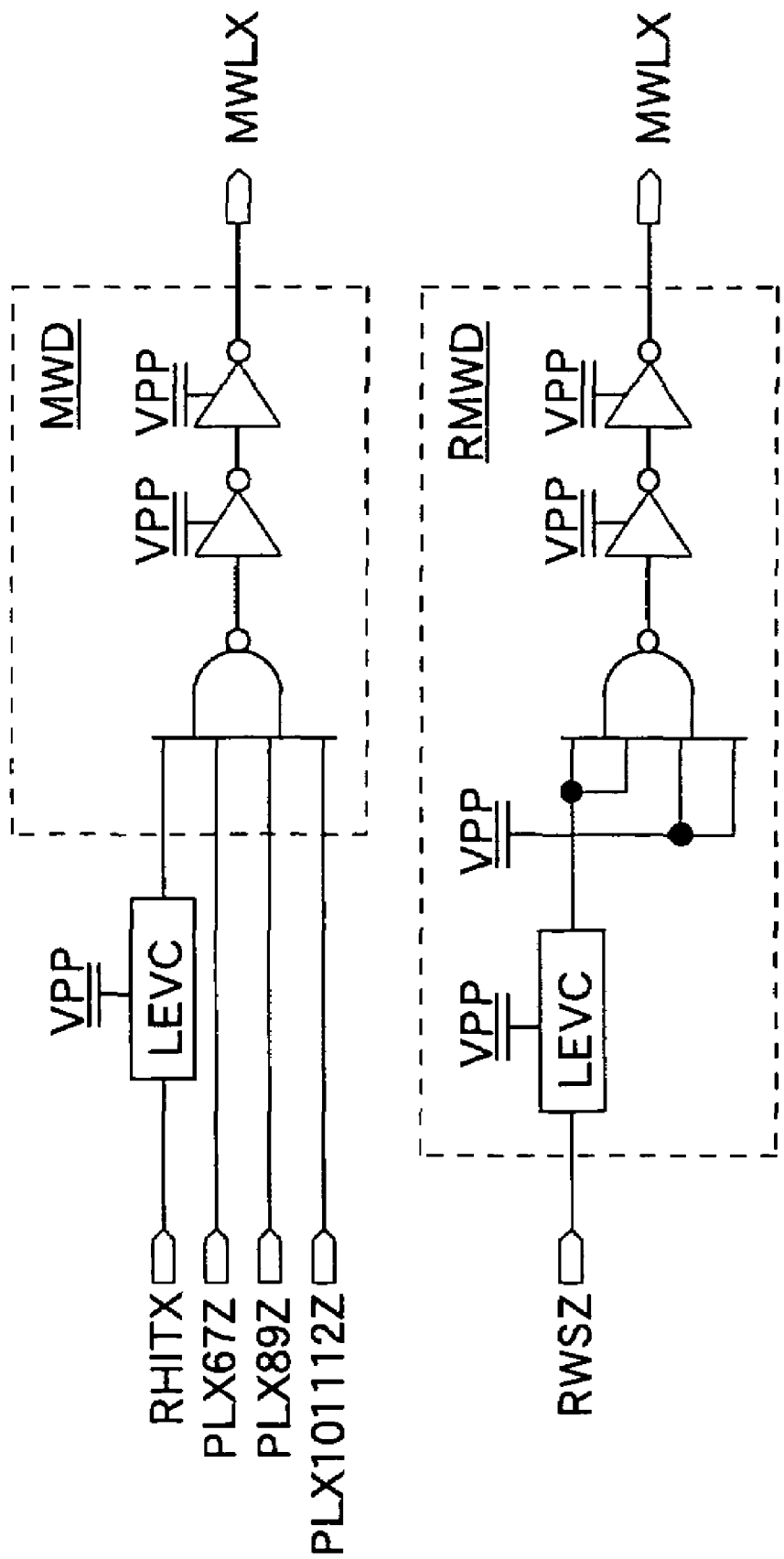
FIG. 22 is a circuit diagram showing a major portion of the fifth embodiment of the semiconductor memory of the present invention.

FIG. 21 and FIG. 22 show major portions of a fifth embodiment of the semiconductor memory of the present invention. The same reference symbols are used to designate the same elements as in the first and fourth embodiments, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. This embodiment differs from the fourth embodiment in the address latch circuit ADLT, the main word decoder MWD, and the redundancy main word decoder RMWD. The other constitutions are the same as in the first embodiment. The operations of the main word decoder MWD and the redundancy main word decoder RMWD and the operation of the memory core CORE are the same as in the fourth embodiment (FIG. 18-FIG. 20).

In FIG. 21, the address latch circuit ADLT is a differential input type of latch which receives the predecode signal X67Z<0> or the like) when the address latch signal AINZ is at a high level and holds the received signal when the address latch signal AINZ is at a low level. The received predecode signal is outputted as the latch decode signal (PLX67Z<0> or the like). The address latch circuit ADLT includes a level shifter which converts the high level of the received predecode signal from the internal supply voltage VII to the boost voltage VPP. Namely, the high levels of all the latch decode signals outputted from the address latch circuits ADLT are set to the boost voltage VPP.

In FIG. 22, the main word decoder MWD is constituted by connecting a 4-input NAND gate which receives the latch decode signals PLX67Z, PLX89Z, PLX101112Z whose high levels are set to the boost voltage VPP and the redundancy hit signal RHITX whose high level is converted to the boost voltage VPP by a level converter LEVC and two inverters in series. The final stage inverter is connected to the main word line MWLX. The redundancy main word decoder RMWD is the same circuit as the main word decoder MWD. A 4-input NAND gate of the redundancy main word decoder RMWD receives the boost voltage VPP and the redundancy selection signal RWSZ whose high level is converted to the boost voltage VPP by the level converter LEVC. The final stage inverter is connected to the redundancy main word line RMWLX.

In this embodiment, the high-level voltages of all the latch decode signals (PLX67Z and so on) are set to the boost voltage VPP, so that the main word decoder MWD and the redundancy main word decoder RMWD can be each constituted of a simple logic gate. In particular, as for the circuit of the main word decoder MWD, since many word decoders MWD are formed in the memory CORE, the effect of reduction in chip size produced by simplifying the circuit of the word decoder MWD is large.

As described above, also in the fifth embodiment, the same effects as in the first and fourth embodiments can be obtained. Further, by forming the level shifters in the address latch circuits ADLT, all the address voltages (high-level voltages) supplied to the main word decoders MWD and the redundancy main word decoder RMWD can be set to the same value. Consequently, the main word decoder MWD and the redundancy main word decoder RMWD can be simply constituted, whereby the chip size of the pseudo SRAM can be reduced. As a result, the chip cost can be reduced.

Figure 23:
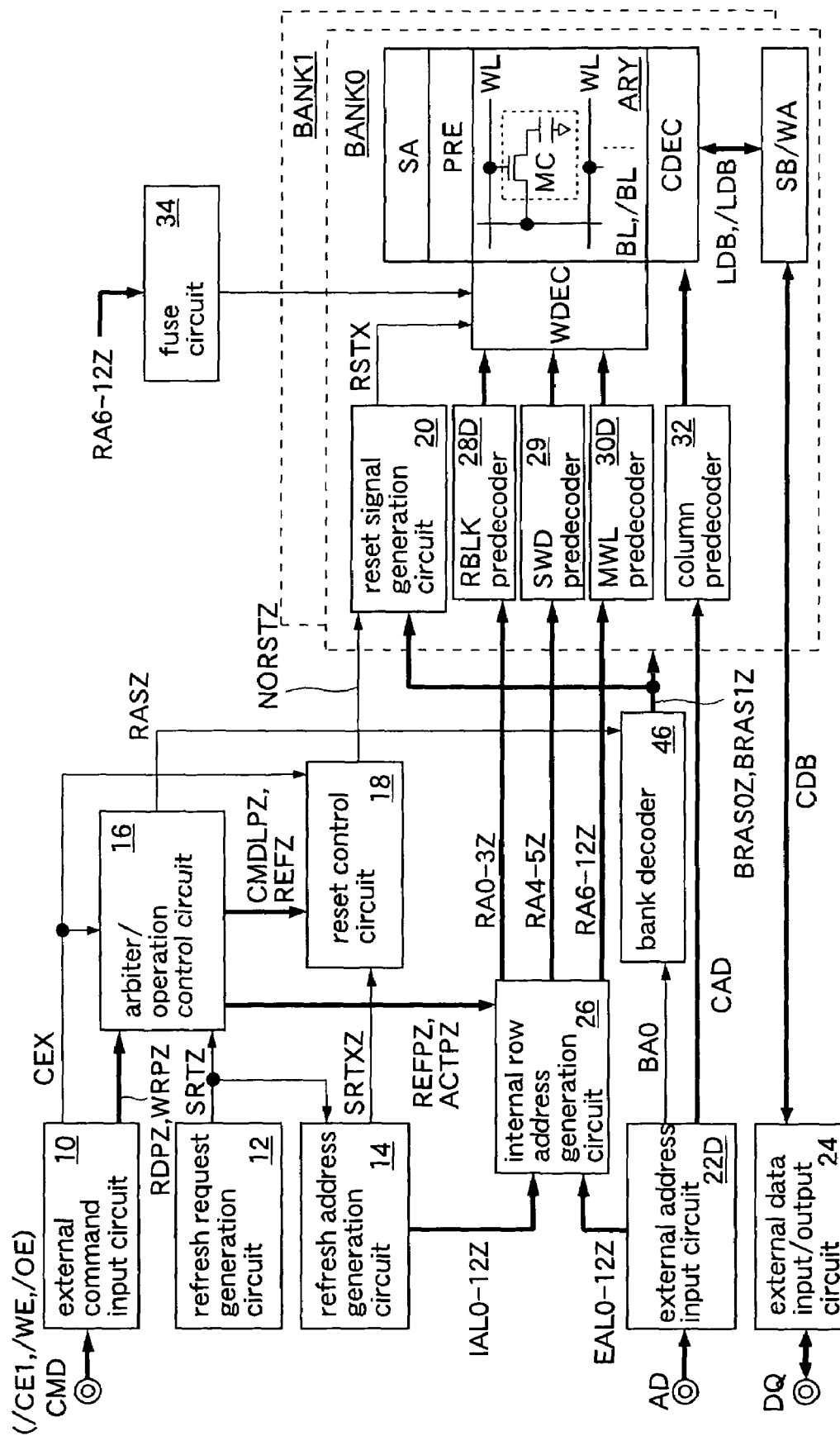
FIG. 23 is a block diagram showing a sixth embodiment of the semiconductor memory of the present invention.

FIG. 23 shows a sixth embodiment of the semiconductor memory of the present invention. The same reference symbols are used to designate the same elements as in the first embodiment, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. The pseudo SRAM of this embodiment includes two banks BANK0-1 including memory cores CORE which operate independently of each other and a bank decoder 46 to select from the banks BANK0-1.

An external address input circuit 22D is configured by adding an input buffer which receives a 1-bit bank address BA0 to the external address input circuit 22 of the first embodiment. The bank decoder 46 generates bank selection signals BRAS0Z, BRAS1Z from the bank address BA0 in synchronization with the basic timing signal RASZ. Each bank BANK0-1 includes the reset signal generation circuit (reset disable control circuit) 20, a predecoder 28D to select the row block RBLK, a predecoder 30D to select the main word line MWLX, the predecoder 32, and the memory core CORE of the first embodiment. The reset signal generation circuit 20 operates upon receiving the bank selection signal BRAS0Z (or BRAS1Z) instead of the basic timing signal RASZ. Namely, by the reset signal generation circuit formed in each bank BANK0-1, only the bank BANK which has received the access request activates the reset signal RSTX in response to the inactivation of the reset disable signal NORSTZ. The predecoders 28D, 30D are the same as the predecoders 28, 30 of the first embodiment except that they each include a latch function. The other constitutions are the same as in the first embodiment.

Figure 24:
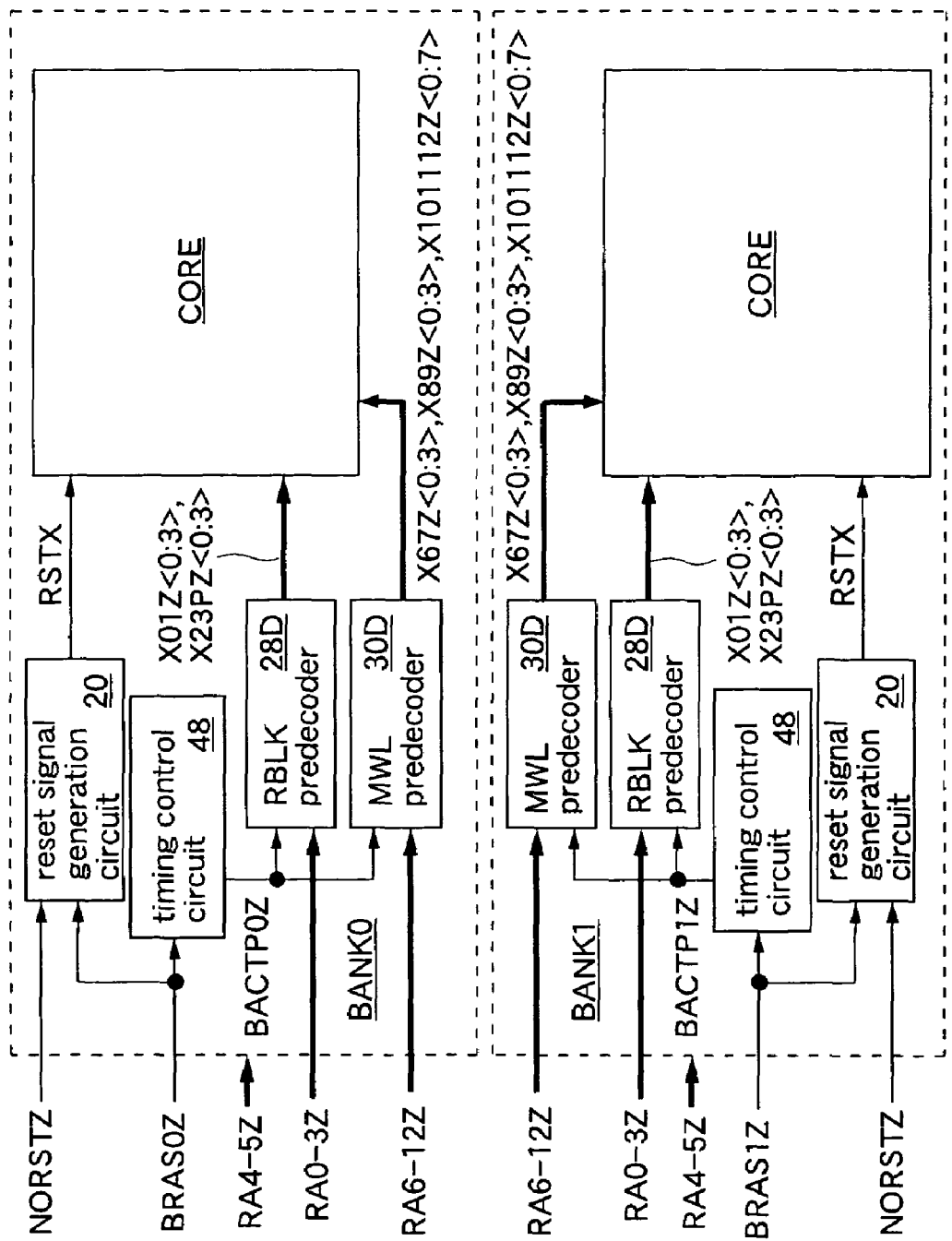
FIG. 24 is a block diagram showing details of banks shown in FIG. 23.

FIG. 24 shows details of the banks BANK0-1 shown in FIG. 23. Each bank BANK0-1 includes a timing control circuit 48. Since the banks BANK0-1 have the same constitution, only a description of the bank BANK0 will be given. The timing control circuit 48 activates a bank active signal BACTP0Z for a predetermined period in synchronization with the rising edge of the bank selection signal BRAS0Z. The predecoders 28D, 30D receive the row addresses RA0-3Z, RA6-12Z during a high-level period of the bank active signal BACTP0Z, and latch the received signals in synchronization with the falling edge of the bank active signal BACTP0Z.

Figure 25:
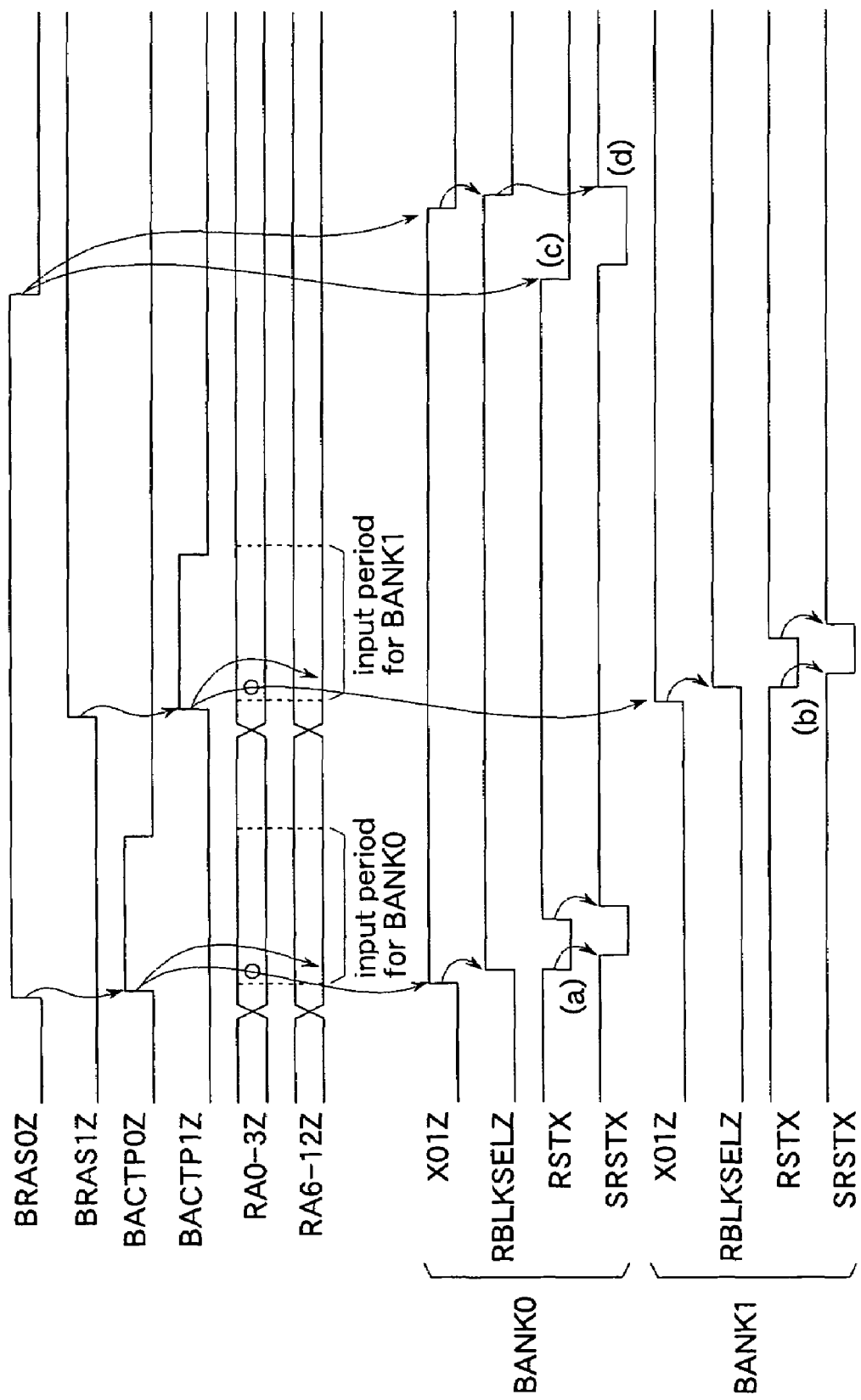
FIG. 25 is a timing chart showing the operation of a pseudo SRAM of the sixth embodiment.

FIG. 25 shows the operation of the pseudo SRAM of the sixth embodiment. This embodiment is characterized in that the reset signal RSTX is generated only in the bank which has received the access request. Accordingly, the unselection of the main word line MWLX which continues to be selected for the refresh request is performed in synchronization with the activation of the block reset signal SRSTX only in the row block RBLK which has received the access request (FIG. 25(a, b)). Further, the reset signal RSTX is activated in response to the inactivation of the bank BANK (FIG. 25(c)). The block reset signal SRSTX is inactivated in response to the inactivation of the row block RBLK caused by the inactivation of the bank BANK (FIG. 25(d)).

As described above, also in the sixth embodiment, the same effect as in the first embodiment can be obtained. Moreover, by transmitting the reset signal RSTX only to the bank BANK selected according to the bank address by the reset signal generation circuit 20 formed in each bank BANK0-1, the main word line MWLX can be unselected independently in each bank BANK when the access request has been received. In the bank BANK uninvolved in the access request, the unnecessary unselection of the main word line MWLX can be prevented, which can reduce power consumption.

Figure 26:
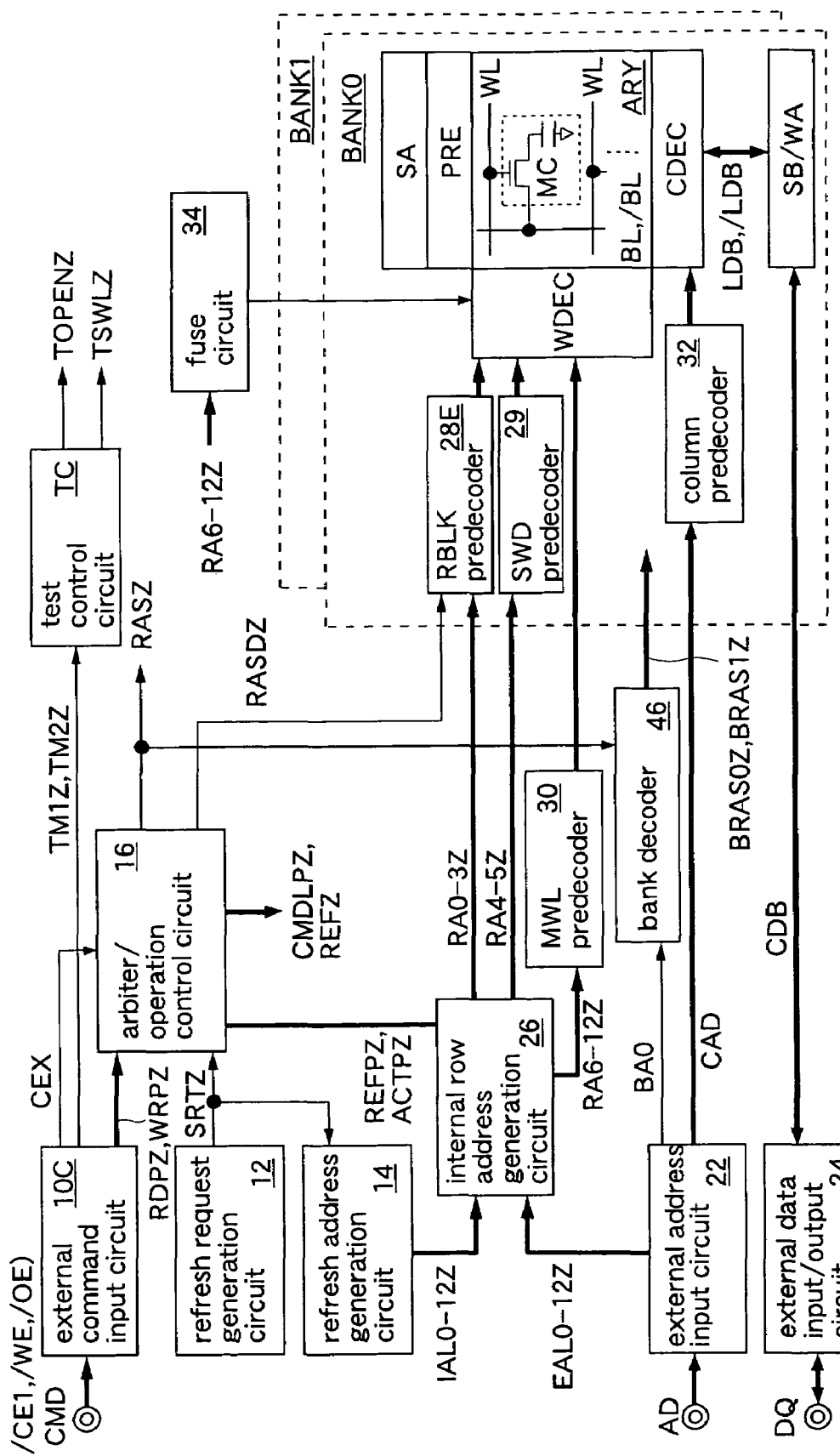
FIG. 26 is a block diagram showing a seventh embodiment of the semiconductor memory of the present invention.

FIG. 26 shows a seventh embodiment of the semiconductor memory of the present invention. The same reference symbols are used to designate the same elements as in the first and fourth embodiments, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. The pseudo SRAM of this embodiment includes two banks BANK0-1 including memory cores CORE which operate independently of each other and the bank decoder 46 to select from the banks BANK0-1.

The predecoder 30 to select the main word line MWLX is different from that of the sixth embodiment and formed in common to the banks BANK0-1. The predecoder 30 does not have the latch function. A predecoder 28E to select the row block RBLK is formed in each bank BANK0-1. The other constitutions are the same as in the fourth embodiment.

Figure 27:
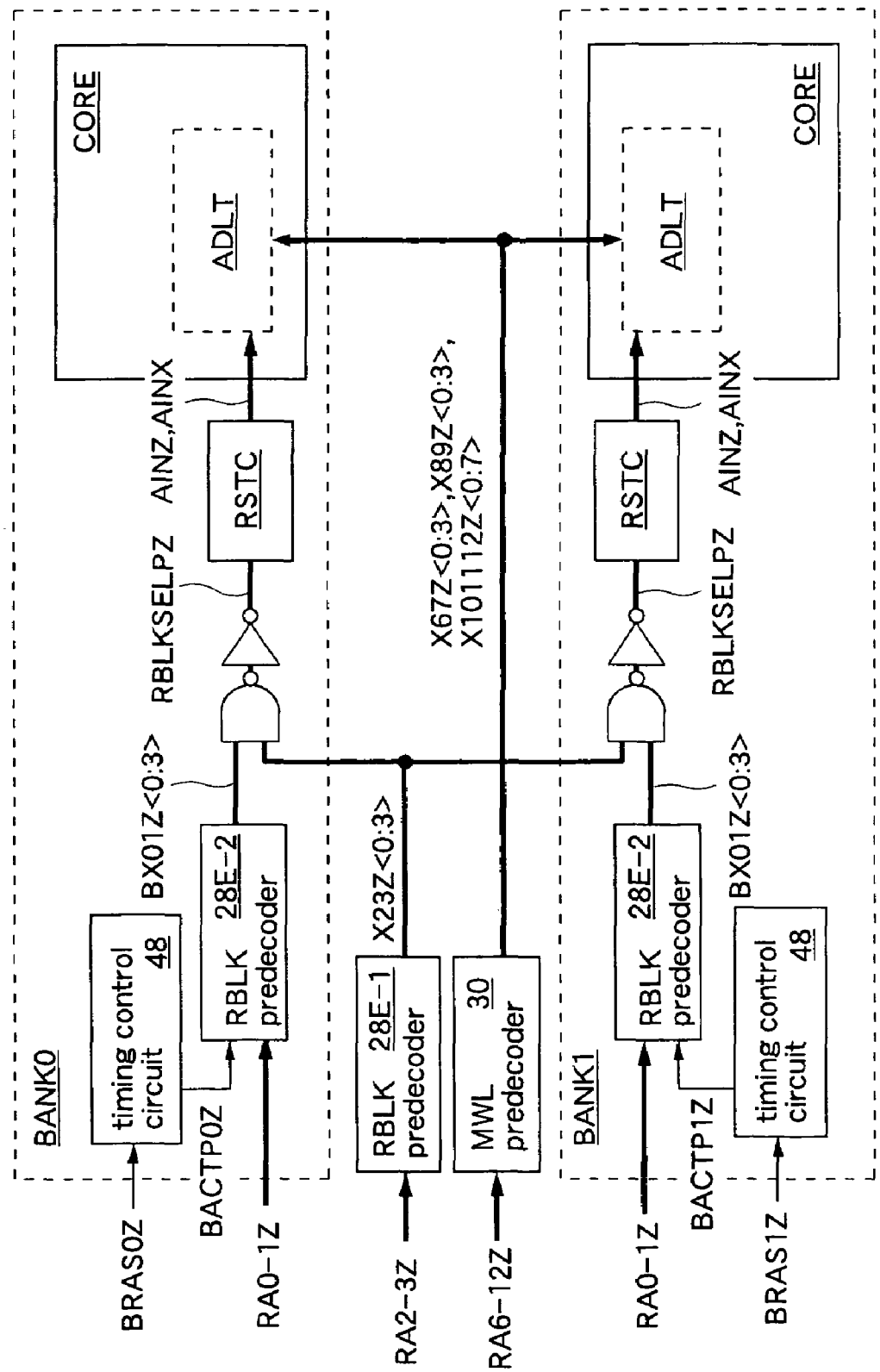
FIG. 27 is a block diagram showing details of banks shown in FIG. 26.

FIG. 27 shows details of the banks BANK0-1 shown in FIG. 26. Each bank BANK0-1 includes the same timing control circuit 48 as in the sixth embodiment and the same block reset control circuit RSTC as in the fourth embodiment. The predecoder 28E is constituted of a predecoder 28E-1 common to the banks BANK0-1 and a predecoder 28E-2 formed in each bank BANK0-1. The predecoder 28E-1 predecodes the row address RA2-3Z and generates the decode signal X23Z<0:3>. The decode signal X23Z<0:3> is different from the decode signal X23PZ<0:3> in the fourth embodiment and not a pulse signal. The predecoder 28E-2 receives the row address RA0-1Z during the high-level period of the bank active signal BACTP0Z (or BACTP1Z) and generates a bank decode signal BX01Z<0:3>. Then, the row block selection signal RBLKSELPZ is selected by the AND logic of the bank decode signal X01Z<0:3> and the predecode signal X23Z<0:3>. In each bank BANK0-1, the block reset control circuit RSTC generates the address latch signals AINZ, AINX in synchronization with the row block selection signal RBLKSELPZ.

In the pseudo SARM of this embodiment, as in the fourth embodiment (FIG. 15), each row block RBLK of the banks BANK0-1 includes the address latch circuits ADLT which latch the predecode signals X67Z, X89Z, X101112Z in synchronization with the address latch signals AINZ, AINX. The address latch signals AINZ, AINX are activated only in the bank BANK selected according to the bank address BA0-1Z. The address latch circuits ADLT of the bank BANK not selected do not perform a latch operation, so that signal lines of the predecode signals X67Z<0:3>, X89Z<0:3>, X101112Z<0:7> to select the main word line MWLX can be wired in common to the address latch circuits ADLT of the banks BANK0-1. Further, by including the logic of the bank active signal BACTP0Z (or BACTP1Z) in the generation of the bank decode signal BX01Z<0:3> in the predecoder 28E-2, a signal line of the X23Z<0:3> can be wired in common to the address latch circuits ADLT of the banks BANK0-1. Consequently, the number of predecode signal lines wired in the banks BANK0-1 can be reduced from 48 in the six embodiment to 28.

Figure 28:
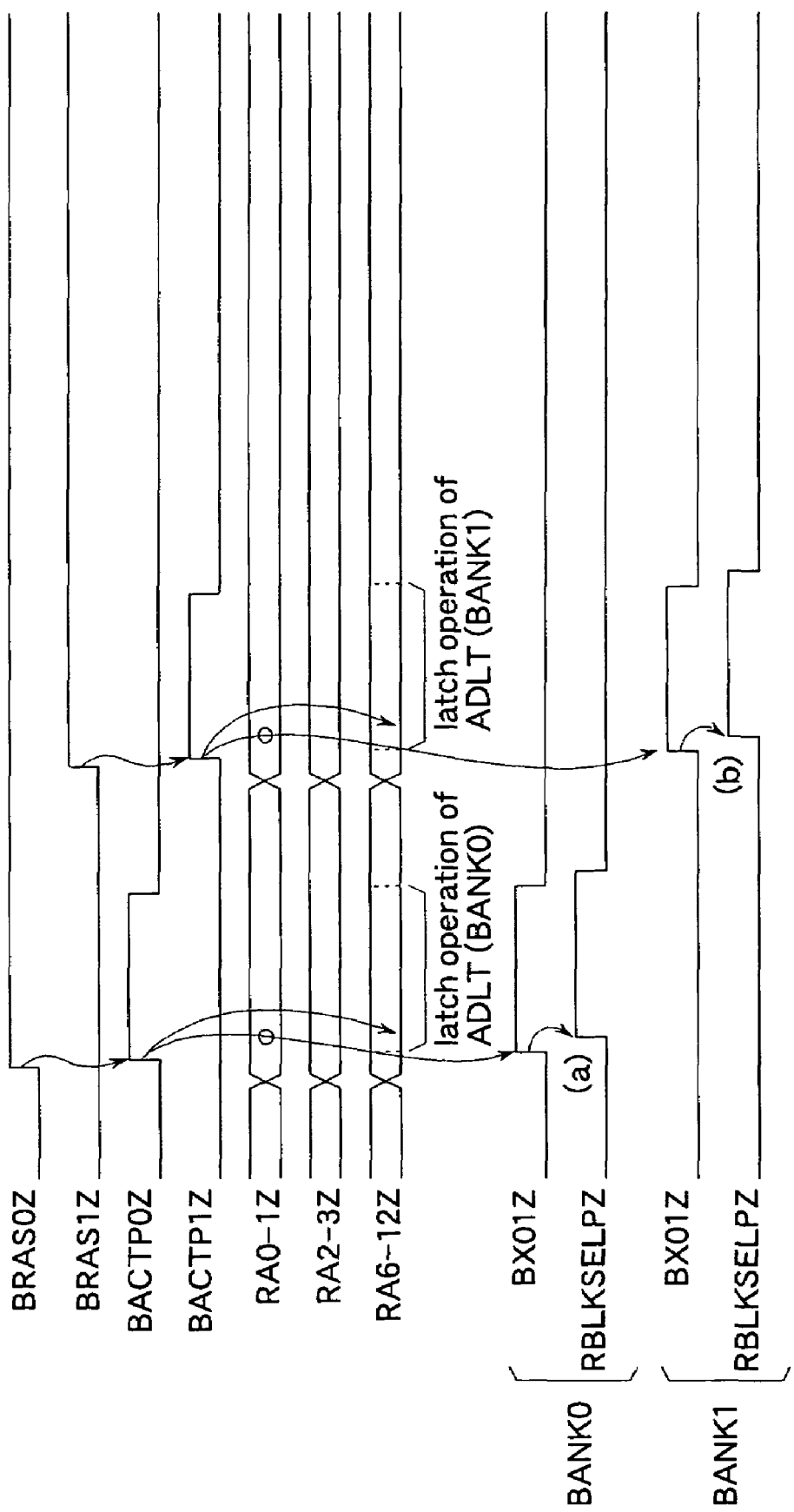
FIG. 28 is a timing chart showing the operation of a pseudo SRAM of the seventh embodiment.

FIG. 28 shows the operation of the pseudo SRAM of the seventh embodiment. This embodiment is characterized in that the unselection of the main word line MWLX which continues to be selected for the refresh request is performed in synchronization with the activation of the block reset signal SRSTX only in the row block RBLK of the bank BANK which has received the access request (FIG. 28(a, b)).

As described above, also in the seventh embodiment, the same effects as in the first, fourth, and sixth embodiments can be obtained. Further, only the address latch circuits ADLT of the bank BANK selected according to the bank address BA0 latch the external address EAL, whereby the main word line MWLX can be selected/unselected independently in each bank BANK. In the bank BANK uninvolved in the access request, the unnecessary unselection of the main word line MWLX can be prevented, which can reduce power consumption.

By including the predecode signals X01Z, X23PZ (row block addresses) in the generation logic of the address latch signals AINZ, AINX, the address latch signals AINZ, AINX can be generated only in the bank BANK which has received the access request. The address latch circuits ADLT of the bank BANK not selected do not perform the latch operation, so that the signal lines of the predecode signals X67Z<0:3>, X89Z<0:3>, X101112Z<0:7> can be wired in common to the banks BANK0-1. Consequently, the number of signal lines of the predecode signals X23PZ, X67Z, X101112Z can be almost halved, which can reduce the chip size of the pseudo SRAM.

Figure 29:
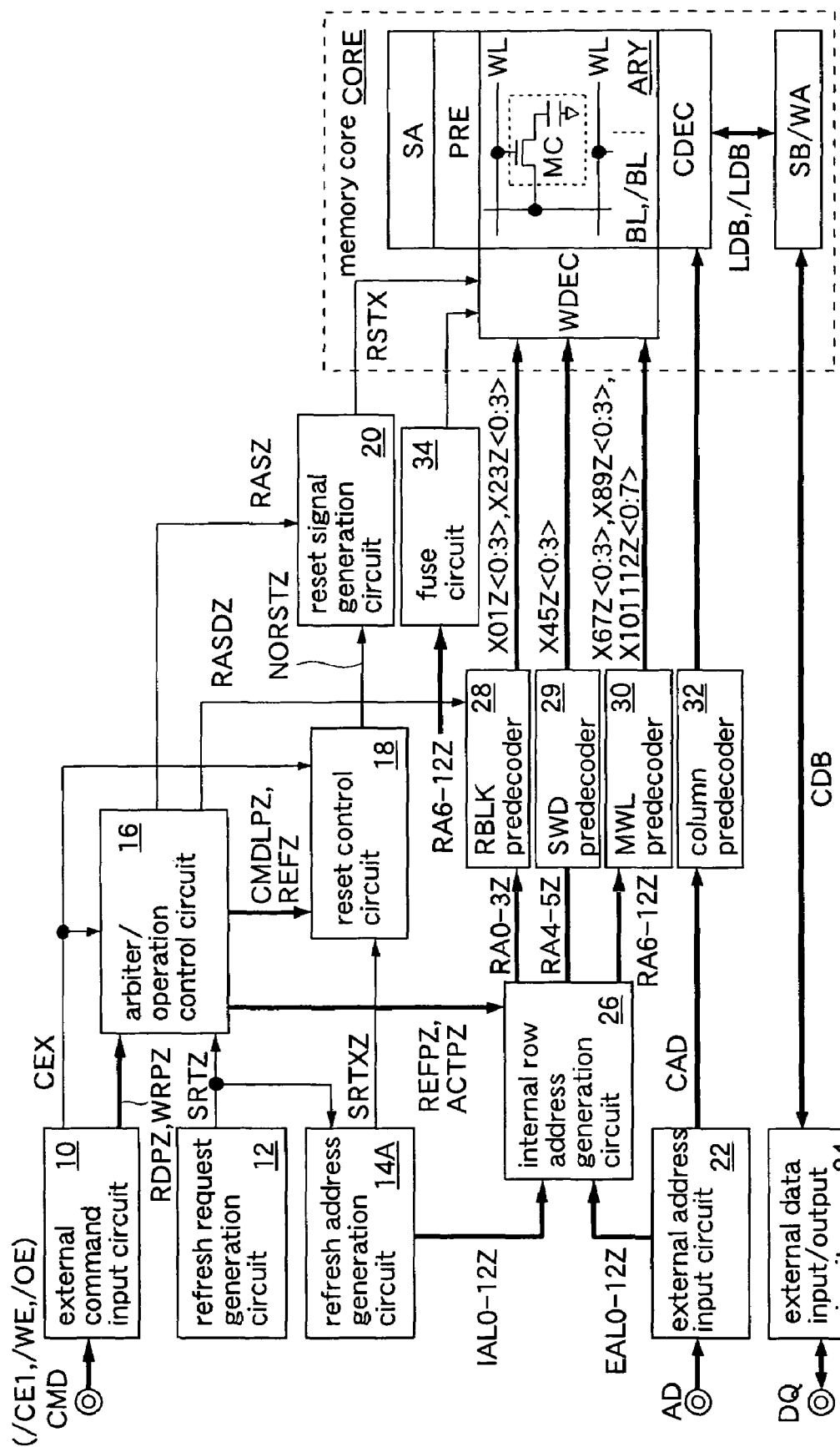
FIG. 29 is a block diagram showing an eighth embodiment of the semiconductor memory of the present invention.

FIG. 29 shows a major portion of an eighth embodiment of the semiconductor memory of the present invention. The same reference symbols are used to designate the same elements as in the first embodiment, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. This embodiment includes a refresh address generation circuit 14A instead of the refresh address generation circuit 14 of the first embodiment. Further, the word decoder WDEC differs from that of the first embodiment. The other constitutions are the same as in the first embodiment.

The refresh address generation circuit 14A differs from that of the first embodiment in the assignment of an address. Namely, out of the refresh address IAL0-12Z, the low-order 4 bits IAL0-3Z are used to select the row block RBLK0-15, the next 7 bits are used to select the main word line MWWL, and the high-order 2 bits are used to select the sub-word line SWL. Here, to avoid overlap with the description of the first embodiment, 13-bit refresh address is referred to in order from the lowest-order bit as IAL0-3Z (row block selection address), IAL6-12Z (main word selection address), and IAL4-5Z (sub-word selection address). The refresh address generation circuit 14A holds the refresh counter signal SRTXZ at a high level while outputting the refresh address to select the last main word line MWLX 127 out of 128 main word lines MWLX0-127 (during a period when bits IAL6-12Z are all at a high level). The other functions of the refresh address generation circuit 14A are the same as those of the refresh address generation circuit 14 of the first embodiment.

Figure 30:
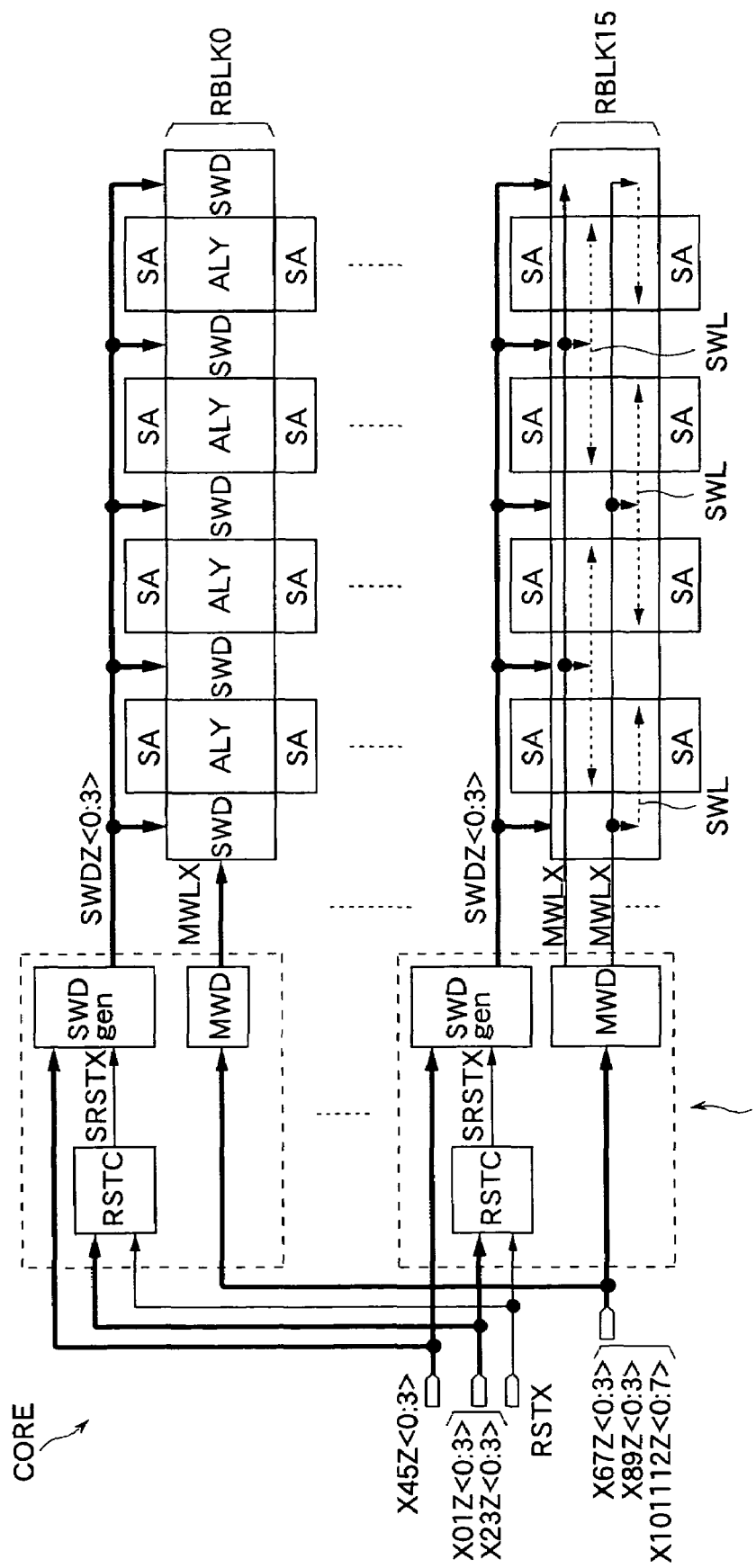
FIG. 30 is a circuit diagram showing a major portion of a memory core shown in FIG. 30.

FIG. 30 shows a major portion of the memory core CORE shown in FIG. 29. The word decoder WDEC includes a sub-word selection decoder SWDgen to select a sub-word selection signal SWDZ<0:3> (sub-word selection signal line) according to a decode signal X45Z<0:3> for each row block RBLK0-15. The sub-word selection signal SWDZ<0:3> is supplied to the sub-word decoders SWD arranged dispersedly in each row block RBLK. The other constitutions are the same as in the first embodiment (FIG. 4). Since the sub-word selection signal line SWDZ is connected to the sub-word decoders SWD arranged dispersedly in the row block RBLK, its wiring length is long. Therefore, a large charge/discharge current is generated by the selection/unselection of the sub-word selection signal line SWDZ. In this embodiment, as will be described later, by lowering the frequency of selection/unselection of the sub-word selection signal lines SWDZ, the charge/discharge current can be reduced, thereby reducing power consumption.

Figure 31:
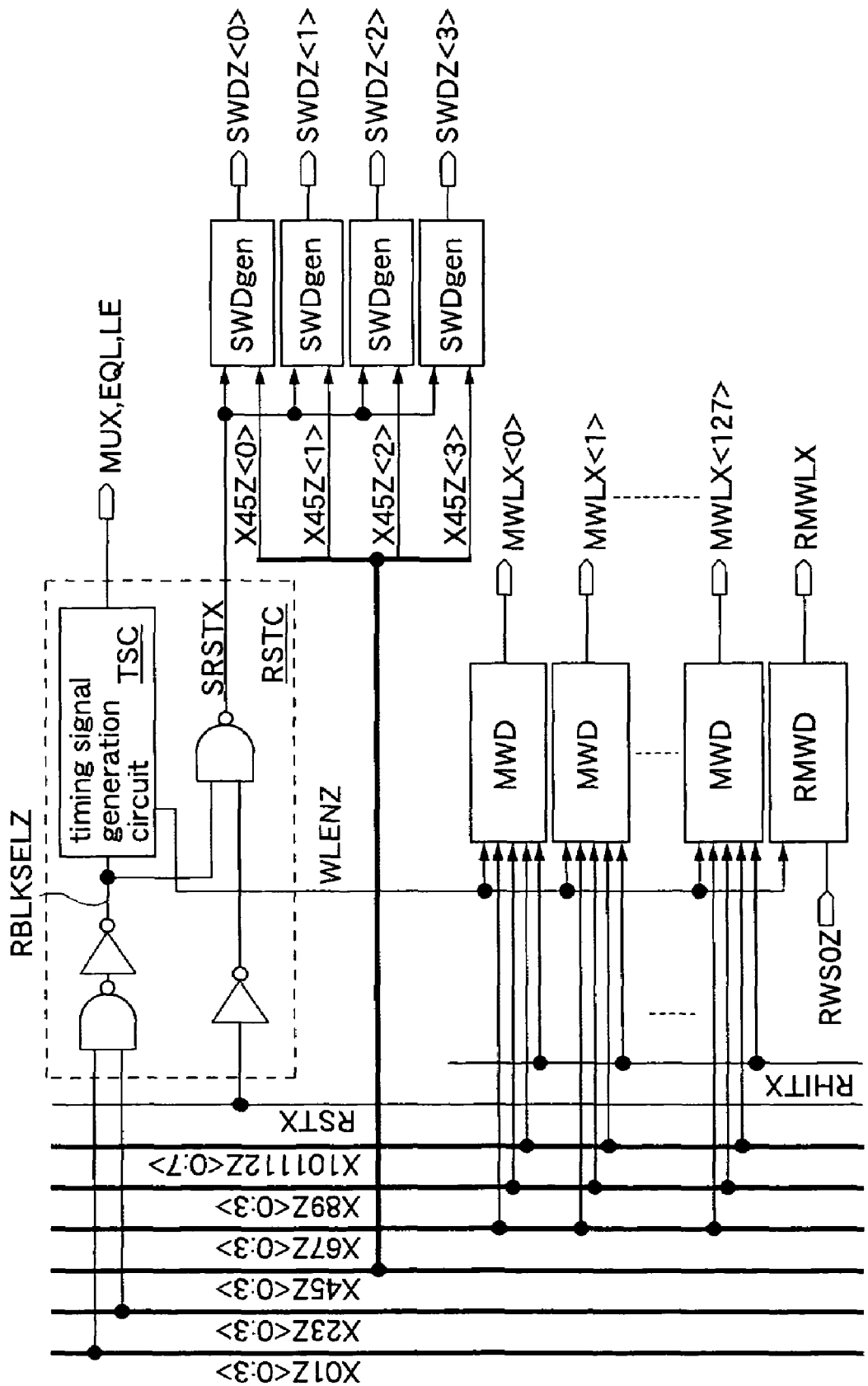
FIG. 31 is a block diagram showing details of each word decoder shown in FIG. 30.

FIG. 31 shows details of each word decoder WDEC shown in FIG. 30. The timing signal WLENZ (which generates an activation period of the word line WL (=SWL)) generated by the timing signal generation circuit TSC of the block reset control circuit RSTC is supplied to the main word decoders MWD. The block reset signal SRSTX is supplied to the sub-word selection decoders SWDgen instead of the main word decoders MWD. Four sub-word selection decoders SWDgen are formed for each row block RBLK0-15. The sub-word selection decoders SWDgen generate the sub-word selection signals SWDZ<0:3> according to the decode signals X45Z<0:3>, respectively. The sub-word selection decoder SWDgen selecting (activating) the sub-word selection signal SWDZ unselects the sub-word selection signal SWDZ in synchronization with the activation of the block reset signal SRSTX. The other constitutions are the same as in the first embodiment (FIG. 5).

Figure 32:
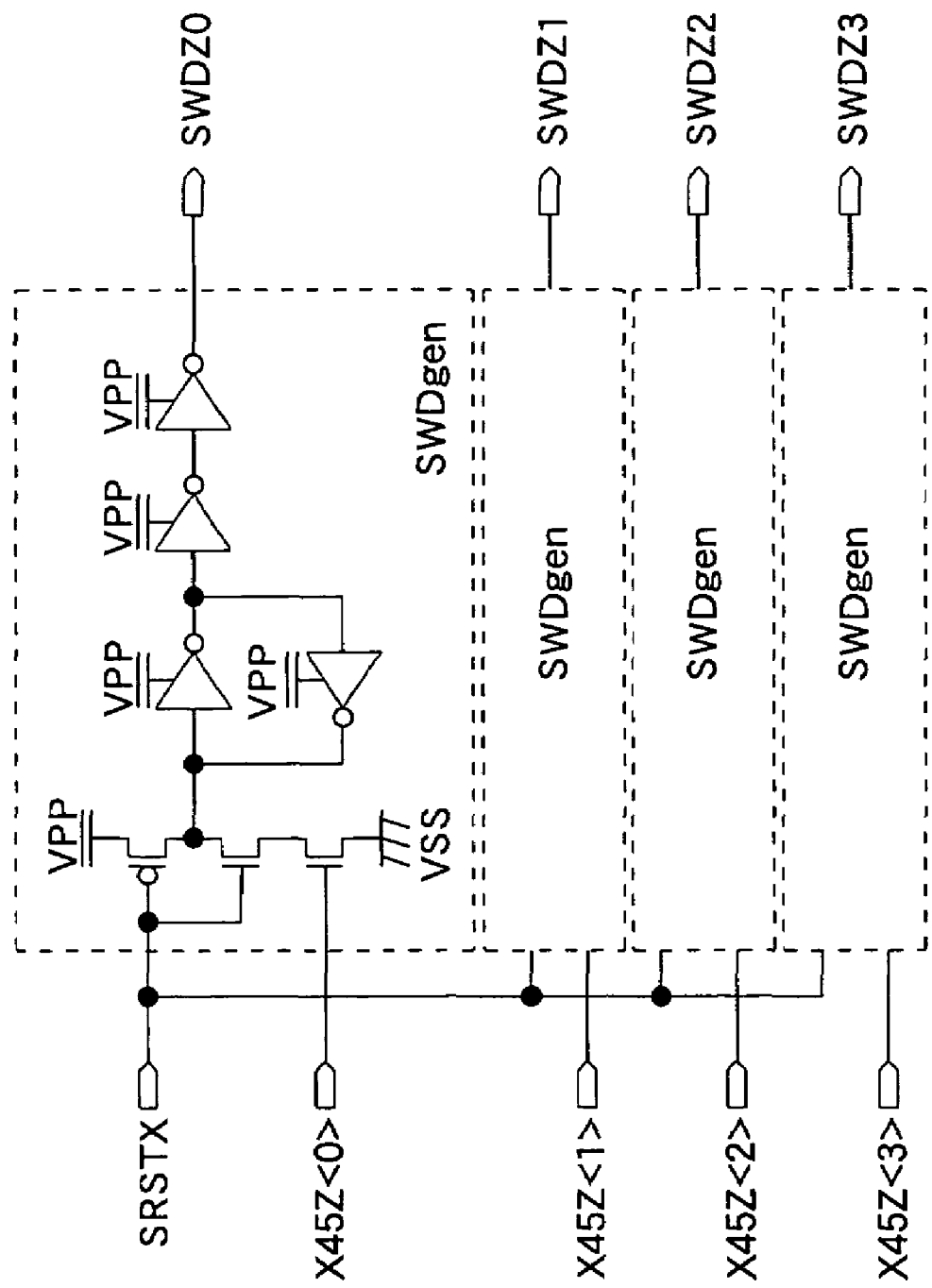
FIG. 32 is a circuit diagram showing details of a sub-word selection decoder shown in FIG. 31.

FIG. 32 shows details of the sub-word selection decoder SWDgen. The sub-word selection decoder SWDgen includes a pMOS transistor and an nMOS transistor which receive the block reset signal SRSTX at their gates, an nMOS transistor which receives the predecode signal X45Z at its gate, a latch connected to a drain of the pMOS transistor, and a buffer composed of two inverters connected to an output of the latch. A power supply line of the sub-word selection decoder SWDgen is connected to the boost voltage line VPP.

Figure 33:
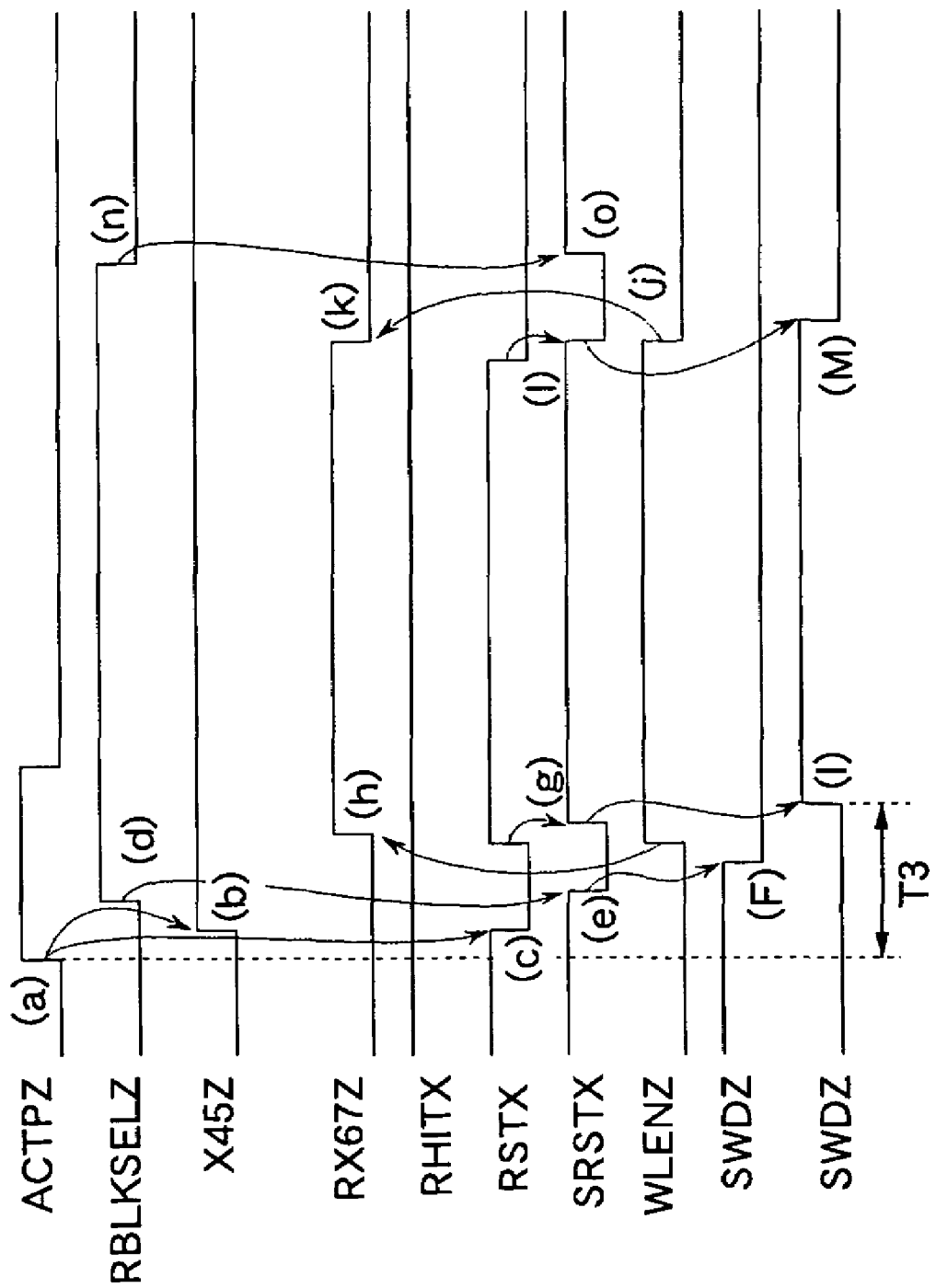
FIG. 33 is a timing chart showing the operations of the sub-word selection decoders when the read operation or the write operation is performed in the eighth embodiment.

FIG. 33 shows the operations of the sub-word selection decoders SWDgen when the read operation or the write operation is performed in the eighth embodiment. This example shows a case where there is no defect in the main word lines MWLX, the memory cells MC, or the like, and the redundancy hit signal RHITX is not activated. The same reference symbols are used to designate the same operations as in the first embodiment (FIG. 7). The difference from the first embodiment is that in response to the block reset signal SRSTX, the sub-word selection signal SWDZ is unselected/selected without the main word line MWLX being unselected/selected. Namely, in response to the activation of the block reset signal SRSTX, the pMOS transistor of the sub-word selection decoder SWDgen is turned on, and the sub-word selection signal SWDZ which continues selection to perform the refresh operation is unselected (FIG. 33(F)). In response to the inactivation of the block reset signal SRSTX, the sub-word selection signal SWDZ corresponding to the access request is selected, and the access operation is performed (FIG. 33(I)). In synchronization with the activation of the block reset signal SRSTX, the pMOS transistor of the sub-word selection decoder SWDgen is turned on, and the sub-word selection signal SWDZ selected for the access operation is inactivated (FIG. 7(M)). The time from the activation of the access signal ACTPZ to the selection of the sub-word selection signal SWDZ is T3. The time T3 is almost the same as the time T1 in the first embodiment (FIG. 7). The other operations are the same as in the first embodiment.

Figure 34:
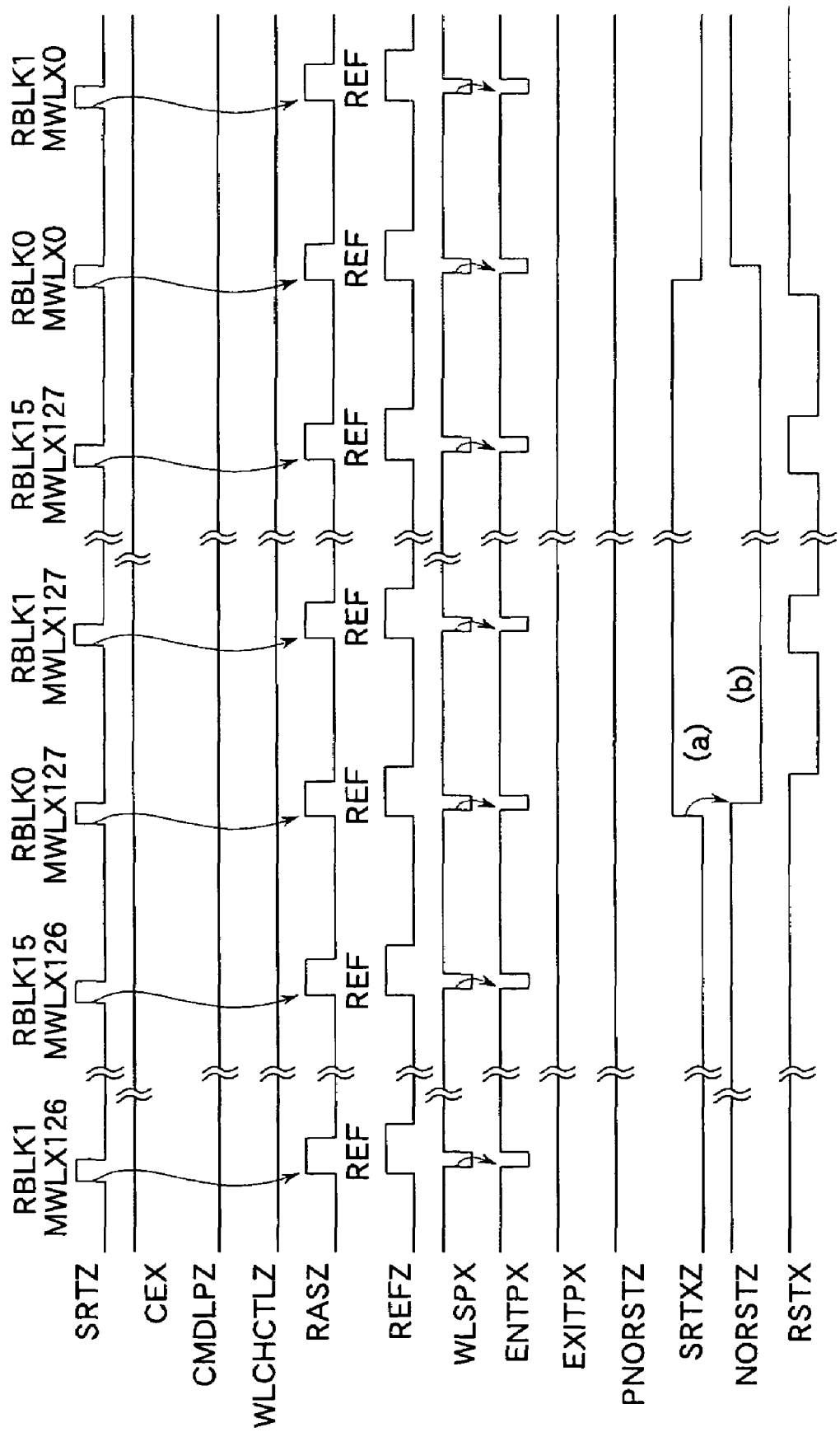
FIG. 34 is a timing chart showing the operations of an arbiter/operation control circuit, a reset control circuit, and a reset signal generation circuit in the eighth embodiment.

FIG. 34 shows the operations of the arbiter/operation control circuit 16, the reset control circuit 18, and the reset signal generation circuit 20. FIG. 34 is different from that in the first embodiment (FIG. 10) in the order of the word line selected according to the refresh request. Namely, in this embodiment, at each refresh request, first the row block RBLK is switched, then the main word line MWLX is switched, and finally the sub-word line SWL is switched. Further, while the refresh address generation circuit 14 is outputting the high-level refresh counter signal SRTXZ, that is, while the last main word line MWLX127 is designated by the refresh address, the reset signal RSTX is outputted in response to each refresh request SRTZ. The other operations are the same as in the first embodiment.

As described above, also in the eighth embodiment, the same effect as in the first embodiment can be obtained. Namely, by lowering the frequency of selection/unselection of the sub-word selection signal lines SWDZ, the charge/discharge current can be reduced, which can reduce the power consumption of the pseudo SRAM.

Figure 35:
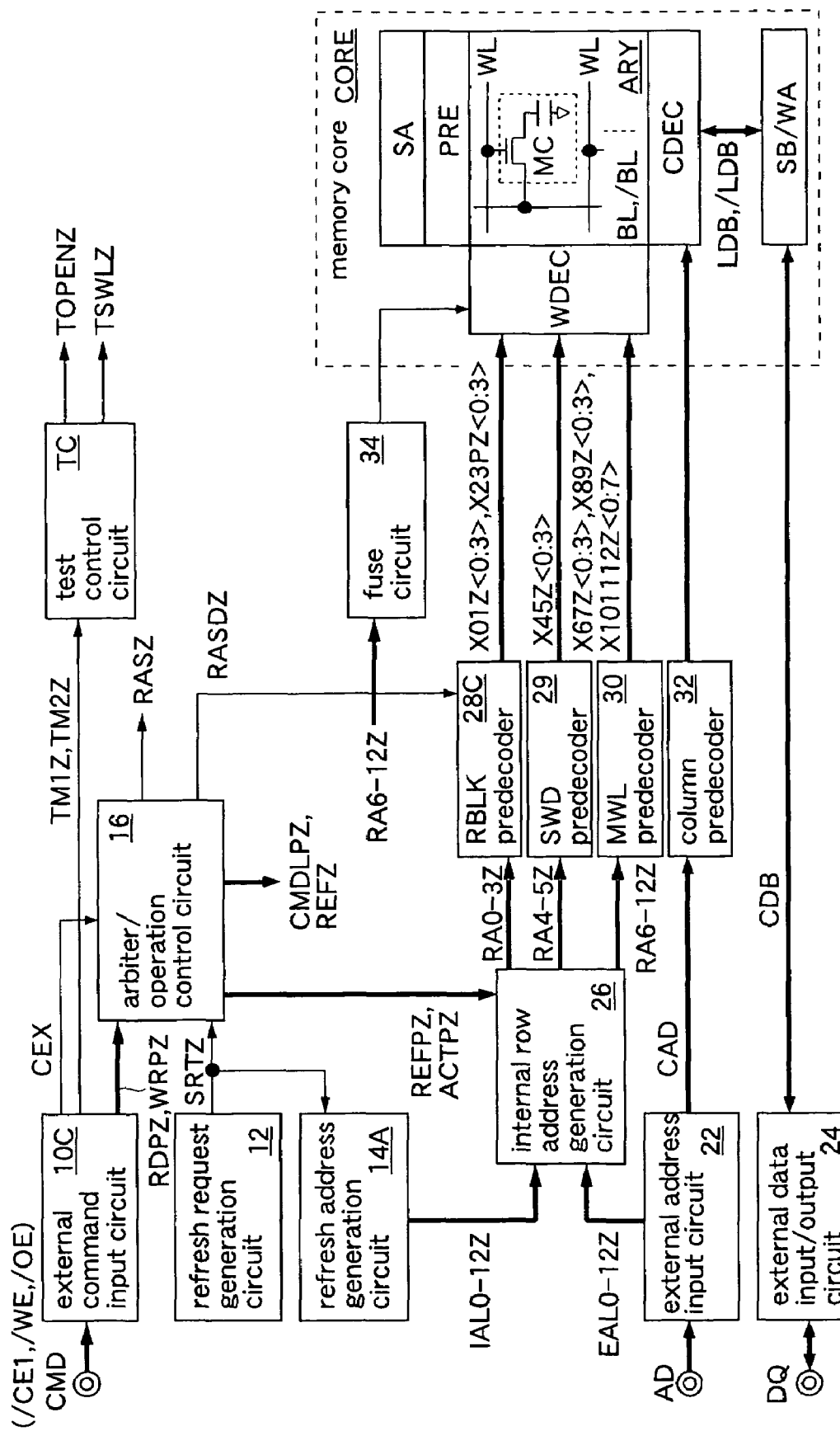
FIG. 35 is a block diagram showing a ninth embodiment of the semiconductor memory of the present invention.

FIG. 35 shows a major portion of a ninth embodiment of the semiconductor memory of the present invention. The same reference symbols are used to designate the same elements as in the first, fourth, and eighth embodiments, and a detailed description thereof is omitted. This semiconductor memory is formed as a pseudo SRAM on a silicon substrate using a CMOS process. The pseudo SRAM is used, for example, for a work memory mounted in portable equipment such as a mobile phone. This embodiment includes the refresh address generation circuit 14A instead of the refresh address generation circuit 14 of the fourth embodiment.

Further, the word decoder WDEC differs from that of the fourth embodiment. The other constitutions are the same as in the fourth embodiment.

Figure 36:
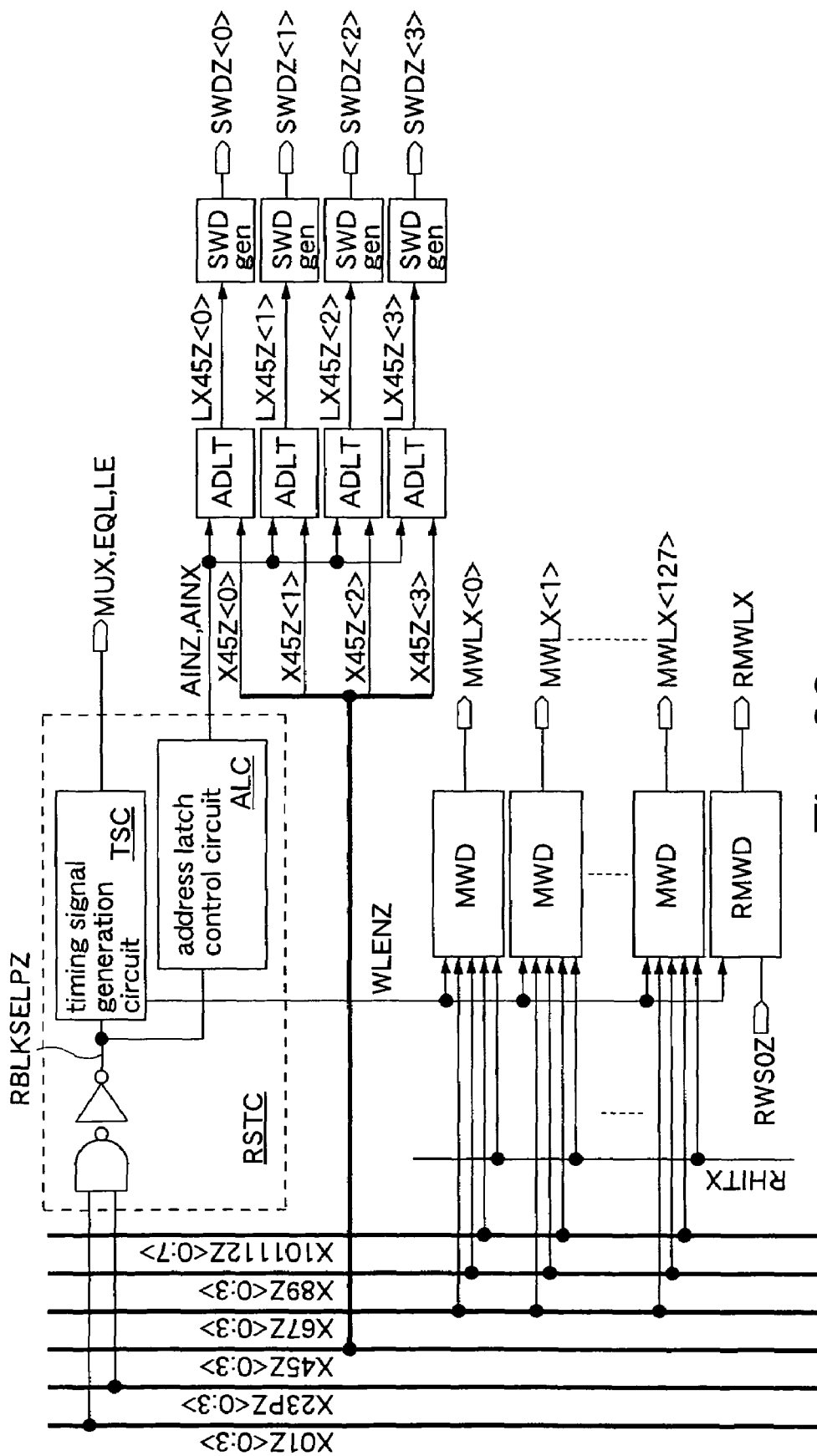
FIG. 36 is a block diagram showing details of a word decoder shown in FIG. 35.

FIG. 36 shows details of the word decoder WDEC shown in FIG. 35. The word decoder WDEC shown in FIG. 36 is formed for each row block RBLK0-15. The word decoder WDEC includes four sub-word selection decoders SWDgen to select the sub-word selection signals SWDZ<0:3> (sub-word selection signal lines) according to the decode signals X45Z<0:3> and the address latch circuits ADLT to supply the latch decode signals LX45Z<0:3> to the sub-word selection decoders SWDgen. The address latch circuits ADLT latch the predecode signals X45Z<0:3> instead of the predecode signals X67Z<0:3>, X89Z<0:3>, X101112Z<0:7> in synchronization with the address latch signals AINZ, AINX and output the latch decode signals LX45Z<0:3>. The timing signal WLENZ generated by the timing signal generation circuit TSC of the block reset control circuit RSTC is supplied to the main word decoders MWD. The other constitutions are the same as in the fourth embodiment (FIG. 15).

Since the sub-word selection signal SWDZ<0:3> generated by the sub-word selection decoder SWDgen is connected to the sub-word decoders SWD arranged dispersedly in the row block RBLK as in the eighth embodiment (FIG. 30), its wiring length is long. Therefore, a large charge/discharge current is generated by the selection/unselection of the sub-word selection signal line SWDZ. In this embodiment, as will be described later, by lowering the frequency of selection/unselection of the sub-word selection signal lines SWDZ, the charge/discharge current can be reduced, thereby reducing power consumption.

Figure 37:
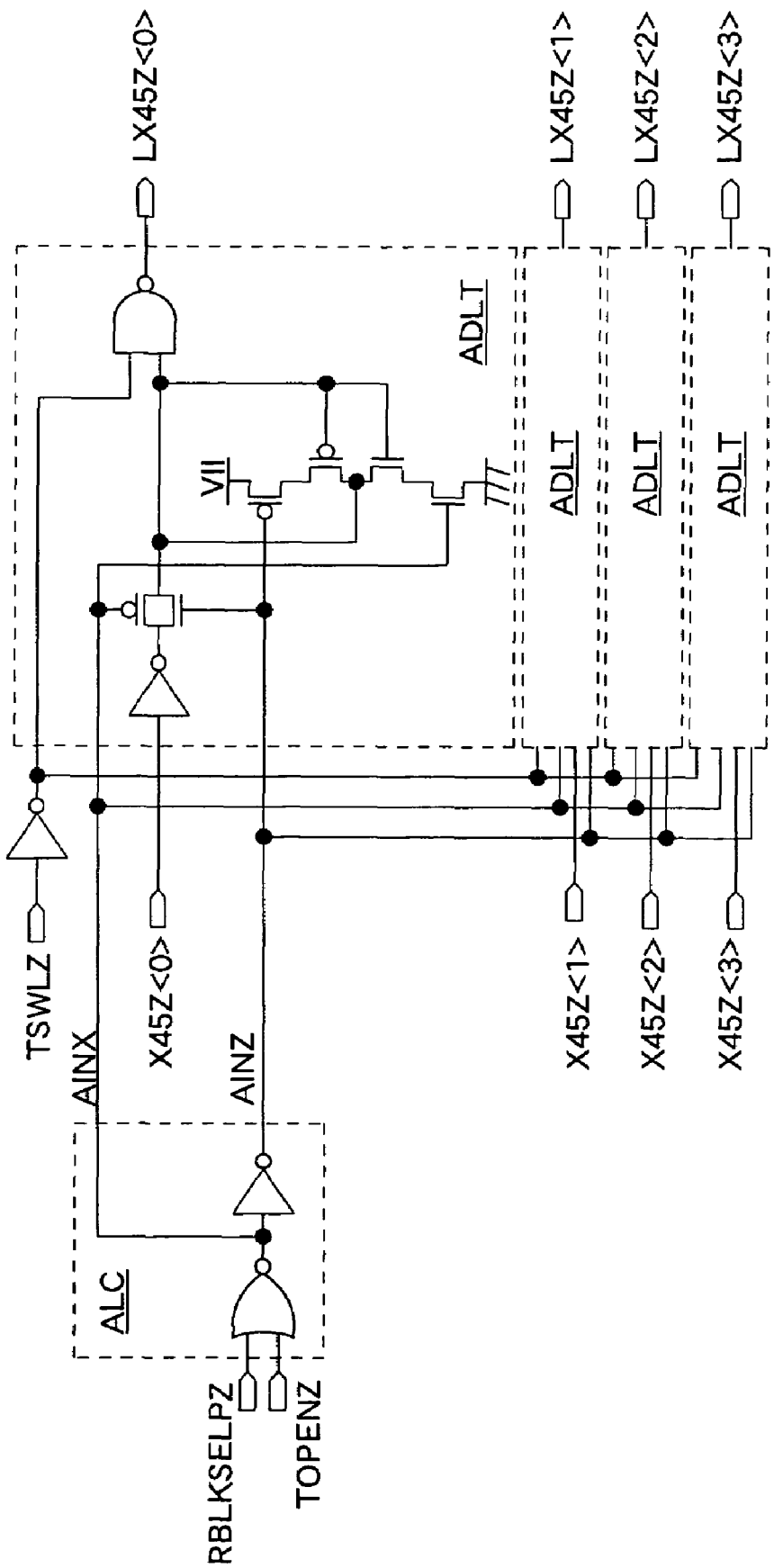
FIG. 37 is a circuit diagram showing details of an address latch control circuit and an address latch circuit shown in FIG. 36.

FIG. 37 shows details of the address latch control circuit ALC and the address latch circuit ADLT. The address latch control circuit ALC is the same as in the fourth embodiment (FIG. 16). The address latch circuit ADLT is constituted by changing the logic of the address lath circuit ADLT (FIG. 16) of the fourth embodiment in order to output the positive logic latch decode signal LX45Z<0:3>. When the second test signal TSWLZ is at a high level, the address latch circuits ADLT fix all the latch decode signals LX45Z<0:3> to a high level.

Figure 38:
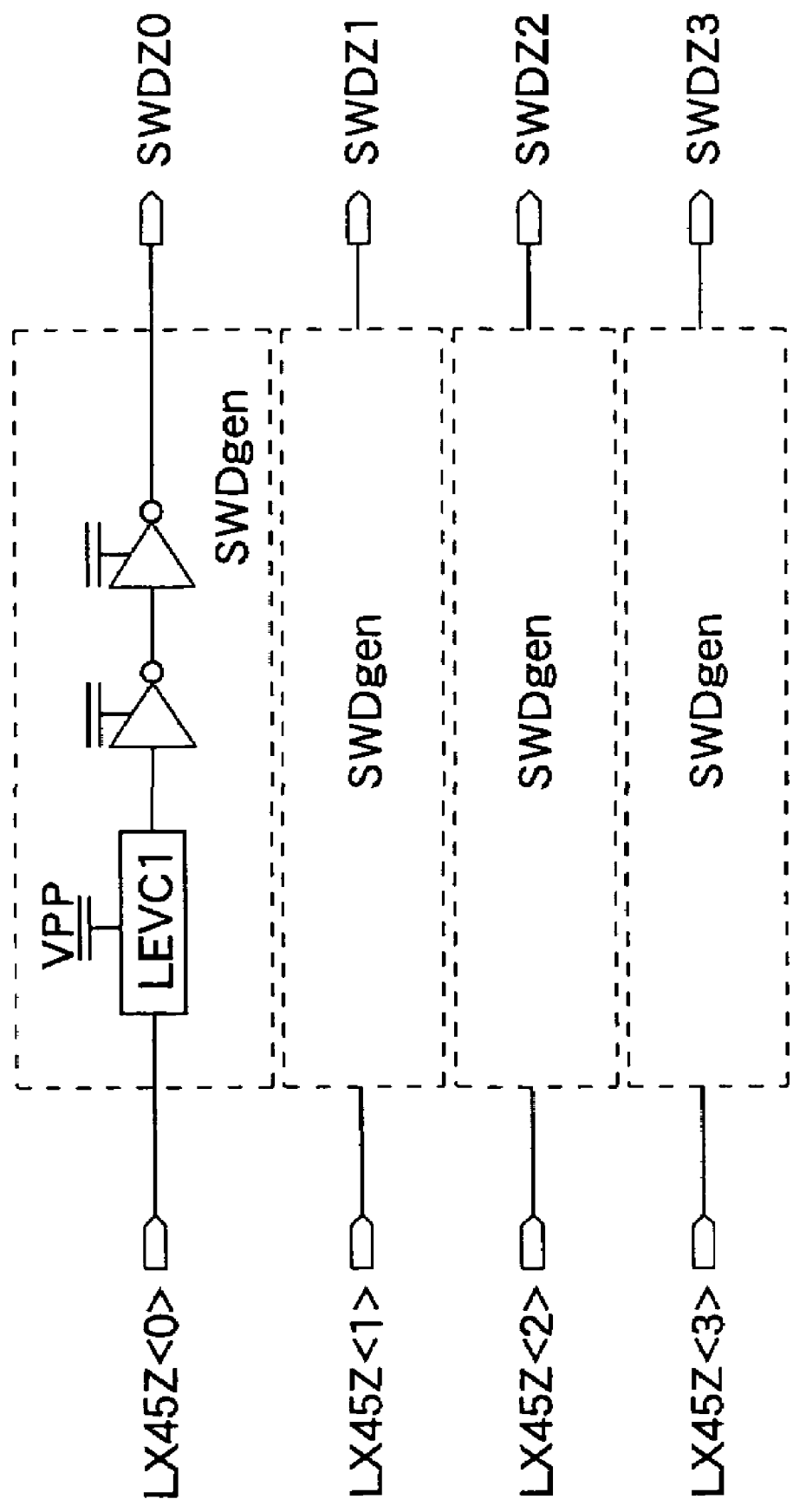
FIG. 38 is a circuit diagram showing details of a sub-word selection decoder shown in FIG. 36.

FIG. 38 shows details of the sub-word selection decoder SWDgen. The sub-word selection decoder SWDgen includes the level converter LEVC1 and a buffer composed of two inverters connected to an output of the level converter LEVC1. A power supply line of the sub-word selection decoder SWDgen is connected to the boost voltage line VPP. The level converter LEVC1 converts the high level of the latch decode signal LX45Z from the internal supply voltage VII to the boost voltage VPP and outputs it to the buffer.

Figure 39:
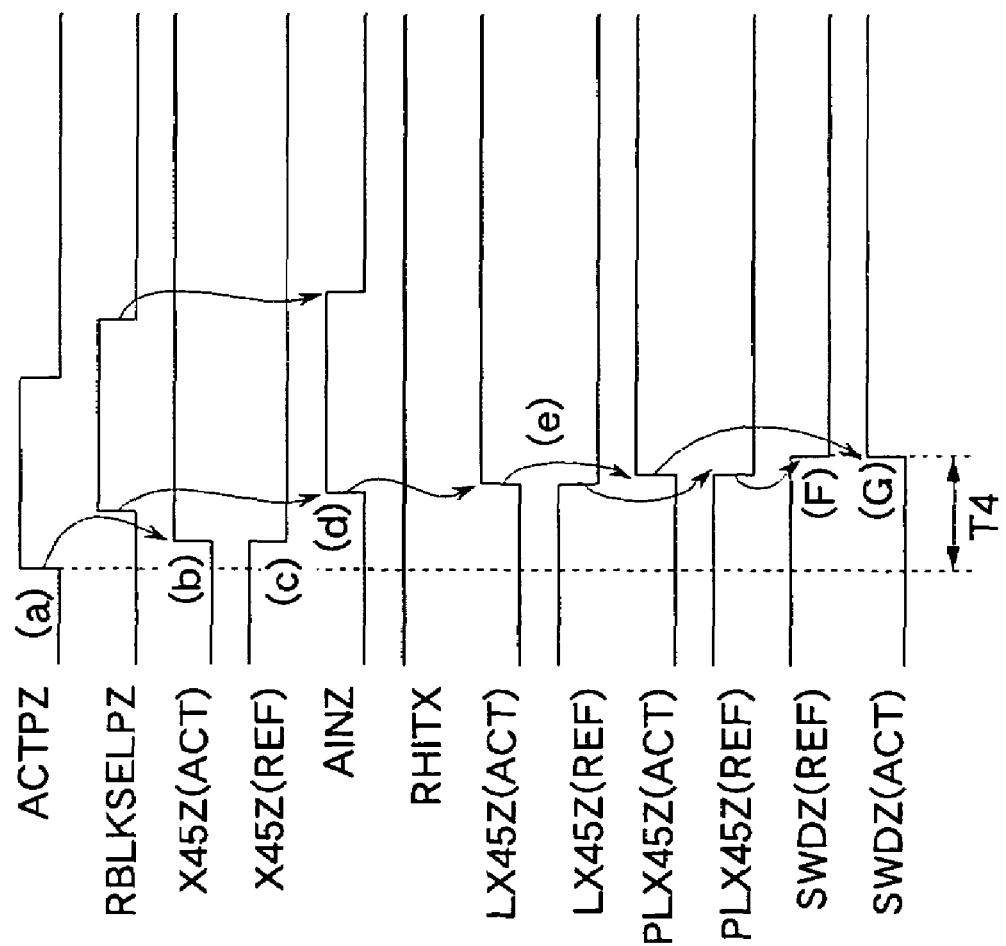
FIG. 39 is a timing chart showing the operations of the sub-word selection decoders when the read operation or the write operation is performed in the ninth embodiment.

FIG. 39 shows the operations of the sub-word selection decoders SWDgen when the read operation or the write operation is performed in the ninth embodiment. This example shows a case where there is no defect in the main word lines MWLX, the memory cells MC, or the like, and the redundancy hit signal RHITX is not activated. The same reference symbols are used to designate the same operations as in the fourth embodiment (FIG. 18). The difference from the fourth embodiment is that in response to the block reset signal SRSTX, the sub-word selection signals SWDZ are unselected/selected without the main word lines MWLX being unselected/selected. Namely, in response to the activation of the block reset signal SRSTX, the sub-word selection signal SWDZ which continues selection to perform the refresh operation is unselected (FIG. 39(F)), and simultaneously the sub-word selection signal SWDZ corresponding to the access request is selected (FIG. 39(G)). The time from the activation of the access signal ACTPZ to the selection of the sub-word selection signal SWDZ is T4. The time T4 is almost the same as the time T2 in the fourth embodiment (FIG. 18). Since the unselection and selection of the sub-word selection signals SWDZ are performed simultaneously, the time from the access signal ACTPZ to the selection of the sub-word selection signal SWDZ becomes T4 which is shorter than T3 in the eighth embodiment. The other operations are the same as in the fourth embodiment.

Figure 40:
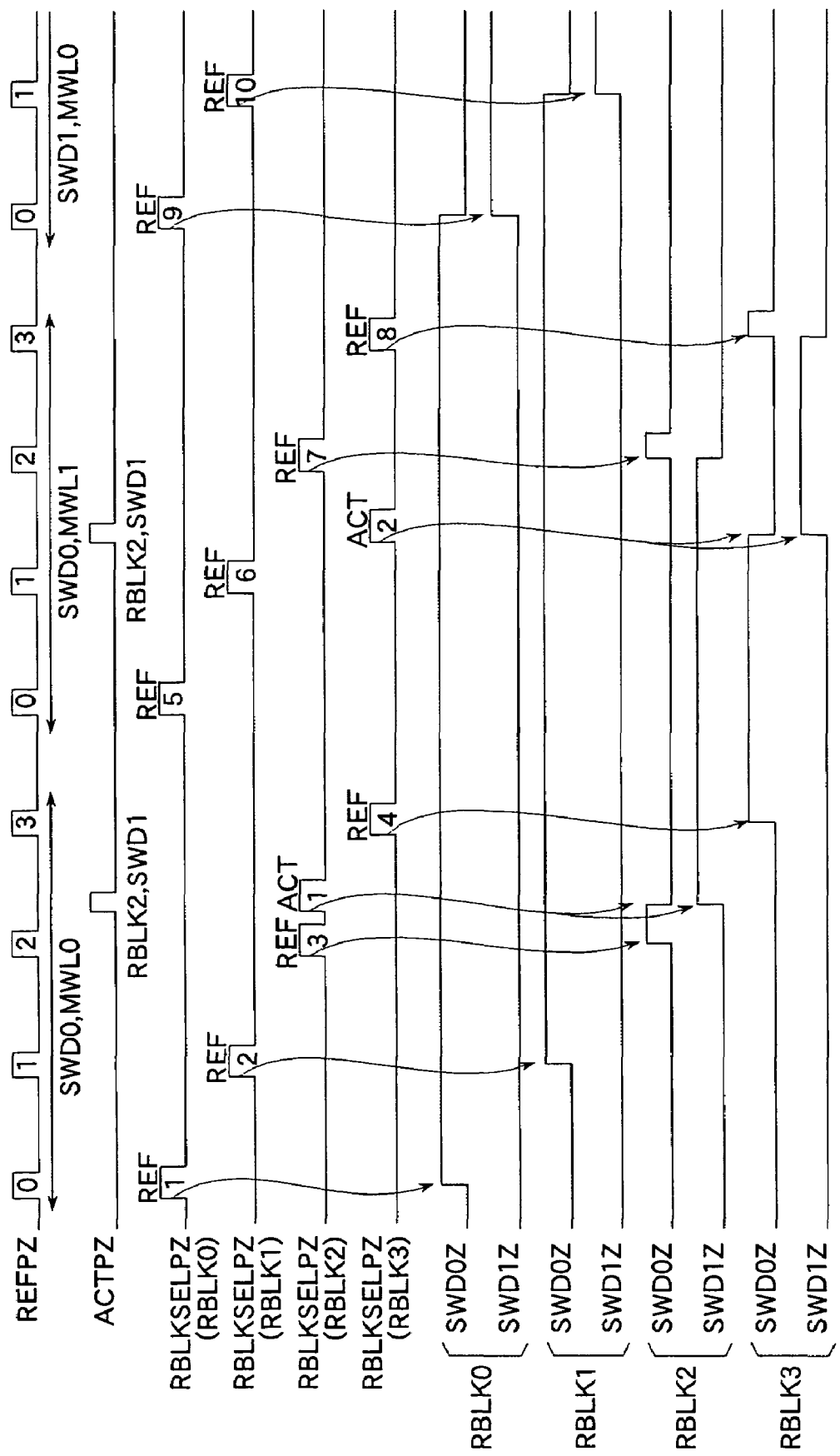
FIG. 40 is a timing chart showing the operation of a memory core in the ninth embodiment.

FIG. 40 shows the operation of the memory core CORE in the ninth embodiment. For ease of explanation, an example in which the memory core CORE includes four row blocks RBLK0-3, two main word lines MWLX0-1, and two sub-word lines SWL0-1 is shown. The number given to the refresh signal REFPZ denotes the number of the row block RBLK where the refresh operation REF is performed. In this embodiment, by the refresh address IAL0-12Z generated by the refresh address generation circuit 14A, at each refresh request, first the row block RBLK is switched, then the main word line MWLX is switched, and finally the sub-word line SWL (sub-word decoder SWD) is switched. Therefore, at each refresh request, instead of the main word line MWLX, the sub-word selection signal SWDZ in the row blocks RBLK0-3 is selected sequentially. The other constitutions are almost the same as in the fourth embodiment.

As described above, also in the ninth embodiment, the same effects as in the first, fourth, and eighth embodiments can be obtained. Namely, by lowering the frequency of selection/unselection of the sub-word selection signal lines SWDZ, the charge/discharge current can be reduced, which can reduce the power consumption of the pseudo SRAM.

Figure 41:
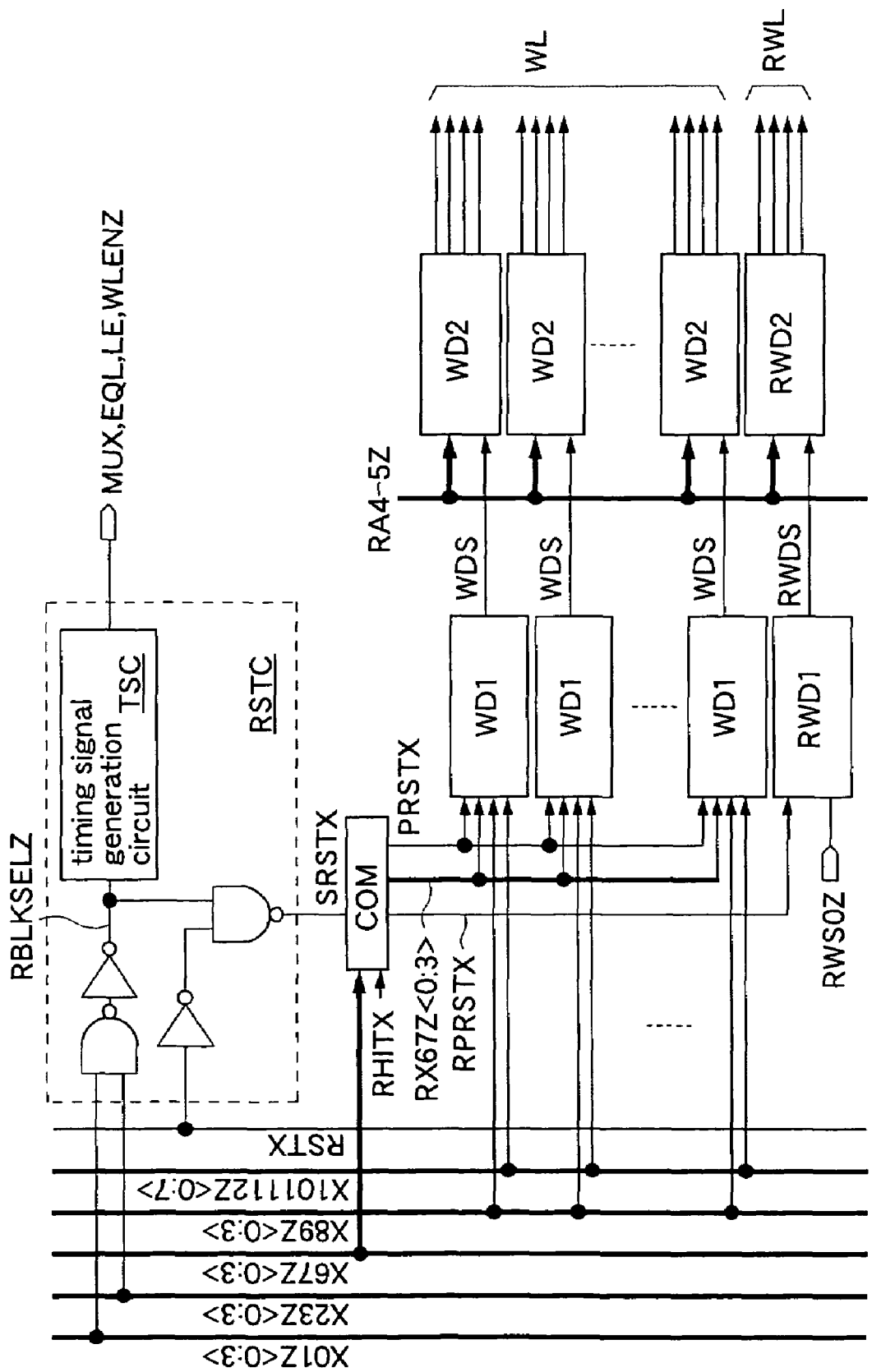
FIG. 41 is a block diagram showing another example of the pseudo SRAM to which the present invention is applied.
Figure 42:
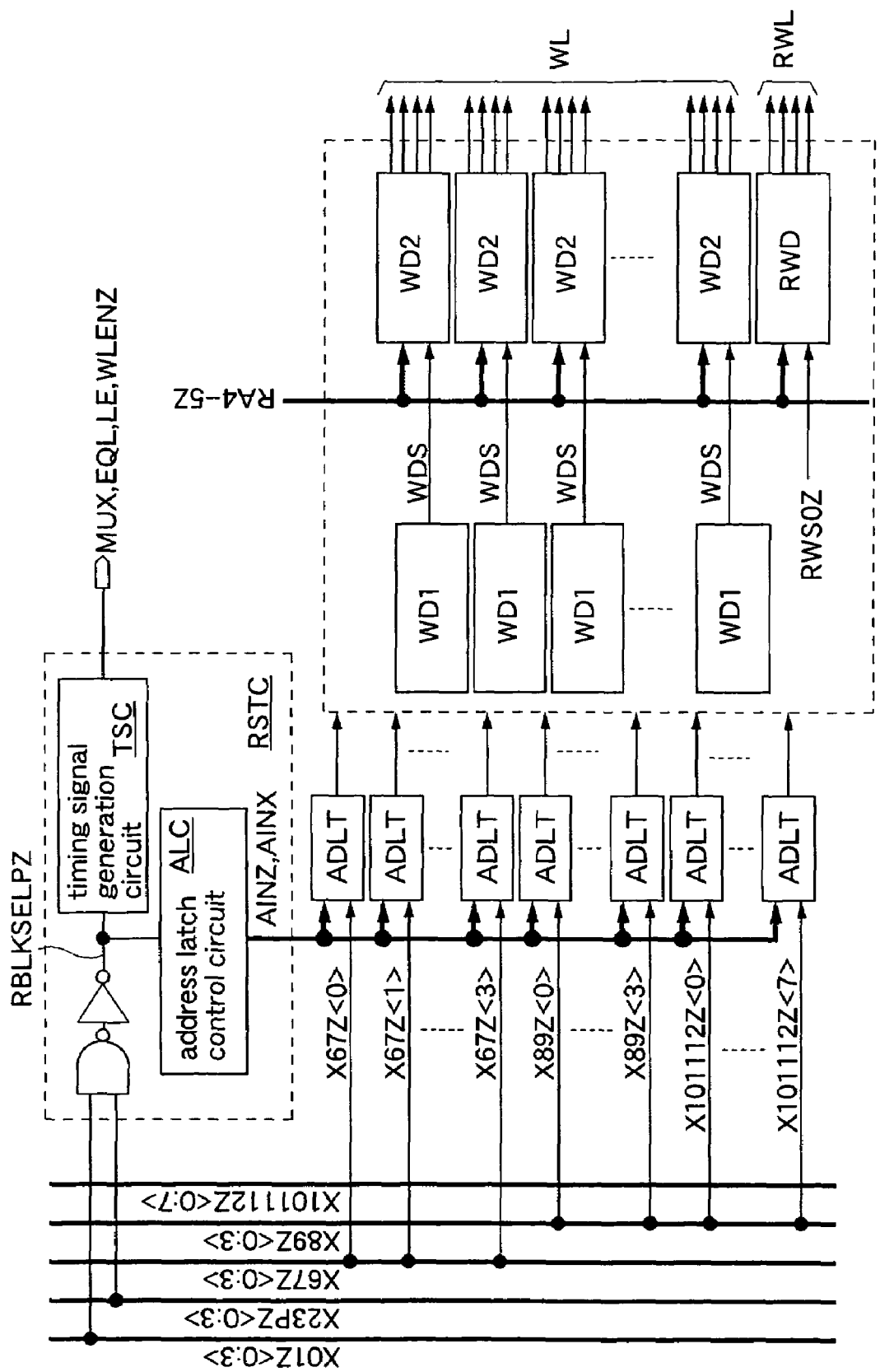
FIG. 42 is a block diagram showing another example of the pseudo SRAM to which the present invention is applied.

The above embodiments have described the example where the present invention is applied to the pseudo SRAM including a hierarchical structure of word lines MWLX, SWL, namely, the example in which, in each row block RBLK, the main word line MWLX which continues to be selected for the refresh operation is unselected in response to the access request. The present invention is not limited to these embodiments. For example, as shown in FIG. 41 and FIG. 42, the present invention may be applied to a pseudo SRAM including the word lines WL (or redundancy word lines RWL) not hierarchized. Namely, in the pseudo SRAM including first word decoders WD1 each generating a decode signal WDS upon receiving predecode signals and second word decoders WD2 each selecting any of word lines WL upon receiving the decode signal WDS and the row address RA4-5Z, the decode signal which continues to be selected for the refresh operation may be unselected in response to the access request in each row block RBLK. Incidentally, the word lines WL not hierarchized are generally constituted of polysilicon wiring to constitute gates of transfer transistors of the memory cells MC and metal wiring running above the polysilicon wiring.

The above first embodiment has described the example in which when the sub-word line SWL3 is to be refreshed, unselection is performed upon each refresh of the main word line MWLX. The present invention is not limited to this embodiment. For example, it is also possible that when the sub-word line SWL0 becomes the refresh object, the main word line MWLX selected so far is unselected, and the main word line MWLX as the refresh object is newly selected.

The above fourth, fifth, and seventh embodiments have described the example in which the predecode signals are latched by the address latch circuits ADLT to continue to activate the main word line MWLX. The present invention is not limited to these embodiments. Further, it is also possible to, while latching the address, receive the next external address EAL or refresh address IAL and perform redundancy determination of the received address. By performing the redundancy determination of the next refresh operation or access operation during the refresh operation or access operation, the cycle time and the access time can be further reduced.

The invention is not limited to the above embodiments and various modifications may be made without departing from the spirit and scope of the invention. Any improvement may be made in part or all of the components.

What is claimed is:

1. A semiconductor memory, comprising:
a plurality of memory blocks each including a plurality of memory cells and a plurality of word lines connected to the memory cells;
a plurality of word line groups formed in each of said memory blocks and each including a predetermined number of word lines;
a refresh request generation circuit generating a refresh request to refresh the memory cells in a predetermined cycle;
a refresh address generation circuit sequentially generating, in response to said refresh request, refresh addresses each indicating a word line connected to the memory cells to be refreshed;
first word decoders formed corresponding to said word line groups, respectively, and each selecting a word line selection signal line to select any of the word lines in said word line group according to the refresh address or an external address;
second word decoders formed corresponding to said word lines, respectively, and each selecting, in response to the selection of said word line selection signal line, any of the word lines in said word line group according to the refresh address or the external address; and
a word control circuit holding, after a refresh operation, a selection of the word line selection signal line selected in each of said memory blocks corresponding to the refresh address, and unselecting, in response to an access request, only the selected word line selection signal line in the memory block indicated by the external address corresponding to this access request, wherein
at least one bit of a lowest order of the refresh address generated by said refresh address generation circuit is assigned to select the memory block.

2. The semiconductor memory according to claim 1, wherein said word control circuit comprises:
a reset disable control circuit activating a reset disable signal in response to said refresh request and inactivating said reset disable signal in response to said access request; and
a block reset control circuit formed for each of said memory blocks and outputting a block reset signal to the first word decoder in response to the inactivation of said reset disable signal, the block reset signal being for unselecting the word line selection signal line selected in the memory block indicated by the external address corresponding to said access request.

3. The semiconductor memory according to claim 1, further comprising:
address latch control circuits formed in said memory blocks and each generating an address latch signal in response to the selection of the memory block according to said refresh address or said external address; and
address latch circuits formed corresponding to address signal lines to select said first word decoders, each latching said refresh address or said external address in synchronization with a corresponding address latch signal, and outputting the latched address to one of said first word decoders.

4. The semiconductor memory according to claim 1, further comprising:
program circuits formed corresponding to said memory blocks, respectively, each having a defective address programmed therein in advance, and outputting a redundancy hit signal when said refresh address or said external address matches said defective address; and
redundancy word lines formed in said memory blocks, respectively, and selected according to said redundancy hit signal, wherein
in each of said memory blocks, the first word decoder unselects the selected word line selection signal line in synchronization with the output of said redundancy hit signal.

5. The semiconductor memory according to claim 1, wherein:
the word line selection signal line and the word line are a main word line and a sub-word line, respectively;
the first word decoder is a main word decoder; and
the second word decoder is each of sub-word decoders which are arranged dispersedly in each of said memory blocks.

6. The semiconductor memory according to claim 1, wherein:
at least one bit of a highest order of the refresh address generated by said refresh address generation circuit is assigned to select the word line group; and
in the refresh address, bits other than the bits assigned to select the memory block and the word line group are assigned to select the word line.

7. The semiconductor memory according to claim 1, wherein:
the word line selection signal line and the word line are a sub-word selection signal line and a sub-word line, respectively;
the first word decoder is a sub-word selection decoder; and
the second word decoder is each of sub-word decoders which are arranged dispersedly in each of said memory blocks.

8. The semiconductor memory according to claim 1, wherein
at least one bit of a highest order of the refresh address generated by said refresh address generation circuit is assigned to select the word line; and
in the refresh address, bits other than the bits assigned to select the memory block and the word line are assigned to select the word line group.

9. The semiconductor memory according to claim 1, further comprising
a plurality of memory banks selected according to a bank address and operate independently of each other, wherein:
each of said memory banks comprises said memory blocks, said word line groups, said first word decorders, and said second word decoders; and
in response to said access request, said word control circuit unselects the word line selection signal line only for the memory bank selected according to said bank address, while continuously selecting the word line selection signal line for refresh.

10. The semiconductor memory according to claim 2, wherein
in the memory block being in an access operation in response to said access request, after the first word decoder continuously selecting the word line selection signal line for refresh unselects this word line selection signal line, a first word decoder selected according to said external address selects a word line selection signal line in response to said block reset signal.

11. The semiconductor memory according to claim 2, further comprising
a burst access function of performing read operations or write operations successively in response to one access request, wherein
said reset disable control circuit comprises an activation mask circuit masking the activation of said reset disable signal during a burst access.

12. The semiconductor memory according to claim 2, wherein:
according to said refresh addresses, the refresh operation is performed on all of said memory blocks in sequence, changing the word line for refresh such that all of the word lines in one word line group are used in sequence first, and then all of the word lines in a next word line group are used in sequence; and
said reset disable control circuit inactivates said reset disable signal while the refresh operation is performed on all of said memory blocks in sequence once and while the refresh operation is performed with a last word line of each word line group.

13. The semiconductor memory according to claim 2, wherein said reset disable control circuit comprises:
an entry generation circuit generating an entry signal in synchronization with a timing signal during non-receipt of said access request, the timing signal indicating a start of the refresh operation; and
a flip-flop activating said reset disable signal in synchronization with said entry signal and inactivating said reset disable signal in synchronization with said access request.

14. The semiconductor memory according to claim 2, wherein
when the semiconductor memory is powered on, said reset disable control circuit inactivates said reset disable signal to unselect said word line selection signal line.

15. The semiconductor memory according to claim 2, wherein:
said reset disable control circuit comprises:
an entry generation circuit generating an entry signal which responds to said refresh request, using a plurality of timing signals, at least one of the timing signals being asynchronous with the other timing signals; and
a flip-flop constituted of transistors having predetermined threshold voltages, activating said reset disable signal in synchronization with said entry signal, and inactivating said reset disable signal in synchronization with said access request; and in said flip-flop, the transistors activate said reset disable signal from said entry signal and are in a signal path fed back to an input, and an absolute value of a threshold voltage of at least any of the transistors is set lower than absolute values of threshold voltages of the other transistors.

16. The semiconductor memory according to claim 2, further comprising
a plurality of memory banks selected according to a bank address and operating independently of each other, wherein:
each of said memory banks comprises said memory blocks, said word line groups, said first word decoders, and said second word decoders; and
said reset disable control circuit transmits, only to the memory bank selected according to said bank address, the inactivation of said reset disable signal responding to said access request.

17. The semiconductor memory according to claim 3, further comprising
a first test control circuit outputting a first test signal common to said address latch control circuits during a test mode, wherein
each of said address latch control circuits generates the address latch signal in synchronization with the output of said first test signal.

18. The semiconductor memory according to claim 3, further comprising
a second test control circuit outputting a second test signal common to said first word decoders during the test mode, wherein
each of said first word decoders selects said word line selection signal line in synchronization with the output of said second test signal.

19. The semiconductor memory according to claim 3, wherein
each of said address latch circuits comprises a level shifter converting a high-level voltage of the latched address to a boost voltage, and
each of said first word decoders receives the boost voltage as a high-level power supply and sets a high-level voltage of said word line selection signal line to the boost voltage.

20. The semiconductor memory according to claim 3, further comprising
a plurality of memory banks selected according to a bank address and operating independently of each other, wherein
each of said memory banks comprises said memory blocks, said word line groups, said first word decoders, and said second word decoders; and
only the address latch circuit of the memory bank selected according to said bank address latches said external address corresponding to said access request.

* * * * *